United States Patent
Hoshino et al.

(10) Patent No.: US 12,117,680 B2
(45) Date of Patent: Oct. 15, 2024

(54) OPTICAL FILM, VIEWING ANGLE CONTROL SYSTEM, AND IMAGE DISPLAY DEVICE

(71) Applicant: FUJIFILM Corporation, Tokyo (JP)

(72) Inventors: Wataru Hoshino, Kanagawa (JP);
Shinichi Yoshinari, Kanagawa (JP);
Hiroshi Matsuyama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/331,807

(22) Filed: Jun. 8, 2023

(65) Prior Publication Data
US 2023/0418094 A1      Dec. 28, 2023

Related U.S. Application Data

(63) Continuation of application No. PCT/JP2021/046823, filed on Dec. 17, 2021.

(30) Foreign Application Priority Data

Dec. 21, 2020   (JP) .................................. 2020-211397

(51) Int. Cl.
*G02F 1/13* (2006.01)
*G02F 1/1335* (2006.01)
*G02F 1/1337* (2006.01)

(52) U.S. Cl.
CPC ...... *G02F 1/1323* (2013.01); *G02F 1/133531* (2021.01); *G02F 1/133723* (2013.01); *G02F 1/133502* (2013.01)

(58) Field of Classification Search
None
See application file for complete search history.

(56) References Cited

U.S. PATENT DOCUMENTS

| 2009/0153783 A1* | 6/2009 | Umemoto | G02B 27/28 |
| | | | 359/487.01 |
| 2013/0107195 A1* | 5/2013 | Morishima | C09K 19/601 |
| | | | 427/163.1 |

(Continued)

FOREIGN PATENT DOCUMENTS

| JP | 2011-215337 A | 10/2011 |
| JP | 4902516 B2 | 3/2012 |

OTHER PUBLICATIONS

International Search Report issued in PCT/JP2021/046823 on Feb. 1, 2022.

(Continued)

*Primary Examiner* — Ryan Crockett
(74) *Attorney, Agent, or Firm* — Edwards Neils LLC; Jean C. Edwards, Esq.

(57) ABSTRACT

The present invention provides a viewing angle control system and a display device that are capable of providing a bright and easy-to-see image in a desired direction, shielding light from the image in a direction other than the desired direction, and limiting reflected glare on window glass, and an optical film therefor. The optical film of the present invention includes a light absorption anisotropic layer formed of a liquid crystal composition containing a thermotropic liquid crystal compound, a dichroic substance, and an interface improver, in which a content of the dichroic substance is 10.0% by mass or greater with respect to a total mass of a solid content of the liquid crystal composition, and an angle θ between a transmittance central axis of the light absorption anisotropic layer and a normal direction of a surface of the optical film is 5° or greater and less than 45°.

19 Claims, 2 Drawing Sheets

(56) References Cited

U.S. PATENT DOCUMENTS

| | | | |
|---|---|---|---|
| 2023/0035147 A1* | 2/2023 | Hoshino | C09K 19/3852 |
| 2023/0037017 A1* | 2/2023 | Yamada | G09F 9/00 |
| 2023/0039106 A1* | 2/2023 | Shibata | G02B 5/30 |
| 2023/0118336 A1* | 4/2023 | Yoshinari | G02F 1/133562 349/1 |
| 2023/0120853 A1* | 4/2023 | Nishimura | H05B 33/02 359/483.01 |
| 2023/0314854 A1* | 10/2023 | Yoshinari | G09F 9/00 349/96 |
| 2023/0417971 A1* | 12/2023 | Yoshinari | G09F 9/00 |
| 2023/0418094 A1* | 12/2023 | Hoshino | G02F 1/133723 |

OTHER PUBLICATIONS

Written Opinion issued in PCT/JP2021/046823 on Feb. 1, 2022.
International Preliminary Report on Patentability completed by WIPO on Jun. 13, 2023 in connection with International Patent Application No. PCT/JP2021/046823.

* cited by examiner

OPTICAL FILM, VIEWING ANGLE CONTROL SYSTEM, AND IMAGE DISPLAY DEVICE

CROSS-REFERENCE TO RELATED APPLICATIONS

This application is a Continuation of PCT International Application No. PCT/JP2021/046823 filed on Dec. 17, 2021, which was published under PCT Article 21 (2) in Japanese, and which claims priority under 35 U.S.C. § 119 (a) to Japanese Patent Application No. 2020-211397 filed on Dec. 21, 2020. The above applications are hereby expressly incorporated by reference, in their entirety, into the present application.

BACKGROUND OF THE INVENTION

1. Field of the Invention

The present invention relates to an optical film, a viewing angle control system, and an image display device.

2. Description of the Related Art

In a case where an in-vehicle display such as a car navigation system is used, there is a problem in that light emitted upward from a display screen is reflected on a windshield or the like and interferes with driving. For the purpose of solving such a problem, for example, JP4902516B suggests a method of using a first polarizer that has an in-plane absorption axis and a second polarizer (light absorption anisotropic layer) in which an absorption axis of an organic dichroic coloring agent is aligned at 0° to 45° with respect to a normal direction in combination. Here, a polarizer on a viewing side in a liquid crystal display device can be used as the first polarizer. According to this method, an image can be observed by an observer in a desired direction by transmitting only light from the image in a specific direction and shielding transmission of light at an angle other than the specific direction, and projection of the image in a direction other than the desired direction, for example, in a direction in which window glass is present can be prevented.

SUMMARY OF THE INVENTION

However, the above-described viewing angle control method still has a problem that the screen cannot be sufficiently shielded because the visibility cannot be sufficiently obtained due to an insufficient light transmittance in a case where the image is observed in a direction in which the image is desired to be seen, whereas the light transmittance in a case where the image is observed in a direction other than the above-described direction, that is, in a direction in which the screen is desired to be invisible cannot be sufficiently decreased.

For example, in the viewing angle control method of the related art as described above, in in-vehicle applications (application to in-vehicle displays and the like), the screen is difficult to see in a direction in which information is desired to be obtained by accurately and rapidly visually recognizing the screen, for example, in a direction of a driver or a person in a passenger seat, and the screen is slightly viewed in a direction in which reflected glare on window glass is desired to be eliminated and thus the effect of preventing reflection is insufficient. The above-described state of the in-vehicle display system is not preferable in terms of safety.

Therefore, an object of the present invention is to provide a viewing angle control system and a display device that are capable of providing a bright and easy-to-see image in a desired direction, shielding light from the image in a direction other than the desired direction, and sufficiently limiting reflected glare on window glass and the like, and an optical film therefor.

The present inventors found that the above-described object can be achieved by employing the following configurations.

[1] An optical film comprising: a light absorption anisotropic layer formed of a liquid crystal composition containing a thermotropic liquid crystal compound, a dichroic substance, and an interface improver, in which a content of the dichroic substance is 10.0% by mass or greater with respect to a total mass of a solid content of the liquid crystal composition, and an angle θ between a transmittance central axis of the light absorption anisotropic layer and a normal direction of a surface of the optical film is 5° or greater and less than 45°.

[2] The optical film according to [1], in which the content of the dichroic substance is 15.0% by mass or greater with respect to the total mass of the solid content of the liquid crystal composition.

[3] The optical film according to [1] or [2], in which a mixed liquid crystal decreasing temperature ΔTL defined by Equation (T) is in a range of 0.1° C. to 10.0° C.

[4] The optical film according to any one of [1] to [3], further comprising: an alignment layer that contains an azo compound, polyvinyl alcohol, or polyimide on the light absorption anisotropic layer.

[5] A viewing angle control system comprising: the optical film according to any one of [1] to [4]; and a polarizer, in which the polarizer has an in-plane absorption axis, and an angle φ between a direction in which the transmittance central axis of the light absorption anisotropic layer of the optical film is orthographically projected on the surface of the optical film and the absorption axis of the polarizer is 0° or greater and less than 85°, greater than 95° and less than 265°, or greater than 2750 and 360° or less.

[6] An image display device which is formed by disposing the viewing angle control system according to [5] on at least one main surface of a display panel.

[7] The image display device according to [6], in which the light absorption anisotropic layer is disposed on a viewing side with respect to the polarizer.

According to the present invention, it is possible to provide a viewing angle control system and a display device that are capable of providing a bright and easy-to-see image in a desired direction, shielding light from the image in a direction other than the desired direction, and sufficiently limiting reflected glare on window glass, and an optical film therefor.

More specifically, the optical film of the present invention is capable of precisely controlling the viewing angle, sufficiently suppressing reflected glare of an image on window glass or the like in a case of being used in an in-vehicle display or the like, and providing a bright and easy-to-see image to a driver or the like.

DESCRIPTION OF THE PREFERRED EMBODIMENTS

Figure 1:
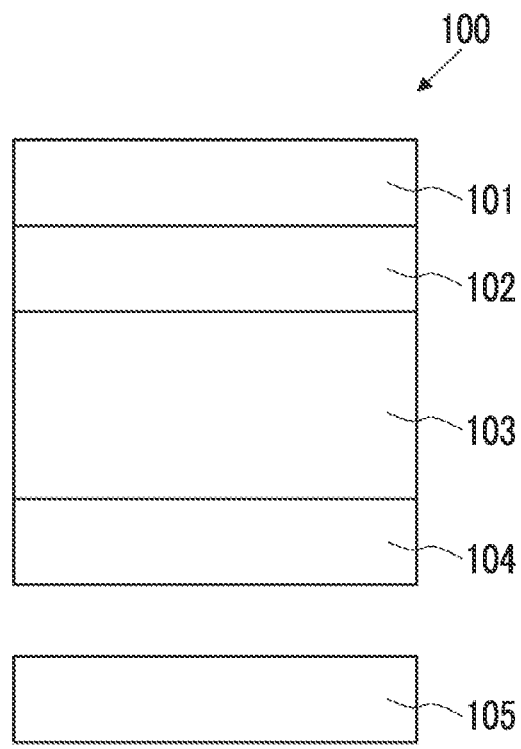
FIG. 1 is a cross-sectional view schematically illustrating an example of an embodiment of a liquid crystal display device of the present invention.

Hereinafter, the present invention will be described in detail.

The description of configuration requirements described below may be made based on typical embodiments of the present invention, but the present invention is not limited to such embodiments.

In the present specification, the numerical ranges shown using "to" indicate ranges including the numerical values described before and after "to" as the lower limits and the upper limits.

In the present specification, the term parallel or orthogonal does not indicate parallel or orthogonal in a strict sense, but indicates a range of ±5° from parallel or orthogonal.

In the present specification, the concepts of the liquid crystal composition and the liquid crystal compound also include those that no longer exhibit liquid crystallinity due to curing or the like.

In the present specification, visible light denotes an electromagnetic wave having a wavelength of 380 to 800 nm unless otherwise specified.

Further, in the present specification, "(meth)acrylate" denotes "acrylate" or "methacrylate", "(meth)acryl" denotes "acryl" or "methacryl", and "(meth)acryloyl" denotes "acryloyl" or "methacryloyl".

In the present specification, the solid content of the liquid crystal composition denotes a component obtained by removing solvents from the liquid crystal composition and capable of forming a light absorption anisotropic layer, and the component is defined as the solid content even in a case where the component is in a liquid state as the properties thereof.

A substituent W used in the present specification represents any of the following groups.

Examples of the substituent W include a halogen atom, an alkyl group having 1 to 20 carbon atoms, a halogenated alkyl group having 1 to 20 carbon atoms, a cycloalkyl group having 1 to 20 carbon atoms, an alkylcarbonyl group having 1 to 10 carbon atoms, an alkyloxycarbonyl group having 1 to 10 carbon atoms, an alkylcarbonyloxy group having 1 to 10 carbon atoms, an alkylamino group having 1 to 10 carbon atoms, an alkylaminocarbonyl group, an alkoxy group having 1 to 20 carbon atoms, an alkenyl group having 1 to 20 carbon atoms, an alkynyl group having 1 to 20 carbon atoms, an aryl group having 1 to 20 carbon atoms, a heterocyclic group, a cyano group, a hydroxy group, a nitro group, a carboxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heteroarylazo group, an imide group, a phosphino group, a phosphinyl group, a phosphinyloxy group, a phosphinylamino group, a phosphono group, a silyl group, a hydrazino group, a ureido group, a boronic acid group (—B(OH)$_2$), a phosphate group (—OPO(OH)$_2$), or a sulfate group (—OSO$_3$H), and other known substituents.

Further, the details of the substituent are described in paragraph [0023] of JP2007-234651A.

Further, the substituent W may be a group represented by Formula (W1).

*-LW-SPW Q  (W1)

In Formula (W1), LW represents a single bond or a divalent linking group, SPW represents a divalent spacer group, Q represents Q1 or Q2 in Formula (LC) described below, and * represents a bonding position.

Examples of the divalent linking group represented by LW include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. LW may represent a group in which two or more of these groups are combined (hereinafter, also referred to as "L-C").

Examples of the divalent spacer group represented by SPW include a linear, branched, or cyclic alkylene group having 1 to 50 carbon atoms, and a heterocyclic group having 1 to 20 carbon atoms.

The carbon atoms of the alkylene group and the heterocyclic group may be substituted with —O—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —C(S)—, —S(O)—, —SO$_2$—, —(O)S(O)O—, —O(O)S(O)O—, —SC(O)—, —C(O)S—, or a group obtained by combining two or more of these groups (hereinafter, also referred to as "SP-C").

Further, the hydrogen atom of the alkylene group and the hydrogen atom of the heterocyclic group may be substituted with a halogen atom, a cyano group, —Z$^H$, —OH—, —OZ$^H$, —COOH, —C(O)Z$^H$, C(O)OZ$^H$, —OC(O)Z$^H$, —OC(O)OZ$^H$, —NZ$^H$Z$^H$, —NZ$^H$C(O)Z$^H$, —NZ$^H$C(O)OZ$^{Hi}$, C(O)NZ$^H$Z$^{Hi}$, —OC(O)NZ$^H$Z$^{Hi}$, NZ$^H$C(O)NZ$^{Hi}$OZ$^{Hi}$, —SH, —SZ$^H$, C(S)Z$^H$, —C(O)SZ$^H$, or —SC(O)Z$^H$ (hereinafter, also referred to as "SP—H"). Here, Z$^H$ and Z$^{Hi}$ represent an alkyl group having 1 to 10 carbon atoms, a halogenated alkyl group, or -L-CL (L represents a single bond or a divalent linking group, specific examples of the divalent linking group are the same as those of LW and SPW described above, CL represents a crosslinkable group, and examples thereof include a group represented by Q1 or Q2 in Formula (LC), and a crosslinkable group represented by Formulae (P-1) to (P-30) is preferable).

[Optical Film]

An optical film according to the embodiment of the present invention is an optical film including a light absorption anisotropic layer formed of a liquid crystal composition containing a thermotropic liquid crystal compound, a dichroic substance, and an interface improver, in which the content of the dichroic substance is 10.0% by mass or greater with respect to the total mass of the solid content of the liquid crystal composition.

An angle θ between a transmittance central axis of the light absorption anisotropic layer and a normal direction of a surface of the optical film is 5° or greater and less than 45°.

According to a viewing angle control system and a display device that are formed of the optical film according to the embodiment of the present invention, the mechanism for providing a bright and easy-to-see image in a desired direction, shielding light from the image in a direction other than the desired direction, and sufficiently limiting reflected glare on window glass is not necessarily clear, but the present inventors speculate as follows.

In the optical film according to the embodiment of the present invention, since the light absorption anisotropic layer of the optical film contains a thermotropic liquid crystal compound, a dichroic substance, and an interface improver, the optical film is capable of controlling the alignment direction of the dichroic substance, providing a bright and easy-to-see image in a desired direction, shielding light from the image in a direction other than the desired direction, and sufficiently limiting reflected glare on window glass. Further, it is considered that the above-described effects can be further enhanced in a case where the content of the dichroic substance is 10.0% by mass or greater with respect to the total mass of the solid content of the liquid crystal composition.

In addition, the effects of providing a bright and easy-to-see image in a desired direction, shielding light from the image in a direction other than the desired direction, and sufficiently limiting reflected glare on window glass, obtained by the viewing angle control system and the display device which are formed of the optical film according to the embodiment of the present invention, will be referred to as "effects of the present invention".

Hereinafter, layers that the optical film may include will be described.

[Light Absorption Anisotropic Layer]

In the present invention, the light absorption anisotropic layer is formed of a liquid crystal composition containing a thermotropic liquid crystal compound, a dichroic substance, and an interface improver, and the content of the dichroic substance is 10.0% by mass or greater with respect to the total mass of the solid content of the liquid crystal composition.

Further, in the light absorption anisotropic layer of the present invention, an angle θ between the transmittance central axis of the light absorption anisotropic layer and the normal direction of the surface of the optical film is 5° or greater and less than 45°. Hereinafter, the angle between the transmittance central axis of the light absorption anisotropic layer and the normal direction of the surface of the optical film is also referred to as "tilt angle".

In a case where the angle θ is in the above-described range, the light transmittance of the image in a direction of an observer is increased so that the image visibility is improved, and the transmittance in a direction other than the direction of the observer is decreased simultaneously so that the reflected glare on window glass or the like can be suppressed. The angle θ is preferably 5° or greater and less than 35°.

In order to control the light transmission direction of the light absorption anisotropic layer, an aspect in which the dichroic substance having absorption in a visible light region is aligned in a desired direction is preferable, and an aspect in which the dichroic substance is aligned by using the alignment of the liquid crystal compound is more preferable. Examples of the aspect of the light absorption anisotropic layer include a light absorption anisotropic layer in which at least one kind of dichroic substance is aligned in a state of being inclined with respect to the normal direction of the film.

The alignment of the dichroic substance of the light absorption anisotropic layer in a state of being inclined with respect to the normal direction of the film (normal direction of the surface of the optical film) can be confirmed by measuring the angle θ (hereinafter, also referred to as "tilt angle θ") of the axis (hereinafter, also referred to as "transmittance central axis") at which the transmittance is maximized. Specifically, the transmittance is measured by allowing polarized light parallel to a direction in which the transmittance central axis of the light absorption anisotropic layer is orthographically projected on the surface of the film, to be incident on the optical film using a wavelength of the dichroic substance in an absorption range (for example, a visible wavelength range, specifically, preferably at a wavelength of 650 nm) and inclining the sample from the normal direction (that is, θz=0°) to the plane (that is, θz=90° and −90°) (defined as T3). Specifically, the transmittance is measured by inclining the same at a pitch of 0.5°. The transmittance of the optical film in which the light absorption anisotropic layer is not formed is measured in the same manner as described above (defined as T4). T3/T4 is calculated, and the angle θz at which this value is maximum is acquired. In a case where the angle θz at which T3/T4 is maximized does not match 0° (normal line), the dichroic substance can be determined to be aligned in a state of being inclined from the normal direction of the optical film. That is, the transmittance central axis of the light absorption anisotropic layer can be determined to be inclined with respect to the normal direction of the surface of the optical film, and the angle θz at which T3/T4 is maximized corresponds to an angle between the transmittance central axis of the light absorption anisotropic layer and the normal direction of the surface of the optical film.

Here, the transmittance central axis denotes the direction in which the transmittance is highest in a case where the transmittance is measured by changing the inclination angle (polar angle) and the inclination direction (azimuthal angle) with respect to the normal direction of the main surface of the light absorption anisotropic film. As described above, in a case where the angle between the transmittance central axis of the light absorption anisotropic layer and the normal direction of the surface of the optical film is measured, first, the direction in which the transmittance central axis is inclined with respect to the normal line of the surface of the light absorption anisotropic film is initially searched for. More specifically, a sample of the light absorption anisotropic film is cut into, for example, a square with a size of 4 cm square, and the obtained sample is set on a sample table of an optical microscope in which a linear polarizer is disposed on a light source side (for example, product name, "ECLIPSE E600 POL", manufactured by Nikon Corporation). Next, the absorbance of the sample at a wavelength of 650 nm is monitored while the sample table is allowed to rotate clockwise by 1° using a multi-channel spectroscope (for example, product name, "QE65000", manufactured by Ocean Optics), and the direction in which the absorbance is maximized is confirmed. The angle θ is acquired based on the direction in which the absorbance of the sample is maximized in the plane.

As the technique of aligning the dichroic substance in a desired direction, a technique of preparing a polarizer formed of a dichroic substance or a technique of preparing a guest-host liquid crystal cell can be referred to. For example, techniques used in the method of preparing a dichroic polarizer described in JP1999-305036A (JP-H11-305036A) or JP2002-90526A and the method of preparing a guest-host type liquid crystal display device described in JP2002-99388A or JP2016-27387A can be used for preparation of the light absorption anisotropic layer of the present invention.

For example, the dichroic substance can be desirably aligned as described above in association with the alignment of host liquid crystals using the technique of the guest-host type liquid crystal cell. Specifically, the light absorption anisotropic layer used in the present invention can be prepared by mixing a dichroic substance serving as a guest and a rod-like liquid crystal compound serving as a host liquid crystal, aligning the host liquid crystal, aligning molecules of the dichroic substance along the alignment of the liquid crystal molecules, and fixing the alignment state.

In order to prevent fluctuation in the light absorption characteristics of the light absorption anisotropic layer used in the present invention due to the usage environment, it is preferable that the alignment of the dichroic substance is fixed by forming a chemical bond. For example, the alignment can be fixed by promoting the polymerization of the host liquid crystal, the dichroic substance, and the polymerizable component to be added as desired.

Further, a polymer film that satisfies the light absorption characteristics required for the light absorption anisotropic layer used in the present invention can be prepared by allowing the dichroic substance to permeate into the polymer film and aligning the dichroic substance along the alignment of the polymer molecules in the polymer film. Specifically, a surface of a polymer film is coated with a solution of the dichroic substance so that the solution is allowed to permeate into the film, thereby preparing a polymer film. The alignment of the dichroic substance can be adjusted by the alignment of a polymer chain in the polymer film, the properties thereof (chemical and physical properties of the polymer chain, a functional group of the polymer chain, and the like), the coating method, and the like. The details of this method are described in JP2002-90526A.

In the light absorption anisotropic layer used in the present invention, the transmittance (transmission at a wavelength of 650 nm) at an angle inclined by 300 from the transmittance central axis is preferably 60% or less, more preferably 50% or less, and still more preferably 45% or less. In this manner, the contrast of the illuminance between the transmittance central axis and a direction deviated from the transmittance central axis can be increased, and thus the viewing angle can be sufficiently narrowed.

In the light absorption anisotropic layer used in the present invention, the transmittance (transmission at a wavelength of 650 nm) of the transmittance central axis is preferably 65% or greater, more preferably 75% or greater, and still more preferably 85% or greater. In this manner, the illuminance at the center of the viewing angle of the image display device can be increased to enhance the visibility.

Further, from the viewpoint of making the tint in the front direction neutral, the alignment degree of the light absorption anisotropic layer at a wavelength of 420 nm is preferably 0.93 or greater.

The tint of the optical film containing a dichroic substance is typically controlled by adjusting the addition amount of the dichroic substance contained in the film. However, the tint thereof both in the front direction and an oblique direction cannot be made neutral in some cases only by adjusting the addition amount of the dichroic substance. One of the reasons why the tint thereof both in the front direction and an oblique direction cannot be made neutral is that the alignment degree at 420 nm is low, and the tint thereof both in the front direction and an oblique direction can be made neutral by increasing the alignment degree at 420 nm.

Here, In the present specification, the alignment degree at a wavelength of λ nm is defined as follows.

In the measurement, the Mueller matrix at a wavelength of λ nm at each polar angle is measured while the polar angle which is the angle with respect to the normal direction of the light absorption anisotropic layer is changed for every 5° from 0° to 90° using AxoScan OPMF-1 (manufactured by Opto Science, Inc.), and the minimum transmittance (Tmin) is derived. Next, after removal of the influence of surface reflection, Tmin at a polar angle at which Tmin is highest is defined as Tm (0), and Tmin in a direction in which the polar angle is further increased by 40° from the polar angle at which Tmin is highest is defined as Tm (40). The absorbance is calculated by the following equation based on the obtained Tm (0) and Tm (40), and A (0) and A (40) are calculated.

$$A=-\log(Tm)$$

Here, Tm represents the transmittance and A represents the absorbance.

An alignment degree S at a wavelength of λ nm defined by the following equation is calculated based on the calculated A (0) and A (40).

$$S=(4.6 \times A(40)-A(0))/(4.6 \times A(40)+2 \times A(0))$$

In the present specification, the expression "alignment degree of the light absorption anisotropic layer" simply denotes the degree of alignment of the compound and the like contained in the light absorption anisotropic layer and is not limited to the alignment degree obtained by the above-described measuring method.

In addition, the light absorption anisotropic layer of the present invention may be obtained by laminating a plurality of light absorption anisotropic layers with different transmittance central axes or laminating retardation layers such that the transmittance at an angle inclined by 30° from the transmittance central axis and the transmittance of the transmittance central axis are satisfied. The width of a region where the transmittance is high can be adjusted by laminating a plurality of light absorption anisotropic layers with different transmittance central axes. Further, in a case where retardation layers are laminated, the transmission and light shielding performance can be controlled by controlling the retardation value and the optical axis direction. As the retardation layer, a positive A-plate, a negative A-plate, a positive C-plate, a negative C-plate, a B-plate, an O-plate, or the like can be used. From the viewpoint of reducing the thickness of the viewing angle control system, it is preferable that the thickness of the retardation layer is small as long as the optical characteristics, the mechanical properties, and the manufacturing suitability are not impaired, and specifically, the thickness thereof is preferably in a range of 1 to 150 μm, more preferably in a range of 1 to 70 μm, and still more preferably in a range of 1 to 30 μm.

[Liquid Crystal Composition]

The liquid crystal composition used for forming the light absorption anisotropic layer of the present invention contains an interface improver, a thermotropic liquid crystal compound, and a dichroic substance. In addition, the liquid crystal composition of the present invention may contain a polymerization initiator, a polymerizable compound, and an additive.

Hereinafter, the components contained in the liquid crystal composition according to the embodiment of the present invention and components that can be contained therein will be described.

<Interface Improver>

In a case where the liquid crystal composition is used to form the light absorption anisotropic layer, a compound that is easily concentrated on at least one surface of the light absorption anisotropic layer is preferable and a so-called surfactant is preferable as the interface improver. As the interface improver (preferably, a surfactant), a compound containing a hydrophobic group in a molecule is preferable, and a compound containing a hydrophilic group and a hydrophobic group in a molecule is more preferable. The interface improver may be a low-molecular-weight compound or a polymer compound, but is preferably a polymer compound, more preferably a polymer compound having a repeating unit containing a hydrophobic group, and still more preferably a polymer compound having a repeating unit containing a hydrophobic group and a repeating unit containing a hydrophilic group.

As the hydrophobic group, a group having a fluorine atom or a silicon atom is preferable, and a perfluoroalkyl group ($-(CF_2)_n-CF_3$) or a perfluoroalkylene group ($-(CF_2)_n-$) is more preferable. The number of carbon atoms in the perfluoroalkyl group or the perfluoroalkylene group is not particularly limited, but is preferably in a range of 1 to 10 and more preferably in a range of 3 to 8. Further, it is also preferable that one bonding portion of the perfluoroalkylene group is bonded to a hydrogen atom. That is, a group represented by $-(CF_2)_n-Z$ (Z represents a hydrogen atom or a fluorine atom) is also preferable as the hydrophobic group.

Examples of the hydrophilic group include a carboxylic acid group and a hydroxyl group.

It is preferable that the interface improver has a repeating unit represented by Formula (A). The repeating unit represented by Formula (A) corresponds to a repeating unit containing a hydrophobic group.

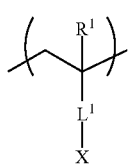

(A)

In Formula (A), $R^1$ represents a hydrogen atom or an alkyl group. The alkyl group has preferably 1 to 3 carbon atoms and more preferably 1 carbon atom.

Further, $L^1$ represents a single bond or a divalent linking group. Examples of the divalent linking group include the groups exemplified in the section of the divalent linking group represented by LW above.

X represents a hydrophobic group. The hydrophilic group is defined as described above.

The content of the repeating unit represented by Formula (A) is not particularly limited, but is preferably in a range of 5.0% to 95.0% by mass and more preferably in a range of 10.0% to 90.0% by mass with respect to all the repeating units of the interface improver.

It is preferable that the interface improver has a repeating unit represented by Formula (B). The repeating unit represented by Formula (B) corresponds to a repeating unit containing a hydrophilic group.

In Formula (B), $R^2$ represents a hydrogen atom or an alkyl group. The alkyl group has preferably 1 to 3 carbon atoms and more preferably 1 carbon atom.

Further, $L^2$ represents a single bond or a divalent linking group. Examples of the divalent linking group include the groups exemplified in the section of the divalent linking group represented by LW above.

Y represents a hydrophilic group. The hydrophilic group is defined as described above.

The content of the repeating unit represented by Formula (B) is not particularly limited, but is preferably in a range of 5.0% to 95.0% by mass and more preferably in a range of 10.0% to 90.0% by mass with respect to all the repeating units of the interface improver.

The interface improver may have other repeating units in addition to the repeating unit represented by Formula (A) and the repeating unit represented by Formula (B).

Examples of the other repeating units include a repeating unit having an aromatic ring. It is preferable that the repeating unit having an aromatic ring contains a mesogen group. The mesogen group will be described in detail below.

The interface improver is not particularly limited, and a polymer-based interface improver or a low-molecular-weight interface improver can be used, and the compounds described in paragraphs [0253] to [0293] of JP2011-237513A can also be used.

Further, fluorine (meth)acrylate-based polymers described in paragraphs [0018] to [0043] of JP2007-272185A can also be used as the interface improver.

Further, examples of other interface improvers include the compounds described in paragraphs [0079] to [0102] of JP2007-069471A, the polymerizable liquid crystal compounds represented by Formula (4) of JP2013-047204A (particularly the compounds described in paragraphs [0020] to [0032]), the polymerizable liquid crystal compounds represented by Formula (4) described in JP2012-211306A (particularly the compounds described in paragraphs [0022] to [0029]), the liquid crystal alignment promoters represented by Formula (4) described in JP2002-129162A (particularly the compounds described in paragraphs [0076] to [0078] and paragraphs [0082] to [0084]), the compounds represented by Formulae (4), (II), and (III) described in JP2005-099248A (particularly the compounds described in paragraphs [0092] to [0096]), the compounds described in paragraphs [0013] to [0059] of JP4385997B, the compounds described in paragraphs [0018] to [0044] of JP5034200B, and the compounds of described in paragraphs [0019] to [0038] of JP4895088B. A plurality of the interface improvers exemplified above can also be used in combination.

An interface improver in which a mixed liquid crystal decreasing temperature ΔTL defined by Equation (T) is in a range of 0.1° C. to 10.0° C. is preferable, an interface improver in which the mixed liquid crystal decreasing temperature ΔTL is in a range of 0.1° C. to 7.0° C. is more preferable, and an interface improver in which the mixed liquid crystal decreasing temperature ΔTL is in a range of 0.1° C. to 3.5° C. is still more preferable as the interface improver.

$$\Delta TL = T1 - T2 \tag{T}$$

In Equation (T), T1 represents a liquid-liquid crystal phase transition temperature of the liquid crystal composition containing no interface improver, and T2 represents a liquid-liquid crystal phase transition temperature of a mixture obtained by mixing 10.0 parts by mass of the interface improver with respect to 100 parts by mass of the liquid crystal composition containing no interface improver.

More specifically, T1 corresponds to a liquid-liquid crystal phase transition temperature measured using a composition obtained by removing the interface improver from the liquid crystal composition used for forming the light absorption anisotropic layer. The liquid-liquid crystal phase transition temperature of the liquid crystal composition is measured using the solid content obtained by removing the solvent from the liquid crystal composition. That is, the solvent is removed from the liquid crystal composition, the obtained solid content is heated so that the solid content enters a liquid state, the liquid is subjected to a temperature decreasing treatment, and the temperature at which the liquid transitions to a liquid crystal phase is measured as the liquid-liquid crystal phase transition temperature.

Further, T2 corresponds to the liquid-liquid crystal phase transition temperature measured by performing the same procedures as those for T1 using a mixture obtained by mixing 10.0 parts by mass of a predetermined interface improver with respect to 100 parts by mass of the composition obtained by removing the interface improver used for measuring T1 described above.

The specific procedures of a method of measuring the mixed liquid crystal decreasing temperature ΔTL will be described in the section of the examples below.

According to the liquid crystal composition of the present invention (particularly, the liquid crystal composition in which the mixed liquid crystal decreasing temperature ΔTL is in the above-described range), fluctuation in the tilt angle due to the aging temperature is small, the in-plane uniformity is excellent, and an image that is bright and easily visually recognized by a driver or the like can be provided while reflected glare of the image on window glass or the like is sufficiently suppressed in a case where the liquid crystal composition is used for an in-vehicle display or the like.

Although the details of the reason are not yet clear, the present inventors assume that the reason is as follows.

In the light absorption anisotropic layer of the present invention, the dichroic substance is aligned in a state of being inclined with respect to the normal direction of the film. As described above, in order to achieve both satisfactory visibility in a direction in which the image is desired to be seen and satisfactory light shielding properties in a direction other than the desired direction, it is preferable that the light absorption anisotropic layer has sufficient absorption, and the content of the dichroic substance described below is 10.0% by mass or greater with respect to the total mass of the solid content of the liquid crystal composition.

In such a light absorption anisotropic layer, a slight difference in the tilt angle in the plane is easily visually recognized as unevenness, and thus the tilt angle in the vicinity of the air interface between the liquid crystal compound and the dichroic substance is required to be controlled.

In a case where the liquid crystal composition is applied to and aligned on the film to form a light absorption anisotropic layer, the tilt angle in the vicinity of the air interface is affected by the interface improver, the temperature, or the like, and as a result, the tilt angle may fluctuate. Particularly, in the light absorption anisotropic layer in which a liquid crystal composition containing a high-concentration dichroic substance is aligned, it is considered that since the fluctuation in the tilt angle in the vicinity of the air interface greatly affects the direction of the transmittance central axis of the entire light absorption anisotropic layer, it is preferable that the fluctuation of the tilt angle in the vicinity of the air interface is small.

The interface improver is considered to be unevenly distributed in the vicinity of the air interface of the light absorption anisotropic layer. It is considered that the state of compatibility or incompatibility between the interface improver, the liquid crystal compound, and the dichroic substance in the liquid crystal composition may change due to the temperature or the liquid crystal phase transition, and this change results in fluctuation of the tilt angle θ in the vicinity of the air interface. Therefore, it is assumed that in a case where the ΔTL is small, the affinity between the liquid crystal compound, the dichroic substance, and the interface improver is low, the compatibility or incompatibility therebetween is less likely to be changed due to the temperature, the tilt angle is unlikely to fluctuate with respect to the temperature, and the tilt angle is easily controlled.

From the viewpoint that the effects of the present invention are more excellent, the content of the interface improver is preferably in a range of 0.005% to 15% by mass, more preferably in a range of 0.01% to 5% by mass, and still more preferably in a range of 0.015% to 3% by mass with respect to the total solid content (100% by mass) of the liquid crystal composition. In a case where a plurality of interface improvers are used in combination, it is preferable that the total amount of the plurality of interface improvers is in the above-described ranges.

<Thermotropic Liquid Crystal Compound>

The liquid crystal composition used for forming the light absorption anisotropic layer of the present invention contains a thermotropic liquid crystal compound. In addition, the thermotropic liquid crystal compound is a liquid crystal compound that shows transition to a liquid crystal phase due to a change in temperature. The thermotropic liquid crystal compound may exhibit any of a nematic phase or a smectic phase, but it is preferable that the thermotropic liquid crystal compound exhibits at least the nematic phase from the viewpoint that the alignment degree of the light absorption anisotropic layer is further increased, and haze is unlikely to be observed (haze is further enhanced).

The temperature range showing the nematic phase is preferably in a range of room temperature (23° C.) to 450° C. from the viewpoint that the alignment degree of the light absorption anisotropic layer is further increased and haze is unlikely to be observed and more preferably in a range of 40° C. to 400° C. from the viewpoints of the handleability and the manufacturing suitability.

The thermotropic liquid crystal compound can be typically classified into a rod-like type compound and a disk-like type compound depending on the shape thereof. It is preferable that the liquid crystal composition of the present invention contains a rod-like liquid crystal compound having a rod-like shape.

Further, a liquid crystal compound that does not exhibit dichroism in a visible light region is preferable as the rod-like liquid crystal compound.

As the rod-like liquid crystal compound, any of a low-molecular-weight liquid crystal compound or a polymer liquid crystal compound can be used. Here, "low-molecular-weight liquid crystal compound" denotes a liquid crystal compound having no repeating units in the chemical structure. Here, "polymer liquid crystal compound" denotes a liquid crystal compound having a repeating unit in the chemical structure.

Examples of the thermotropic low-molecular-weight liquid crystal compound include liquid crystal compounds described in JP2013-228706A.

Examples of the polymer liquid crystal compound include thermotropic liquid crystal polymer compounds described in JP2011-237513A. Further, the polymer liquid crystal compound may contain a crosslinkable group (such as an acryloyl group or a methacryloyl group) at a terminal.

The rod-like liquid crystal compound may be used alone or in combination of two or more kinds thereof.

From the viewpoint that the effects of the present invention are more excellent, the rod-like liquid crystal compound includes preferably a polymer liquid crystal compound and particularly preferably both a polymer liquid crystal compound and a low-molecular-weight liquid crystal compound.

It is preferable that the rod-like liquid crystal compound includes a liquid crystal compound represented by Formula (LC) or a polymer thereof. The liquid crystal compound represented by Formula (LC) or a polymer thereof is a compound exhibiting liquid crystallinity. The liquid crystal phase exhibited by the rod-like liquid crystal compound may be a nematic phase or a smectic phase, and the rod-like liquid crystal compound may exhibit both the nematic phase and the smectic phase and preferably at least the nematic phase.

The smectic phase may be a high-order smectic phase. The high-order smectic phase here denotes a smectic B phase, a smectic D phase, a smectic E phase, a smectic F phase, a smectic G phase, a smectic H phase, a smectic I phase, a smectic J phase, a smectic K phase, or a smectic L phase. Among these, a smectic B phase, a smectic F phase, or a smectic I phase is preferable.

The temperature at which the nematic phase is exhibited is preferably in a range of room temperature (23° C.) to 450° C. from the viewpoint that the alignment degree of the light absorption anisotropic layer is further increased and haze is unlikely to be observed and more preferably in a range of 40° C. to 400° C. from the viewpoints of the handleability and the manufacturing suitability.

In a case where the smectic liquid crystal phase exhibited by the liquid crystal compound is any of these high-order smectic liquid crystal phases, a light absorption anisotropic layer with a higher alignment degree order can be prepared. Further, the light absorption anisotropic layer prepared from such a high-order smectic liquid crystal phase with a high alignment degree order is a layer in which a Bragg peak derived from a high-order structure such as a hexatic phase or a crystal phase in X-ray diffraction measurement is obtained. The Bragg peak is a peak derived from a plane periodic structure of molecular alignment, and according to the liquid crystal composition of the present invention, a light absorption anisotropic layer having a periodic interval of 3.0 to 5.0 Å can be obtained.

$$Q1-S1-MG-S2-Q2 \quad (LC)$$

In Formula (LC), Q1 and Q2 each independently represent a hydrogen atom, a halogen atom, a linear, branched, or cyclic alkyl group having 1 to 20 carbon atoms, an alkoxy group having 1 to 20 carbon atoms, an alkenyl group having 1 to 20 carbon atoms, an alkynyl group having 1 to 20 carbon atoms, an aryl group having 1 to 20 carbon atoms, a heterocyclic group, a cyano group, a hydroxy group, a nitro group, a carboxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heteroarylazo group, an imide group, a phosphino group, a phosphinyl group, a phosphinyloxy group, a phosphinylamino group, a phosphono group, a silyl group, a hydrazino group, a ureido group, a boronic acid group ($-B(OH)_2$), a phosphate group ($-OPO(OH)_2$), a sulfate group ($-OSO_3H$), or a crosslinkable group represented by any of Formulae (P-1) to (P-30), and it is preferable that at least one of Q1 or Q2 represents a crosslinkable group represented by any of the following formulae.

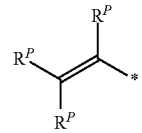

(P-1)

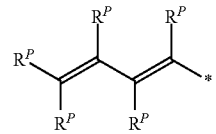

(P-2)

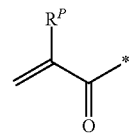

(P-3)

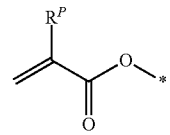

(P-4)

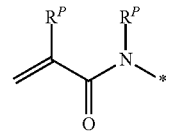

(P-5)

-continued
(P-6) 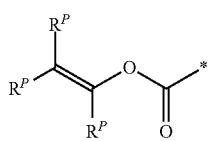
(P-7) 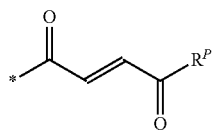
(P-8) 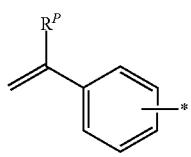
(P-9) 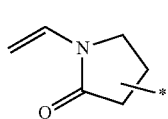
(P-10) 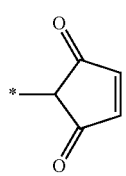
(P-11) 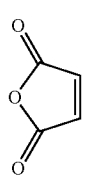
(P-12) 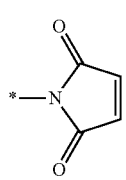
(P-13) 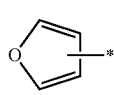
(P-14) 
(P-15) 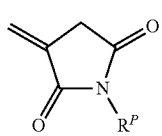
(P-16) 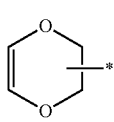
-continued
(P-17) 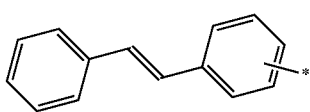
(P-18) 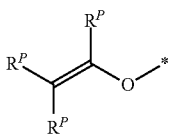
(P-19) 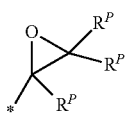
(P-20) 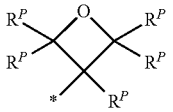
(P-21) 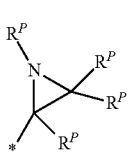
(P-22) 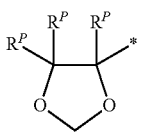
(P-23) 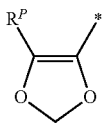
(P-24) 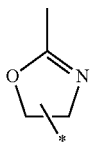
(P-25) 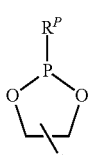
(P-26) 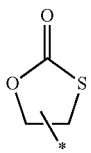
(P-27) 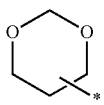

(P-28)

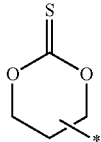
(P-29)

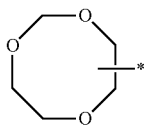
(P-30)

In Formulae (P-1) to (P-30), $R^P$ represents a hydrogen atom, a halogen atom, a linear, branched, or cyclic alkylene group having 1 to 10 carbon atoms, a halogenated alkyl group having 1 to 20 carbon atoms, an alkoxy group having 1 to 20 carbon atoms, an alkenyl group having 1 to 20 carbon atoms, an alkynyl group having 1 to 20 carbon atoms, an aryl group having 1 to 20 carbon atoms, a heterocyclic group, a cyano group, a hydroxy group, a nitro group, a carboxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heteroarylazo group, an imide group, a phosphino group, a phosphinyl group, a phosphinyloxy group, a phosphinylamino group, a phosphono group, a silyl group, a hydrazino group, a ureido group, a boronic acid group (—B(OH)$_2$), a phosphate group (—OPO(OH)$_2$), or a sulfate group (—OSO$_3$H), and a plurality of $R^P$'s may be the same as or different from each other.

Preferred embodiments of the crosslinkable group include a radically polymerizable group and a cationically polymerizable group. As the radically polymerizable group, a vinyl group represented by Formula (P-1), a butadiene group represented by Formula (P-2), a (meth)acryl group represented by Formula (P-4), a (meth)acrylamide group represented by Formula (P-5), a vinyl acetate group represented by Formula (P-6), a fumaric acid ester group represented by Formula (P-7), a styryl group represented by Formula (P-8), a vinylpyrrolidone group represented by Formula (P-9), a maleic acid anhydride represented by Formula (P-11), or a maleimide group represented by Formula (P-12) is preferable. As the cationically polymerizable group, a vinyl ether group represented by Formula (P-18), an epoxy group represented by Formula (P-19), or an oxetanyl group represented by Formula (P-20) is preferable.

In Formula (LC), S1 and S2 each independently represent a divalent spacer group, and preferred embodiments of S1 and S2 include the same structures as those for SPW in Formula (W1), and thus the description thereof will not be repeated.

In Formula (LC), MG represents a mesogen group described below. The mesogen group represented by MG is a group showing a main skeleton of a liquid crystal molecule that contributes to liquid crystal formation. A liquid crystal molecule exhibits liquid crystallinity which is in an intermediate state (mesophase) between a crystal state and an isotropic liquid state. The mesogen group is not particularly limited, and for example, particularly description on pages 7 to 16 of "Flussige Kristalle in Tabellen II" (VEB Deutsche Verlag fur Grundstoff Industrie, Leipzig, 1984) and particularly the description in Chapter 3 of "Liquid Crystal Handbook" (Maruzen, 2000) edited by Liquid Crystal Handbook Editing Committee can be referred to.

The mesogen group represented by MG has preferably 2 to 10 cyclic structures and more preferably 3 to 7 cyclic structures.

Specific examples of the cyclic structure include an aromatic hydrocarbon group, a heterocyclic group, and an alicyclic group.

From the viewpoints of exhibiting the liquid crystallinity, adjusting the liquid crystal phase transition temperature, and the availability of raw materials and synthetic suitability and from the viewpoint that the effects of the present invention are more excellent, as the mesogen group represented by MG, a group represented by Formula (MG-A) or Formula (MG-B) is preferable, and a group represented by Formula (MG-B) is more preferable.

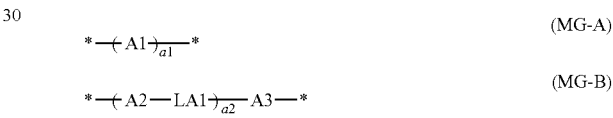

In Formula (MG-A), A1 represents a divalent group selected from the group consisting of an aromatic hydrocarbon group, a heterocyclic group, and an alicyclic group. These groups may be substituted with a substituent such as the substituent W.

It is preferable that the divalent group represented by A1 is a 4- to 15-membered ring. Further, the divalent group represented by A1 may be a monocycle or a fused ring.

Further, * represents a bonding position with respect to S1 or S2.

Examples of the divalent aromatic hydrocarbon group represented by A1 include a phenylene group, a naphthylene group, a fluorene-diyl group, an anthracene-diyl group, and a tetracene-diyl group. From the viewpoints of design diversity of a mesogenic skeleton and the availability of raw materials, a phenylene group or a naphthylene group is preferable.

The divalent heterocyclic group represented by A1 may be any of aromatic or non-aromatic, but a divalent aromatic heterocyclic group is preferable as the divalent heterocyclic group from the viewpoint of further improving the alignment degree.

The atoms other than carbon constituting the divalent aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the divalent aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, a thienooxazole-diyl group, and the following structures (II-1) to (II-4).

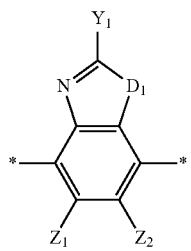

(II-1)

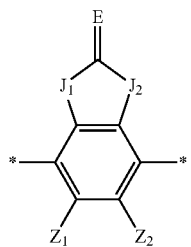

(II-2)

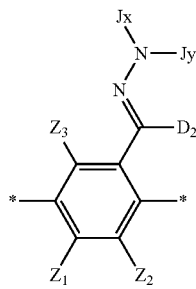

(II-3)

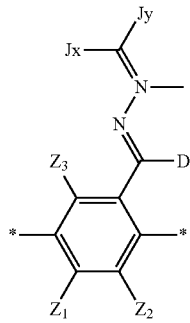

(II-4)

In Formulae (II-1) to (II-4), $D_1$ represents —S—, —O—, or $NR^{11}$—, $R^{11}$ represents a hydrogen atom or an alkyl group having 1 to 6 carbon atoms, $Y_1$ represents an aromatic hydrocarbon group having 6 to 12 carbon atoms or an aromatic heterocyclic group having 3 to 12 carbon atoms, $Z_1$, $Z_2$, and $Z_3$ each independently represent a hydrogen atom, an aliphatic hydrocarbon group having 1 to 20 carbon atoms, an alicyclic hydrocarbon group having 3 to 20 carbon atoms, a monovalent aromatic hydrocarbon group having 6 to 20 carbon atoms, a halogen atom, a cyano group, a nitro group, $—NR^{12}R^{13}$, or $—SR^{12}$, $Z_1$ and $Z_2$ may be bonded to each other to form an aromatic ring or an aromatic heterocyclic ring, $R^{12}$ and $R^{13}$ each independently represent a hydrogen atom or an alkyl group having 1 to 6 carbon atoms, $J_1$ and $J_2$ each independently represent a group selected from the group consisting of —O—, $—NR^{21}—$ ($R^{21}$ represents a hydrogen atom or substituent), —S—, and —C(O)—, E represents a hydrogen atom or a non-metal atom of a Group 14 to a Group 16 to which a substituent may be bonded, Jx represents an organic group having 2 to 30 carbon atoms, which has at least one aromatic ring selected from the group consisting of an aromatic hydrocarbon ring and an aromatic heterocyclic ring, Jy represents a hydrogen atom, an alkyl group having 1 to 6 carbon atoms which may have a substituent, or an organic group having 2 to 30 carbon atoms which has at least one aromatic ring selected from the group consisting of an aromatic hydrocarbon ring and an aromatic heterocyclic ring, the aromatic ring of Jx and Jy may have a substituent, Jx and Jy may be bonded to each other to form a ring, and $D_2$ represents a hydrogen atom or an alkyl group having 1 to 6 carbon atoms which may have a substituent.

In Formula (II-2), in a case where $Y_1$ represents an aromatic hydrocarbon group having 6 to 12 carbon atoms, the aromatic hydrocarbon group may be monocyclic or polycyclic. In a case where $Y_1$ represents an aromatic heterocyclic group having 3 to 12 carbon atoms, the aromatic heterocyclic group may be monocyclic or polycyclic.

In Formula (II-2), in a case where $J_1$ and $J_2$ represent $—NR^{21}—$, as the substituent represented by $R^{21}$, for example, the description in paragraphs [0035] to [0045] of JP2008-107767A can be referred to, and the content thereof is incorporated in the present specification.

In Formula (II-2), in a case where E represents a non-metal atom of a Group 14 to a Group 16 to which a substituent may be bonded, =O, =S, =NR', or =C(R')R' is preferable. R' represents a substituent, and as the substituent, for example, the description in paragraphs [0035] to [0045] of JP2008-107767A can be referred to, and $—NZ^{A1}Z^{A2}$ ($Z^{A1}$ and $Z^{A2}$ each independently represent a hydrogen atom, an alkyl group, or an aryl group) is preferable.

Specific examples of the divalent alicyclic group represented by A1 include a cyclopentylene group and a cyclohexylene group, and the carbon atoms thereof may be substituted with —O—, $—Si(CH_3)_2—$, —N(Z)— (Z represents a hydrogen atom, an alkyl group having 1 to 4 carbon atoms, a cycloalkyl group, an aryl group, a cyano group, or a halogen atom), —C(O)—, —S—, —C(S)—, —S(O)—, $—SO_2—$, or a group obtained by combining two or more of these groups.

In Formula (MG-A), a1 represents an integer of 2 to 10. The plurality of A1's may be the same as or different from each other.

In Formula (MG-B), A2 and A3 each independently represent a divalent group selected from the group consisting of an aromatic hydrocarbon group, a heterocyclic group, and an alicyclic group. Specific examples and preferred embodiments of A2 and A3 are the same as those for A1 in Formula (MG-A), and thus description thereof will not be repeated.

In Formula (MG-B), a2 represents an integer of 1 to 10, a plurality of A2's may be the same as or different from each other, and a plurality of LA1's may be the same as or different from each other. From the viewpoint that the effects of the present invention are more excellent, it is more preferable that a2 represents 2 or greater.

In Formula (MG-B), LA1 represents a single bond or divalent linking group. Here, LA1 represents a divalent linking group in a case where a2 represents 1, and at least one of the plurality of LA1's represents a divalent linking group in a case where a2 represents 2 or greater.

In Formula (MG-B), examples of the divalent linking group represented by LA1 are the same as those for LW, and thus the description thereof will not be repeated.

Specific examples of MG include the following structures, the hydrogen atoms on the aromatic hydrocarbon group, the heterocyclic group, and the alicyclic group in the following structures may be substituted with the substituent W described above.

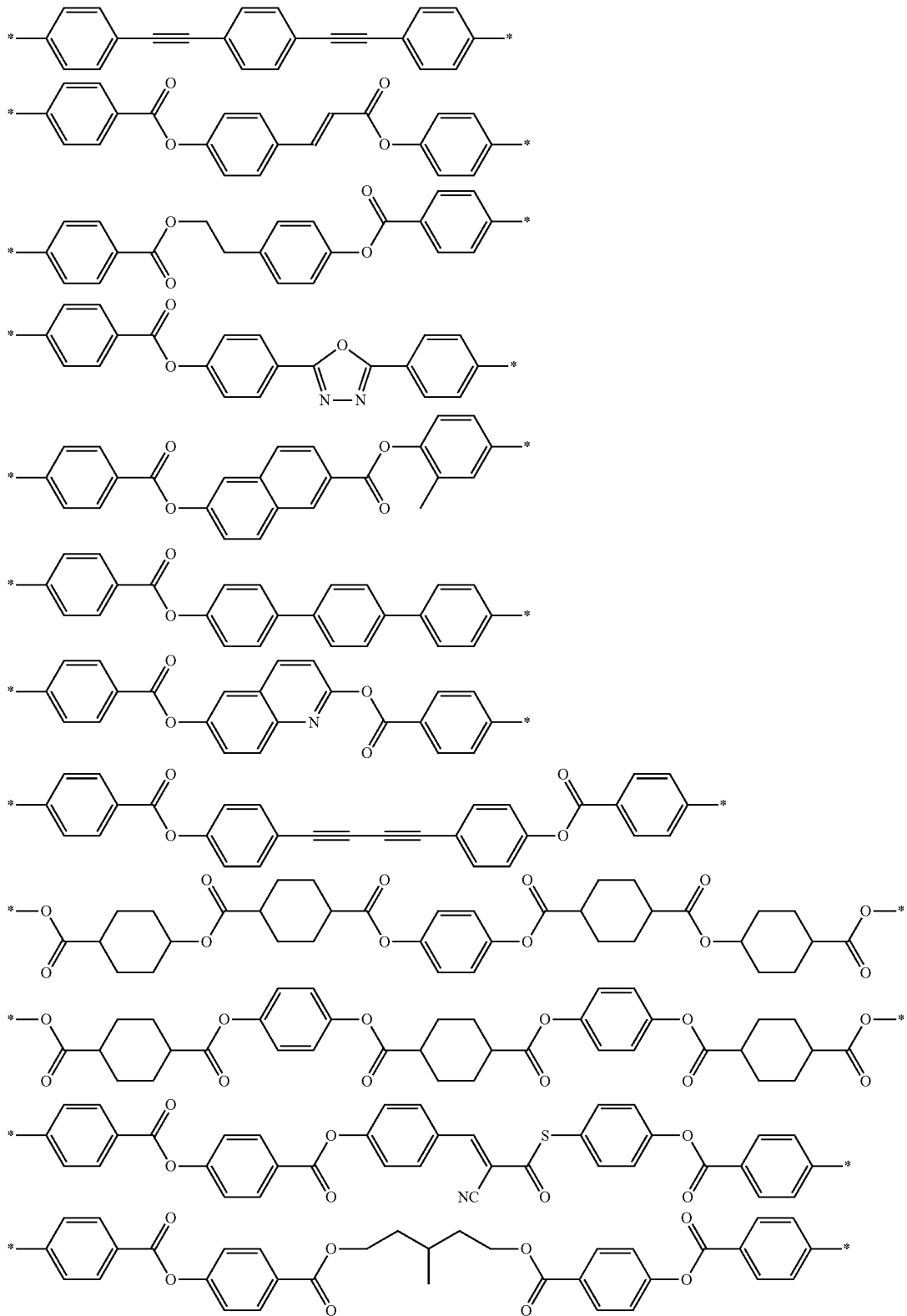

-continued
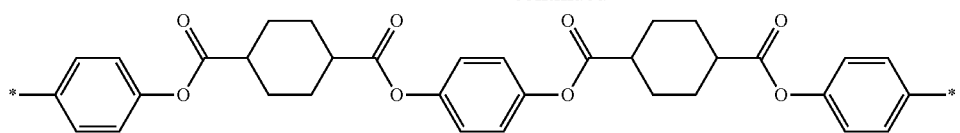
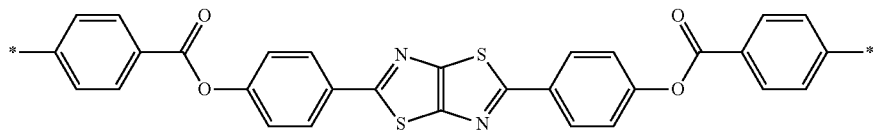
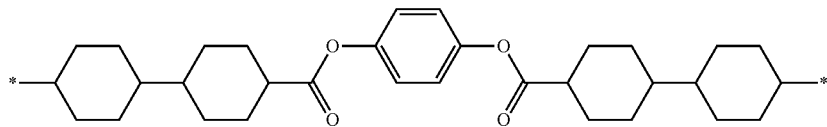
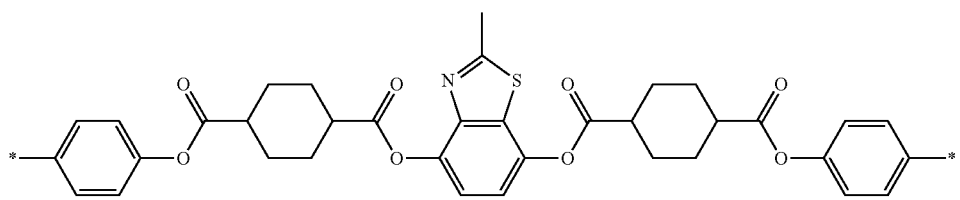
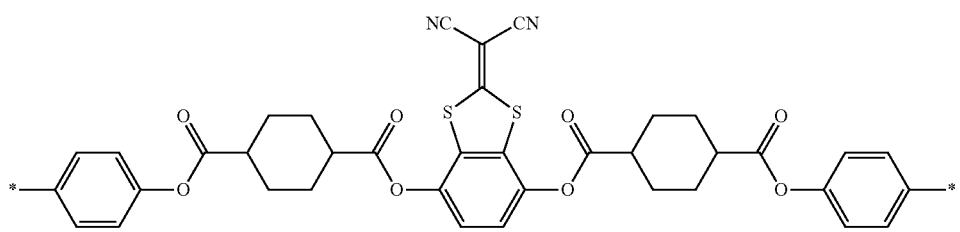
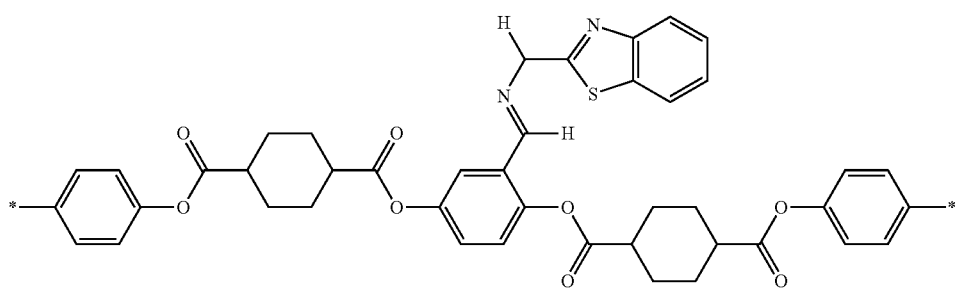
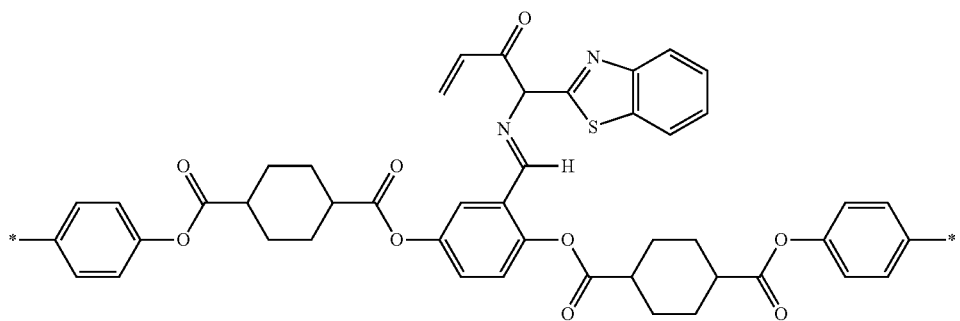

-continued
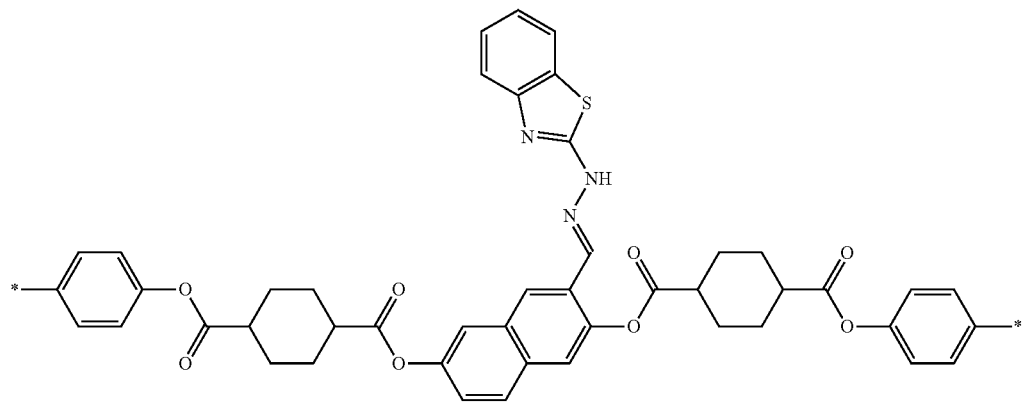
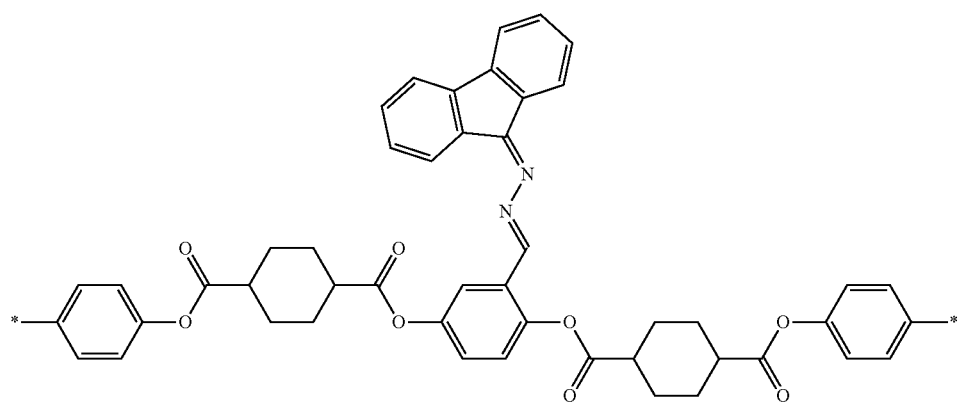
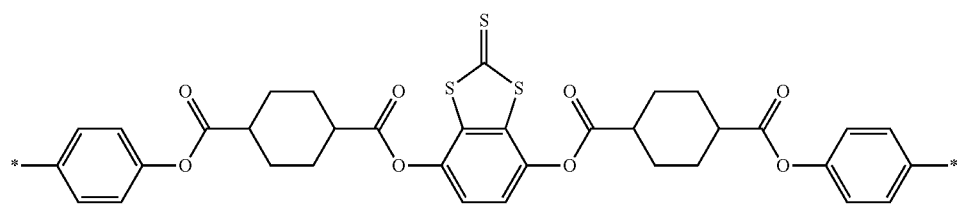
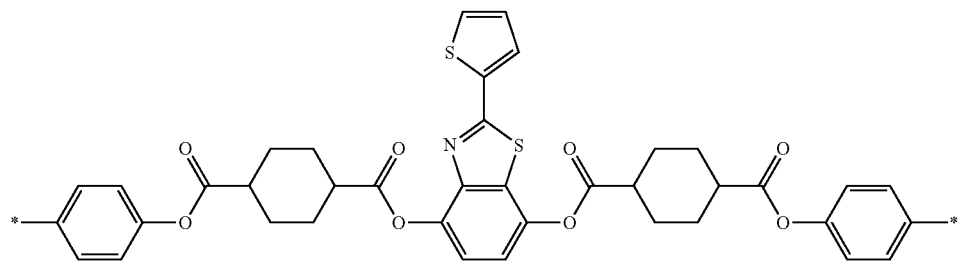
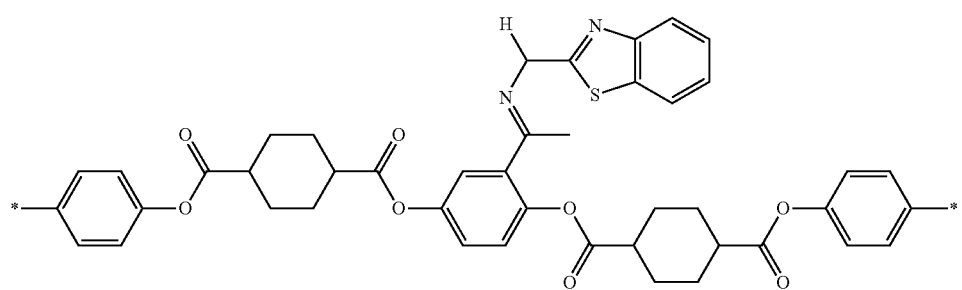

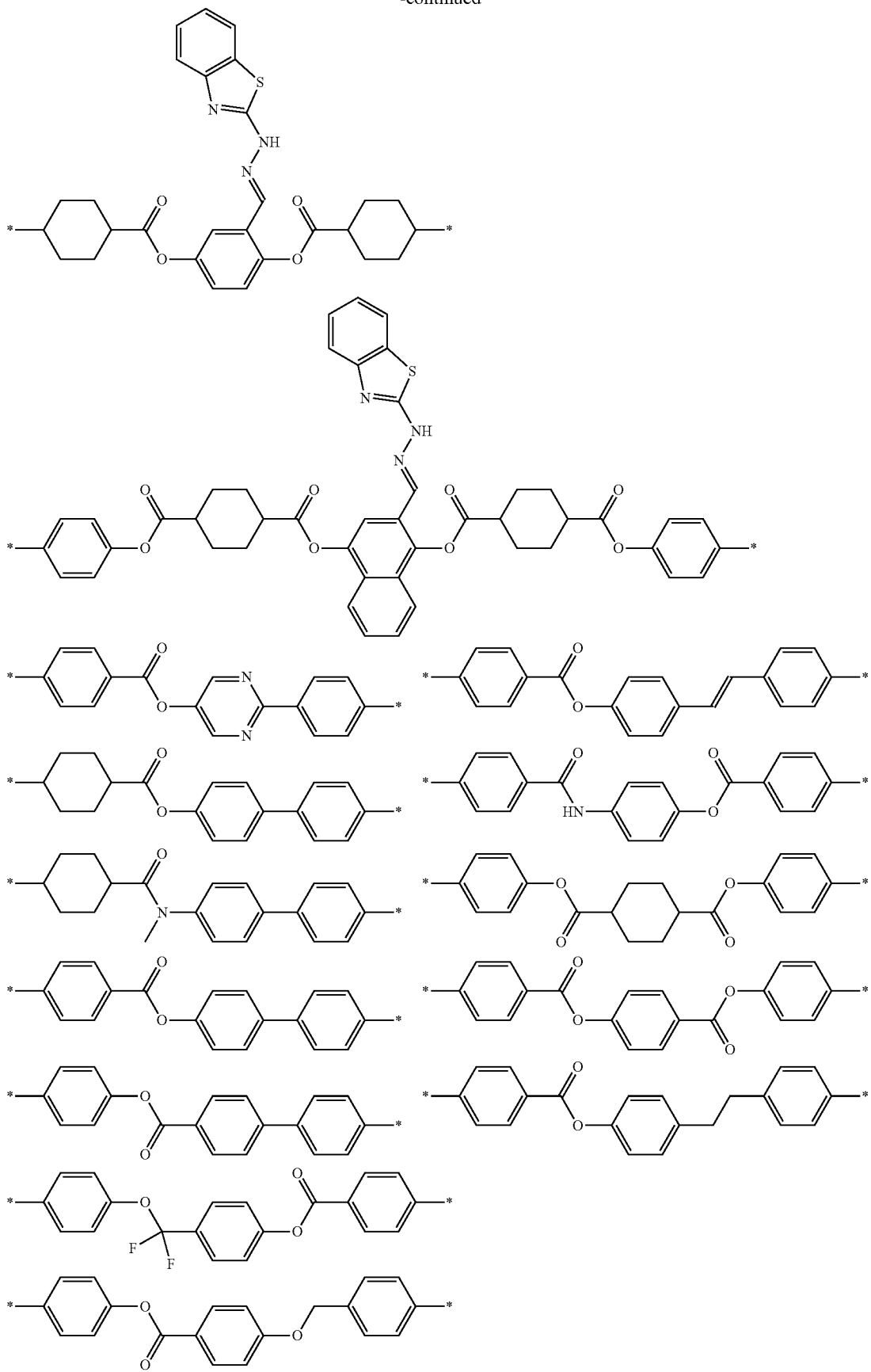

-continued
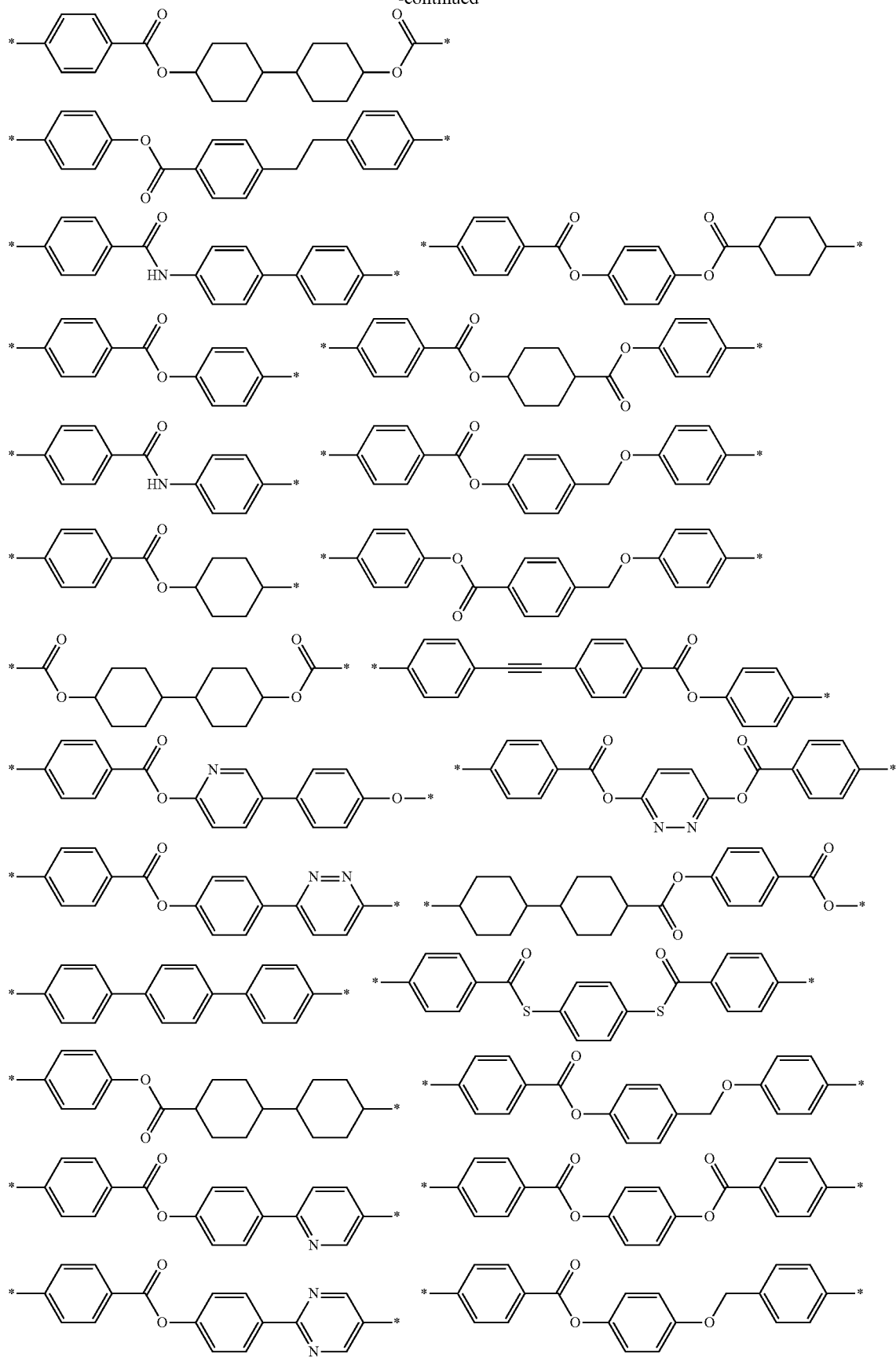

-continued
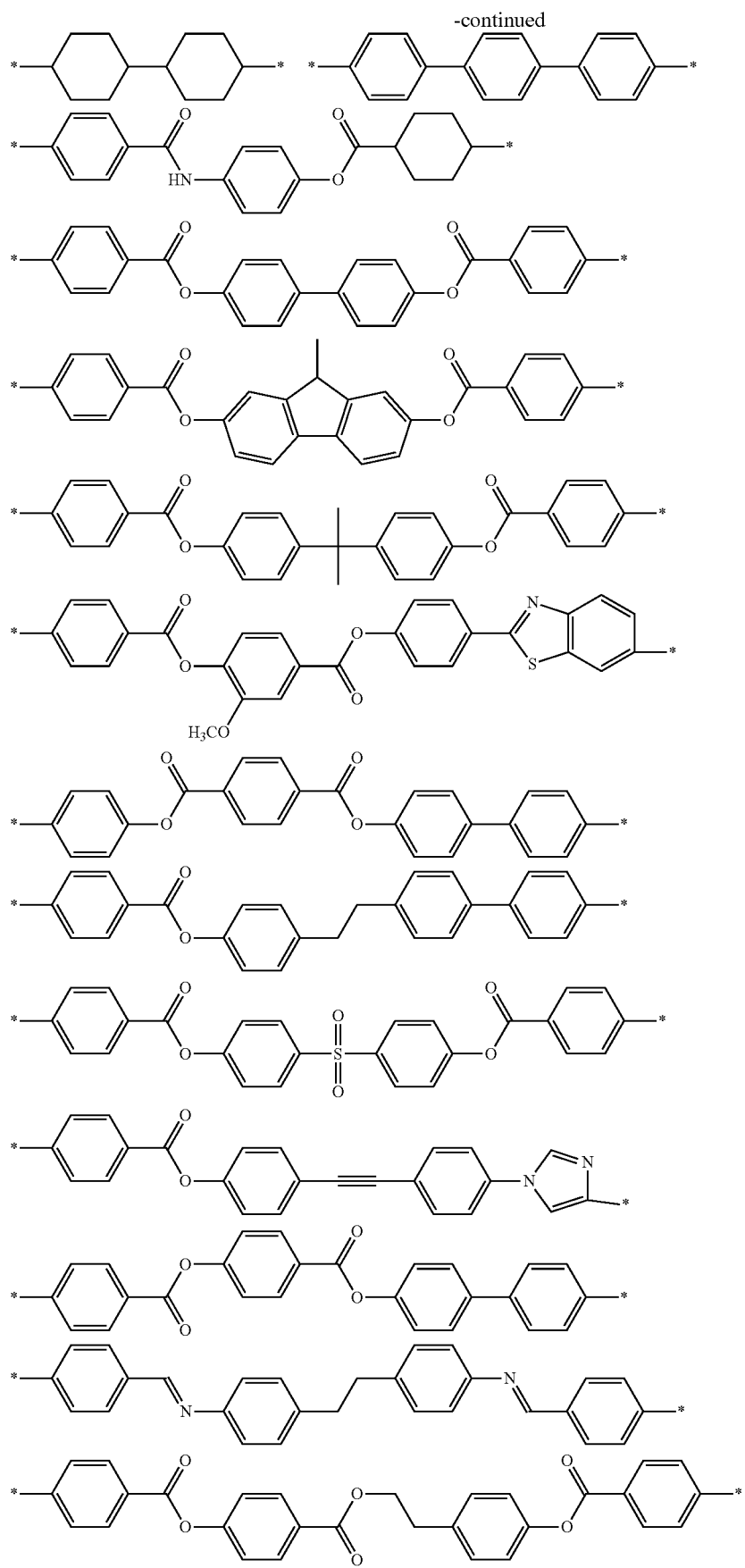

-continued

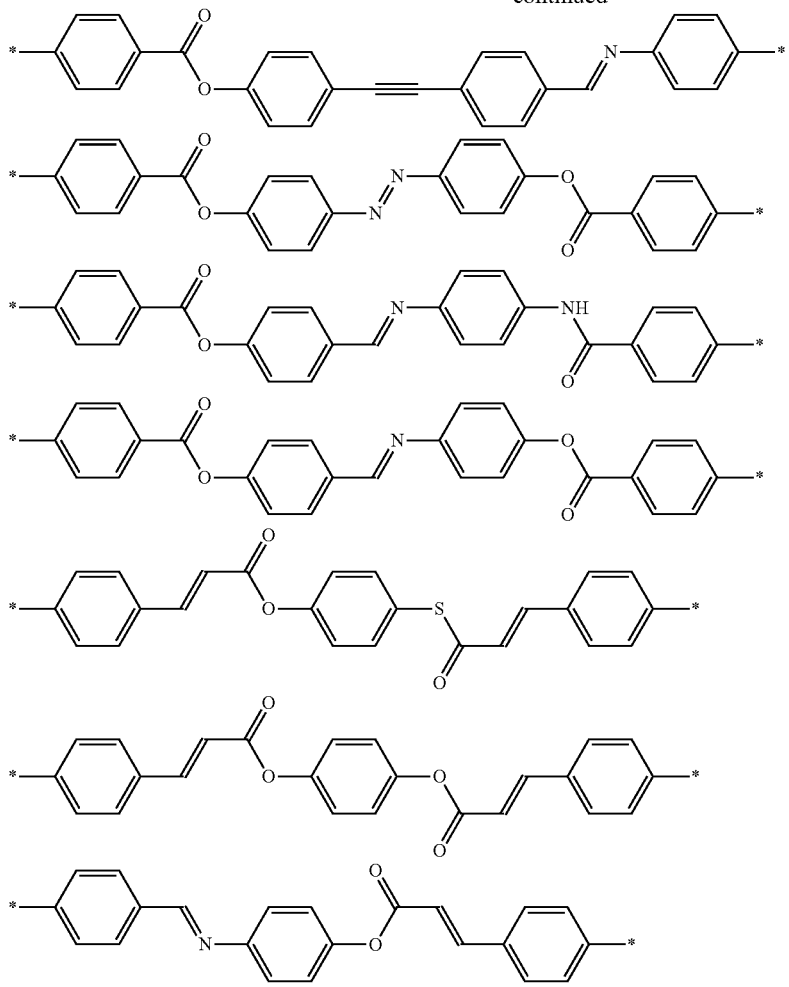

<Low-Molecular-Weight Liquid Crystal Compound>

In a case where the liquid crystal compound represented by Formula (LC) is a low-molecular-weight liquid crystal compound, examples of preferred embodiments of the cyclic structure of the mesogen group MG include a cyclohexylene group, a cyclopentylene group, a phenylene group, a naphthylene group, a fluorene-diyl group, a pyridine-diyl group, a pyridazine-diyl group, a thiophene-diyl group, an oxazole-diyl group, a thiazole-diyl group, and a thienothiophene-diyl group, and the number of cyclic structures is preferably in a range of 2 to 10 and more preferably in a range of 3 to 7.

Examples of preferred embodiments of the substituent W having a mesogen structure include a halogen atom, a halogenated alkyl group, a cyano group, a hydroxy group, a nitro group, a carboxy group, an alkoxy group having 1 to 10 carbon atoms, an alkylcarbonyl group having 1 to 10 carbon atoms, an alkyloxycarbonyl group having 1 to 10 carbon atoms, an alkylcarbonyloxy group having 1 to 10 carbon atoms, an amino group, an alkylamino group having 1 to 10 carbon atoms, an alkylaminocarbonyl group, and a group in which LW in Formula (W1) represents a single bond, SPW represents a divalent spacer group, and Q represents a crosslinkable group represented by any of Formulae (P-1) to (P-30), and preferred examples of the crosslinkable group include a vinyl group, a butadiene group, a (meth)acryl group, a (meth)acrylamide group, a vinyl acetate group, a fumaric acid ester group, a styryl group, a vinylpyrrolidone group, a maleic acid anhydride, a maleimide group, a vinyl ether group, an epoxy group, and an oxetanyl group.

Since the preferred embodiments of the divalent spacer groups S1 and S2 are the same as those of the SPW, the description thereof will not be repeated.

In a case where a low-molecular-weight liquid crystal compound exhibiting a smectic phase is used, the number of carbon atoms of the spacer group (the number of atoms in a case where the carbon atoms are substituted with "SP-C") is preferably 6 or more and more preferably 8 or more.

In a case where the liquid crystal compound represented by Formula (LC) is a low-molecular-weight liquid crystal compound, a plurality of low-molecular-weight liquid crystal compounds may be used in combination, preferably 2 to 6 kinds of low-molecular-weight liquid crystal compounds are used in combination, and more preferably 2 to 4 kinds of low-molecular-weight liquid crystal compounds are used in combination. By using low-molecular-weight liquid crystal compounds in combination, the solubility can be improved and the phase transition temperature of the liquid crystal composition can be adjusted.

Specific examples of the low-molecular-weight liquid crystal compound include compounds represented by Formulae (LC-1) to (LC-77), but the low-molecular-weight liquid crystal compound is not limited thereto.

(LC-1) 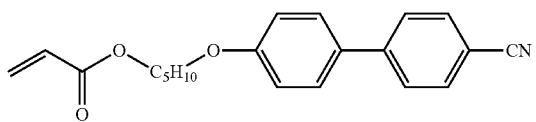
(LC-2) 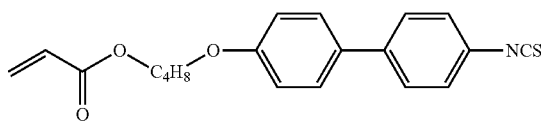
(LC-3) 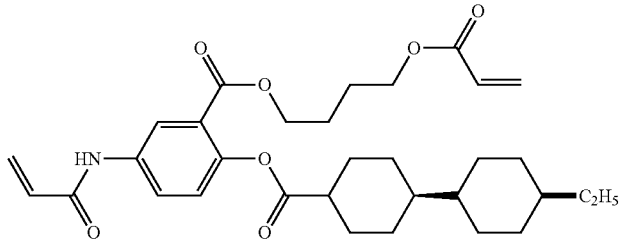
(LC-4) 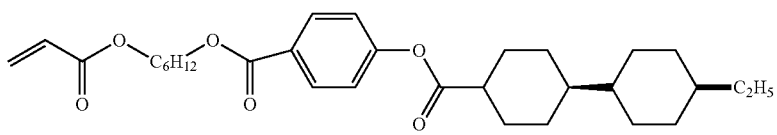
(LC-5) 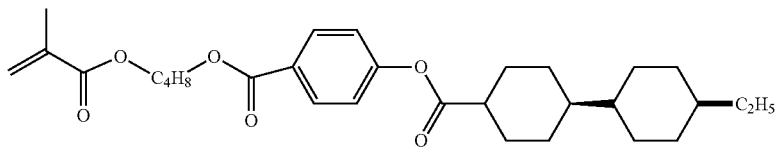
(LC-6) 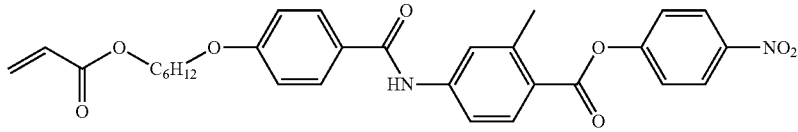
(LC-7) 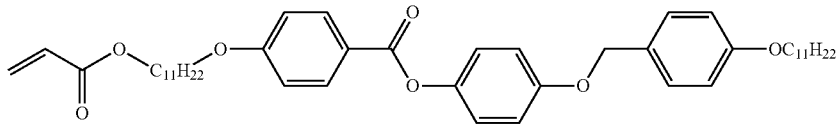
(LC-8) 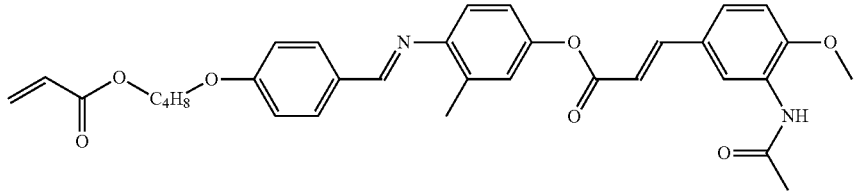
(LC-9) 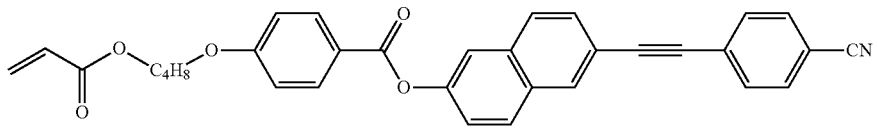
(LC-10) 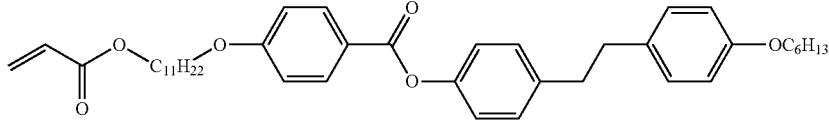
(LC-11) 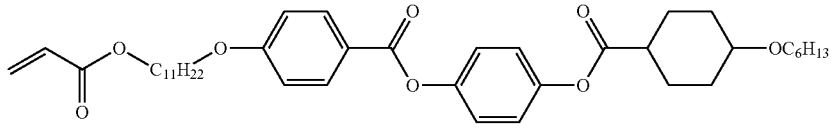

-continued
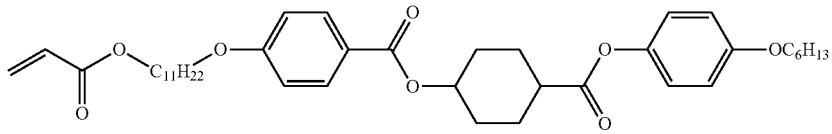
(LC-12)
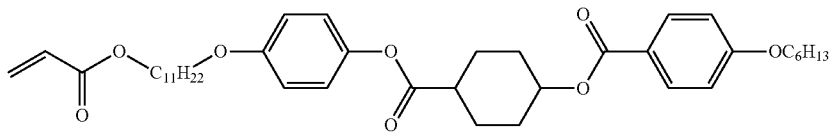
(LC-13)
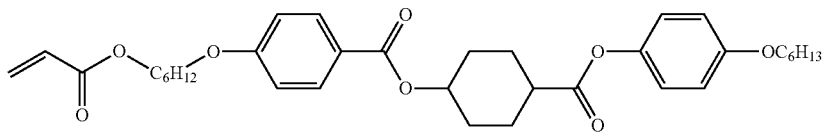
(LC-14)
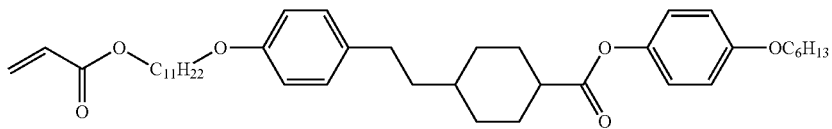
(LC-15)
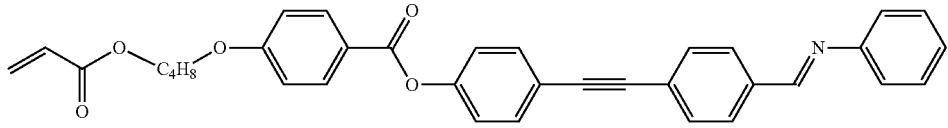
(LC-16)
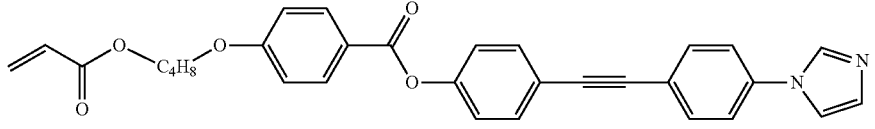
(LC-17)
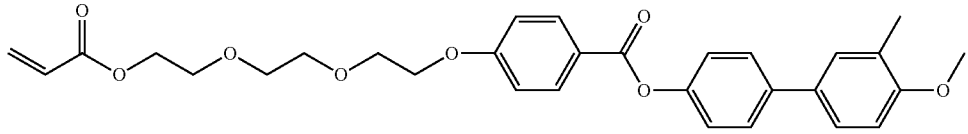
(LC-18)
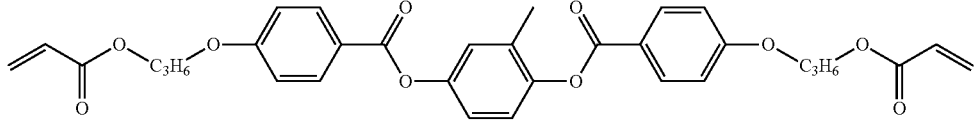
(LC-19)
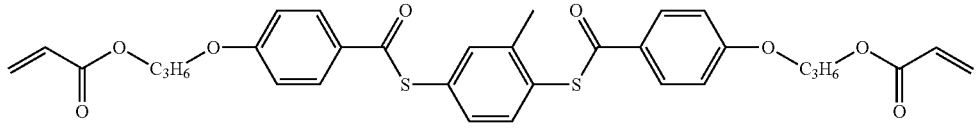
(LC-20)
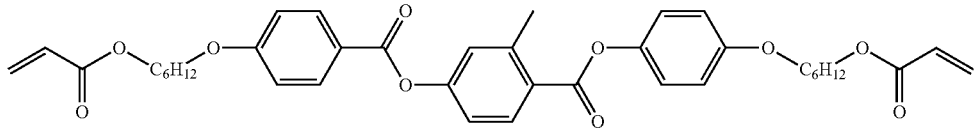
(LC-21)
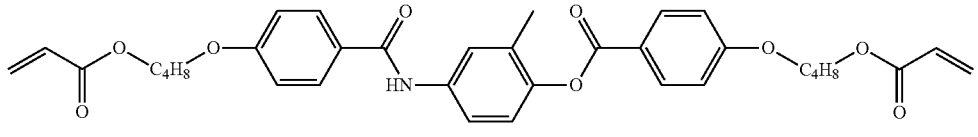
(LC-22)

-continued
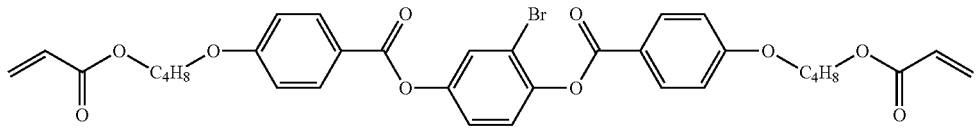
(LC-23)
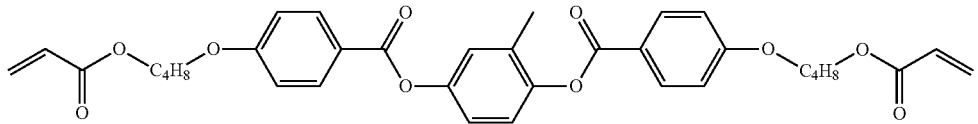
(LC-24)
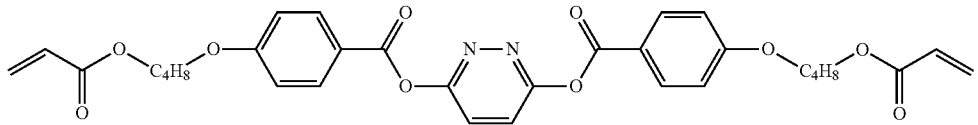
(LC-25)
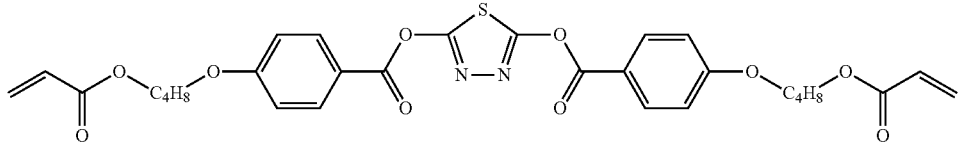
(LC-26)
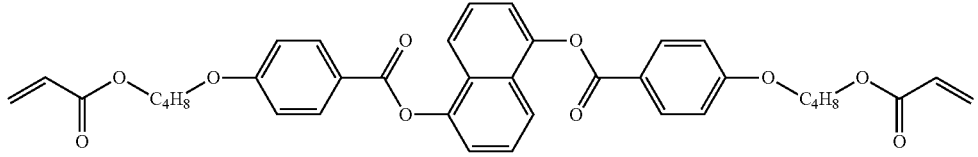
(LC-27)
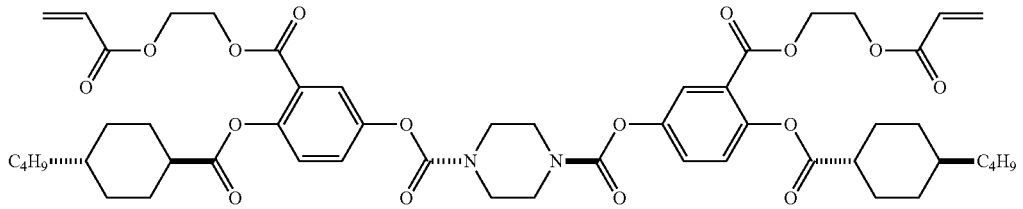
(LC-28)
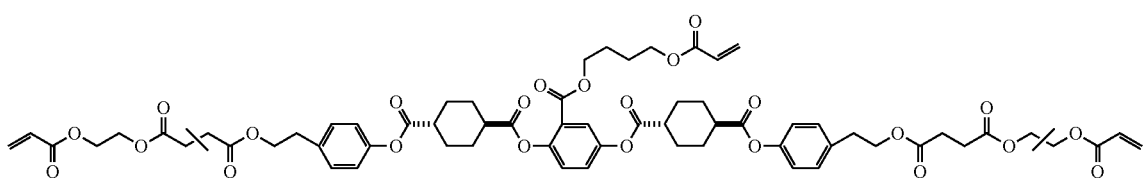
(LC-29)
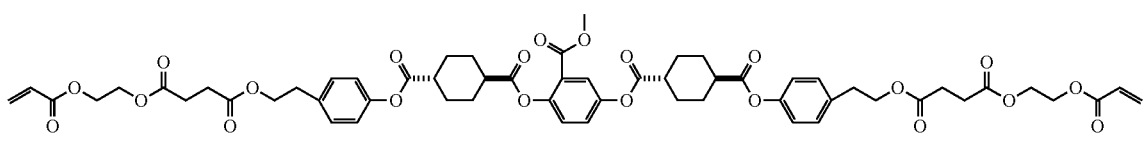
(LC-30)
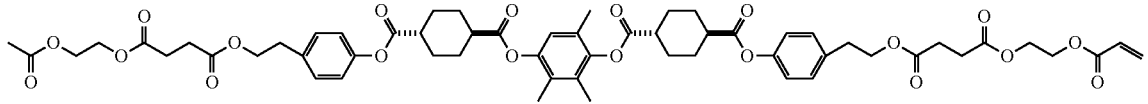
(LC-31)

-continued
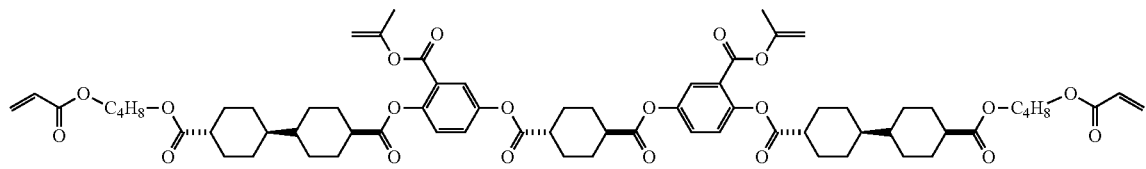
(LC-32)
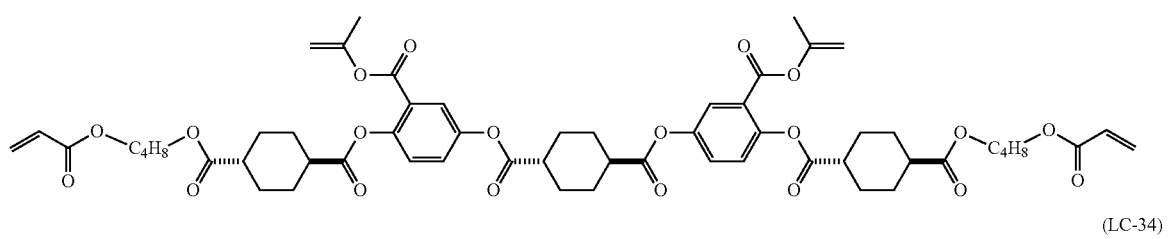
(LC-33)
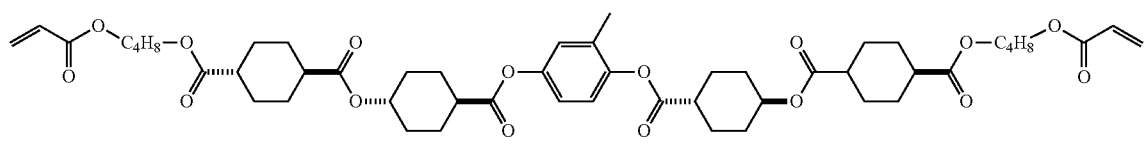
(LC-34)
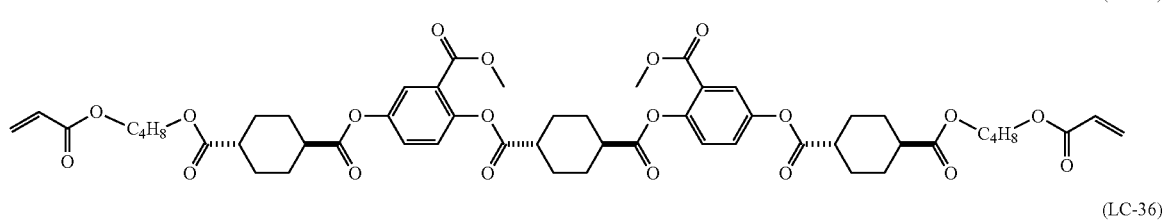
(LC-35)
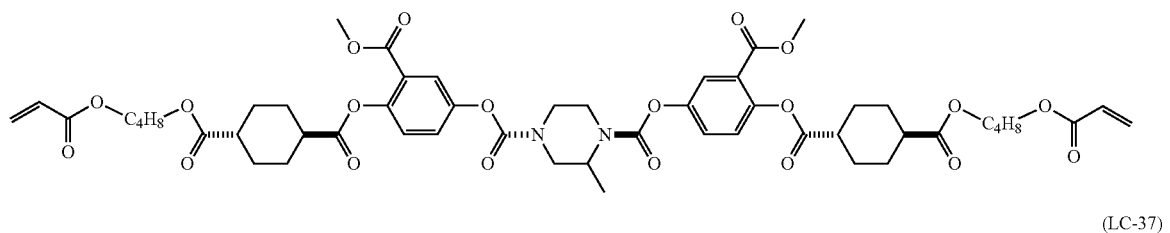
(LC-36)
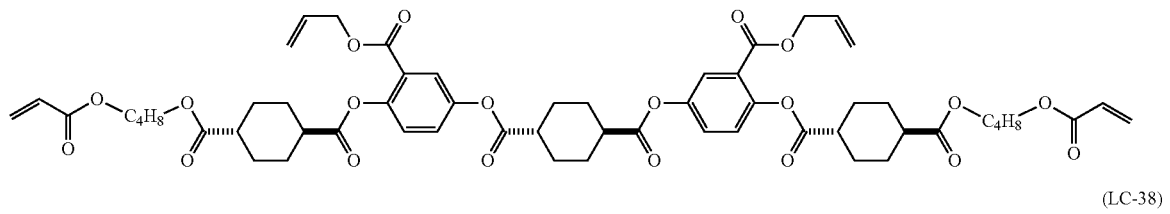
(LC-37)
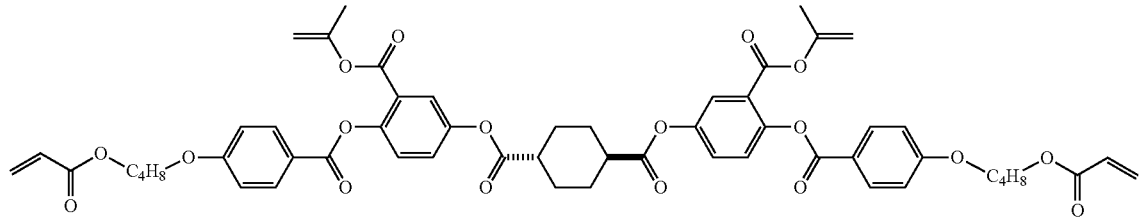
(LC-38)

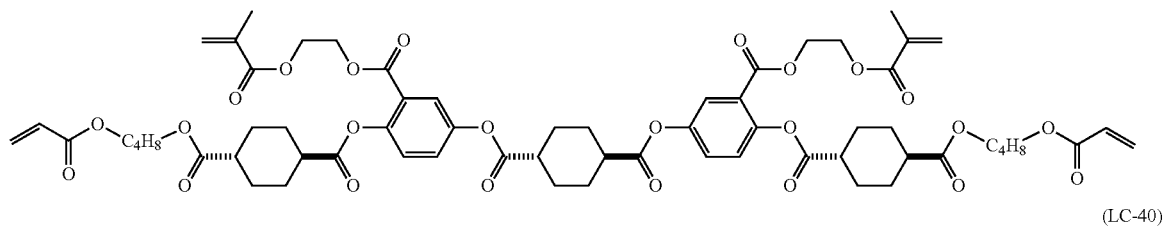
(LC-39)
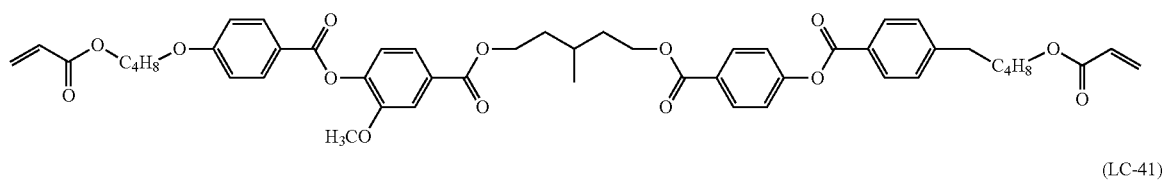
(LC-40)
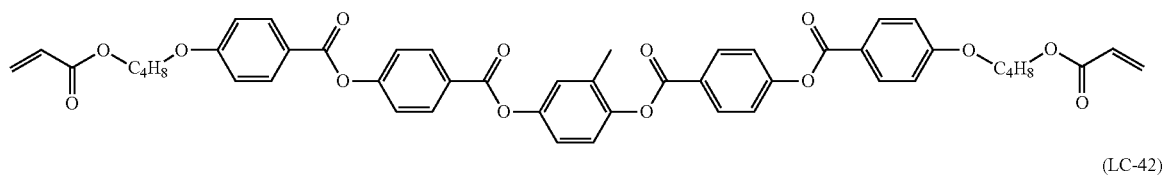
(LC-41)
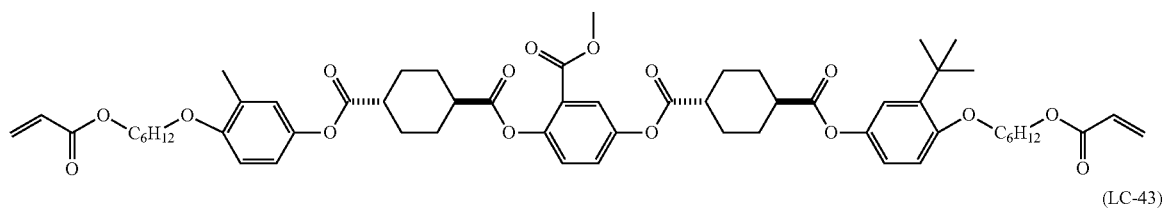
(LC-42)
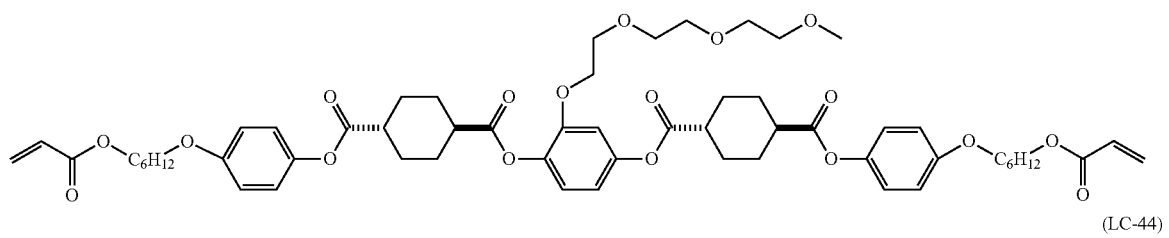
(LC-43)
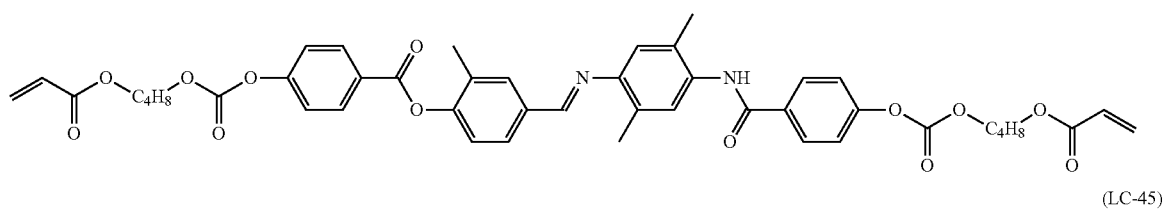
(LC-44)
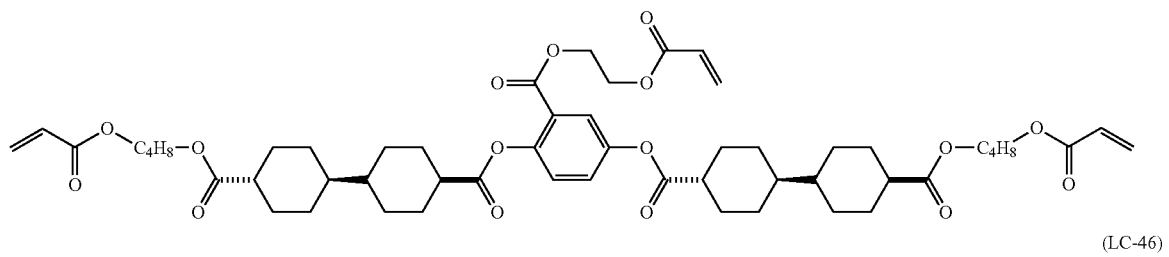
(LC-45)
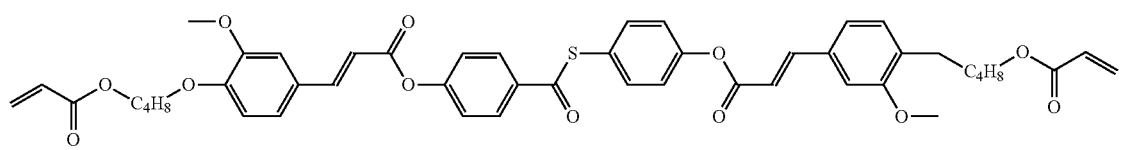
(LC-46)

(LC-47)
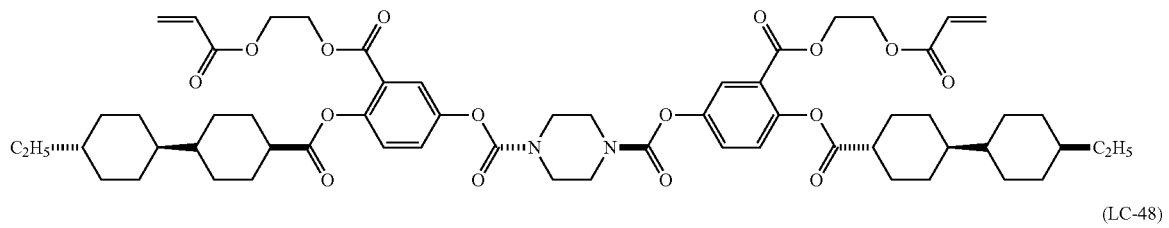
(LC-48)
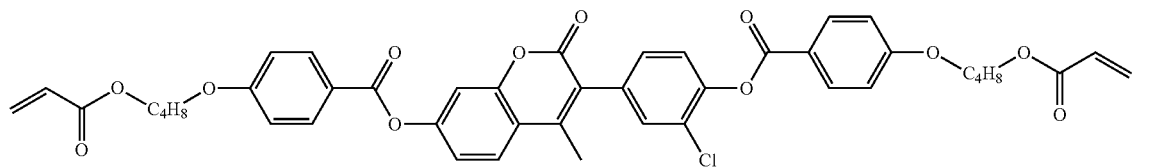
(LC-49)
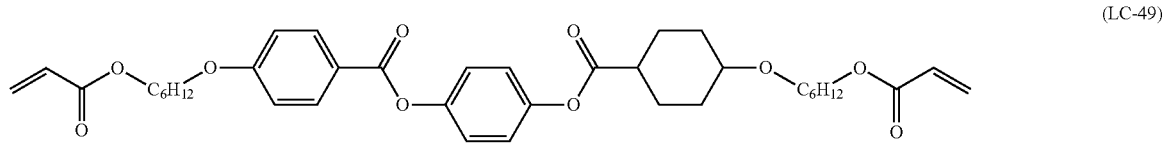
(LC-50)
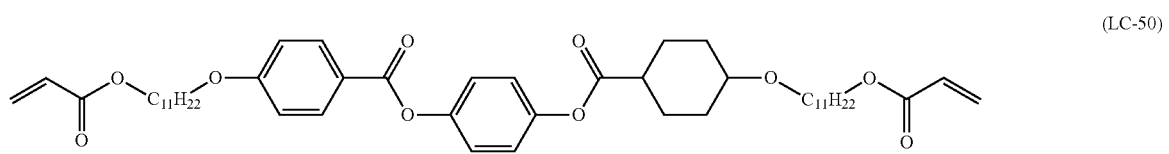
(LC-51)
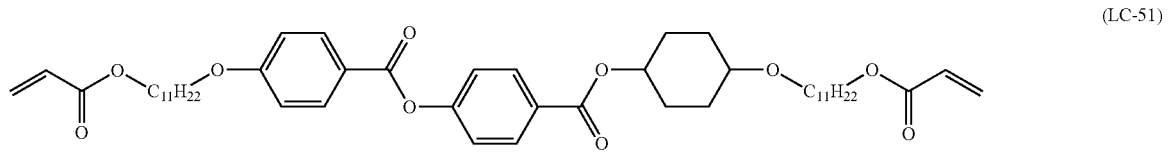
(LC-52)
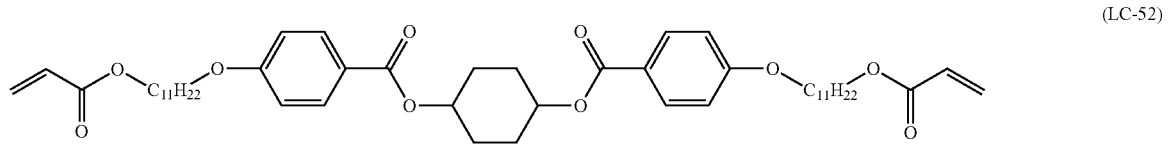
(LC-53)
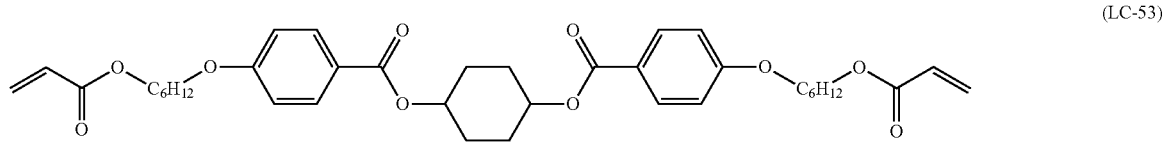
(LC-54)
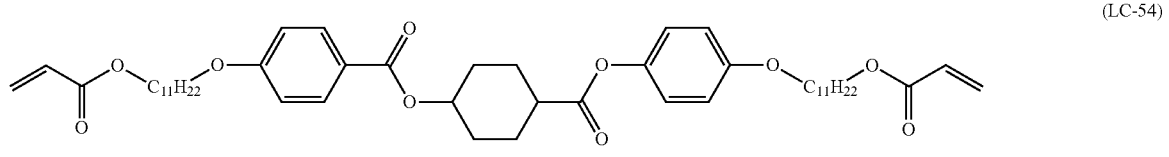
(LC-55)
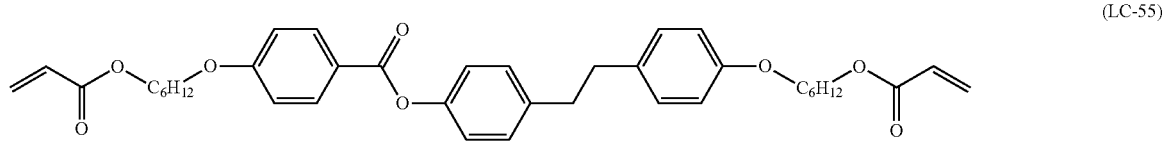
(LC-56)

-continued
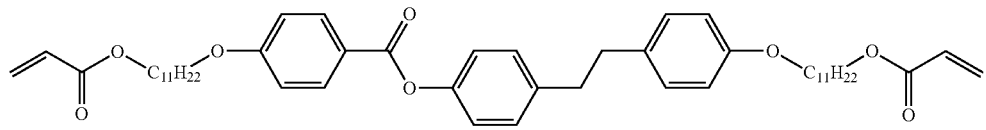
(LC-57)
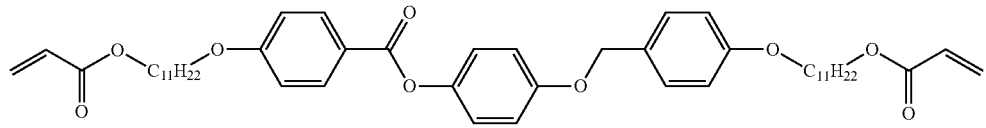
(LC-58)
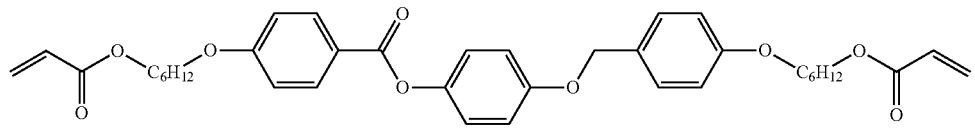
(LC-59)
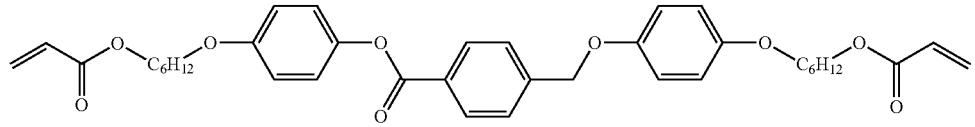
(LC-60)
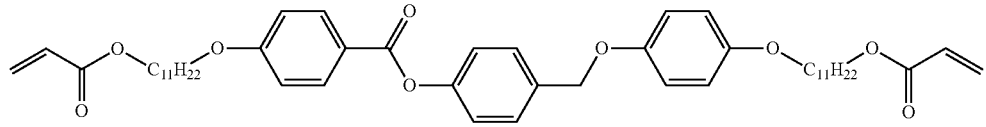
(LC-61)
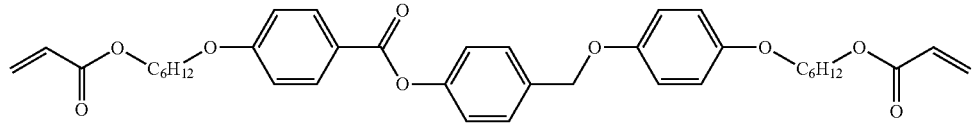
(LC-62)
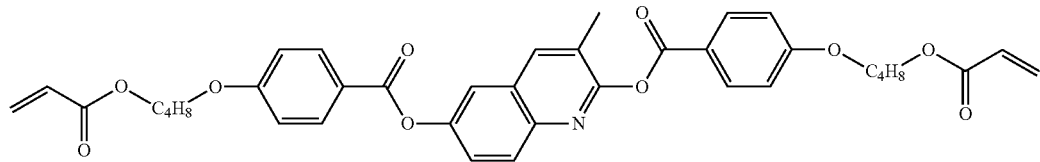
(LC-63)
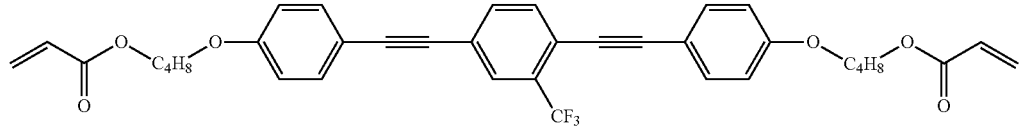
(LC-64)
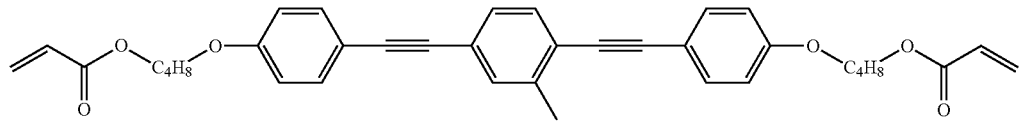
(LC-65)
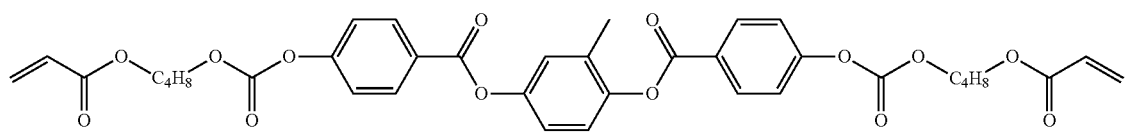
(LC-65)

(LC-66)
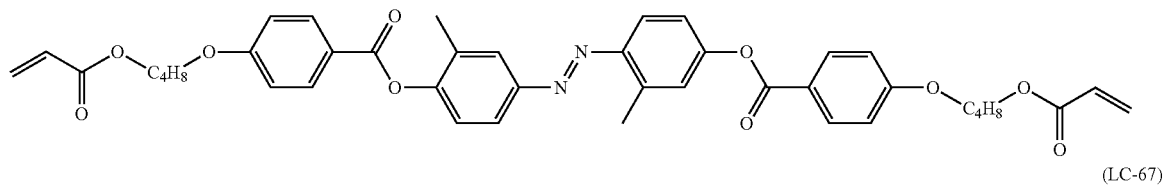
(LC-67)
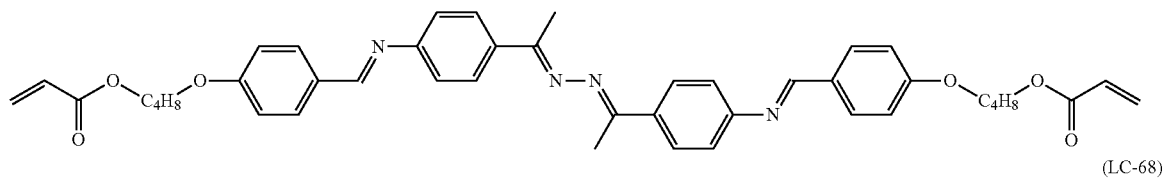
(LC-68)
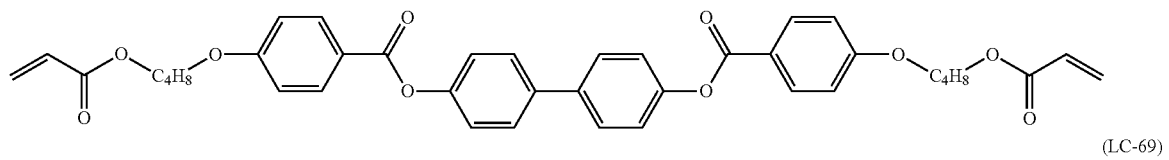
(LC-69)
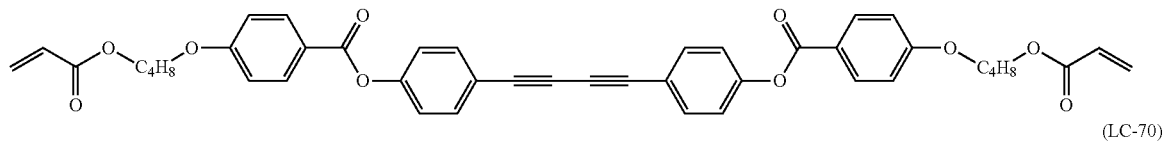
(LC-70)
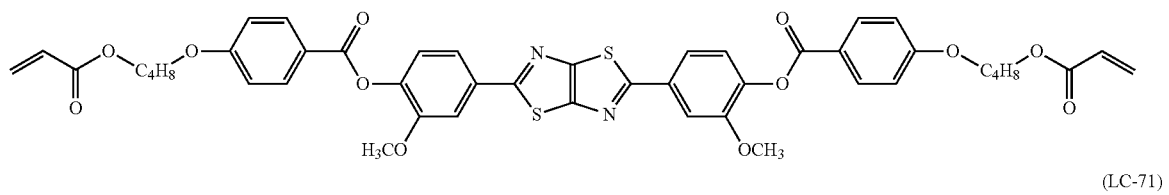
(LC-71)
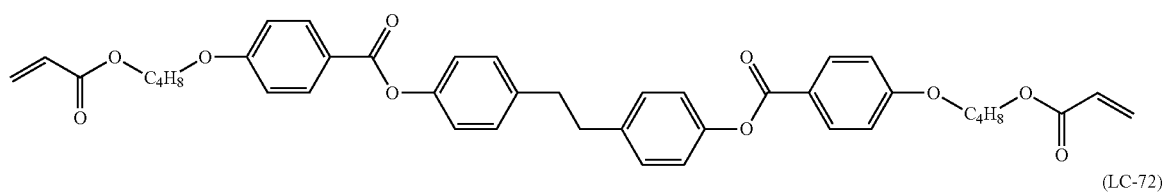
(LC-72)
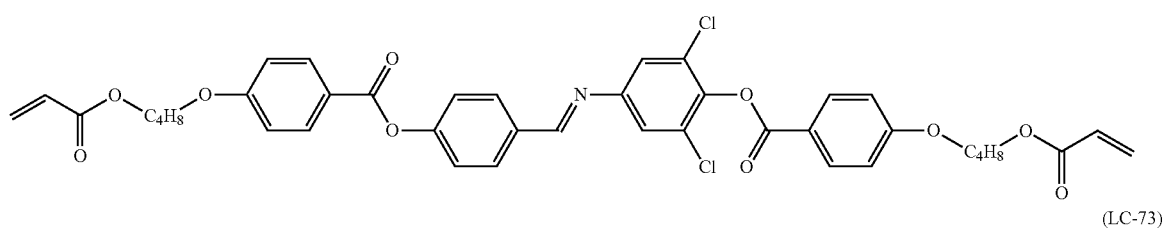
(LC-73)
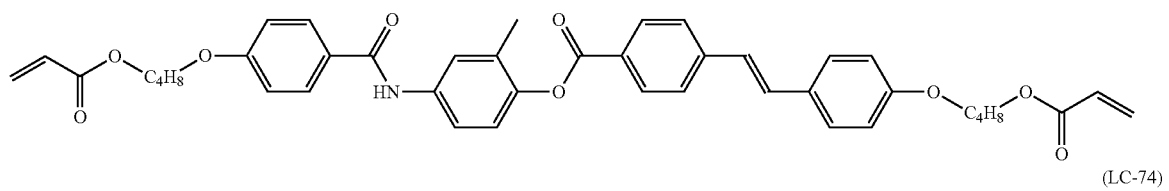
(LC-74)
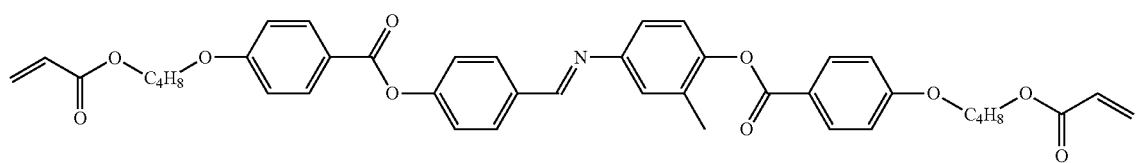

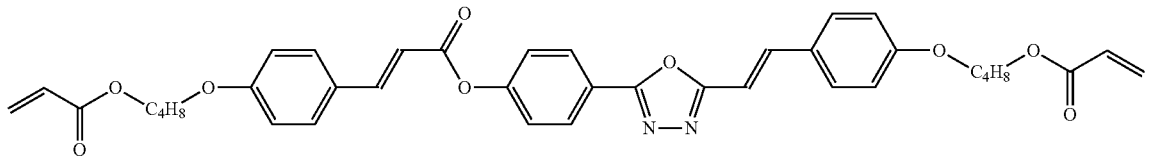
(LC-75)

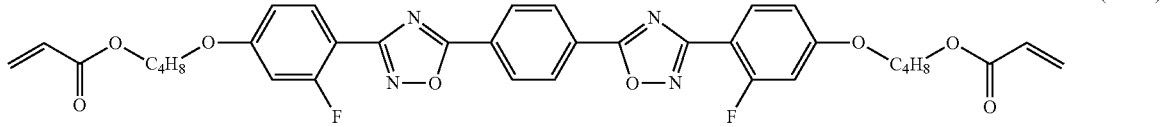
(LC-76)

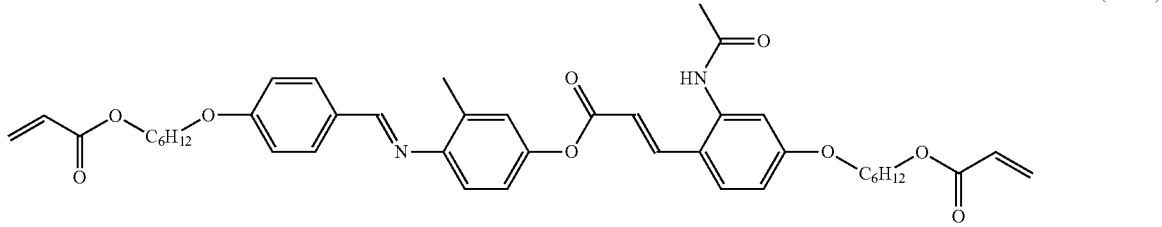
(LC-77)

<Polymer Liquid Crystal Compound>

The polymer liquid crystal compound is preferably a homopolymer or a copolymer having a repeating unit described below, and may be any of a random polymer, a block polymer, a graft polymer, a star polymer, or the like.

(Repeating Unit (1))

It is preferable that the polymer liquid crystal compound has a repeating unit represented by Formula (1) (hereinafter, also referred to as "repeating unit (1)").

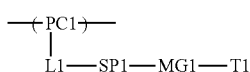
(1)

In Formula (1), PC1 represents a main chain of the repeating unit, L1 represents a single bond or a divalent linking group, SP1 represents a spacer group, MG1 represents a mesogen group MG in Formula (LC), and T1 represents a terminal group.

Examples of the main chain of the repeating unit represented by PC1 include groups represented by Formulae (P1-A) to (P1-D). Among these, from the viewpoints of diversity and handleability of a monomer serving as a raw material, a group represented by Formula (P1-A) is preferable.

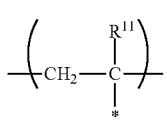
(P1-A)

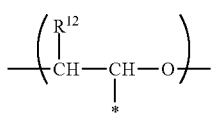
(P1-B)

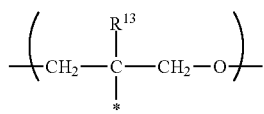
(P1-C)

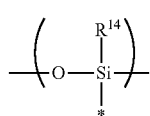
(P1-D)

In Formulae (P1-A) to (P1-D), "*" represents a bonding position with respect to L1 in Formula (1). In Formulae (P1-A) to (P1-D), $R^{11}$, $R^{12}$, $R^{13}$, and $R^{14}$ each independently represent a hydrogen atom, a halogen atom, a cyano group, an alkyl group having 1 to 10 carbon atoms, or an alkoxy group having 1 to 10 carbon atoms. The alkyl group may be a linear or branched alkyl group or an alkyl group having a cyclic structure (cycloalkyl group). Further, the number of carbon atoms of the alkyl group is preferably in a range of 1 to 5.

It is preferable that the group represented by Formula (P1-A) is a unit of a partial structure of poly(meth)acrylic acid ester obtained by polymerization of (meth)acrylic acid ester.

It is preferable that the group represented by Formula (P1-B) is an ethylene glycol unit formed by ring-opening polymerization of an epoxy group of a compound containing the epoxy group.

It is preferable that the group represented by Formula (P1-C) is a propylene glycol unit formed by ring-opening polymerization of an oxetane group of a compound containing the oxetane group.

It is preferable that the group represented by Formula (P1-D) is a siloxane unit of a polysiloxane obtained by polycondensation of a compound containing at least one of an alkoxysilyl group or a silanol group. Here, examples of the compound containing at least one of an alkoxysilyl group or a silanol group include a compound containing a group represented by Formula $SiR^{14}(OR^{15})_2$—. In the formula, $R^{14}$ has the same definition as that for $R^{14}$ in Formula (P1-D), and a plurality of $R^{15}$'s each independently represent a hydrogen atom or an alkyl group having 1 to 10 carbon atoms.

The divalent linking group represented by L1 is the same divalent linking group represented by LW in Formula (W1), and preferred embodiments thereof include —C(O)O—, —OC(O)—, —O—, —S—, —C(O)NR$^{16}$—, —NR$^{16}$C(O)—, —S(O)$_2$—, and —NR$^{16}$R$^{17}$—. In the formulae, $R^{16}$ and $R^{17}$ each independently represent a hydrogen atom or an alkyl group having 1 to 6 carbon atoms which may have a substituent (for example, the substituent W described above). In the specific examples of the divalent linking group described above, the bonding site on the left side is bonded to PC1 and the bonding site on the right side is bonded to SP1.

In a case where PC1 represents a group represented by Formula (P1-A), it is preferable that L1 represents a group represented by —C(O)O— or —C(O)NR$^{16}$—.

In a case where PC1 represents a group represented by any of Formulae (P1-B) to (P1-D), it is preferable that L1 represents a single bond.

Examples of the spacer group represented by SP1 are the same groups represented by S1 and S2 in Formula (LC), and from the viewpoint of the alignment degree, a group having at least one structure selected from the group consisting of an oxyethylene structure, an oxypropylene structure, a polysiloxane structure, and an alkylene fluoride structure or a linear or branched alkylene group having 2 to 20 carbon atoms is preferable. Here, the alkylene group may contain —O—, —S—, —O—CO—, —CO—O—, —O—CO—O—, —O—CNR— (R represents an alkyl group having 1 to 10 carbon atoms), or —S(O)$_2$—.

From the viewpoints of easily exhibiting liquid crystallinity and the availability of raw materials, it is more preferable that the spacer group represented by SP1 is a group having at least one structure selected from the group consisting of an oxyethylene structure, an oxypropylene structure, a polysiloxane structure, and an alkylene fluoride structure.

Here, as the oxyethylene structure represented by SP1, a group represented by *—(CH$_2$—CH$_2$O)$_{n1}$—* is preferable. In the formula, n1 represents an integer of 1 to 20, and * represents a bonding position with respect to L1 or MG1. From the viewpoint that the effects of the present invention are more excellent, n1 represents preferably an integer of 2 to 10, more preferably an integer of 2 to 6, and still more preferably an integer of 2 to 4.

Here, a group represented by *—(CH(CH$_3$)—CH$_2$O)$_{n2}$—* is preferable as the oxypropylene structure represented by SP1. In the formula, n2 represents an integer of 1 to 3, and * represents a bonding position with respect to L1 or MG1.

Further, a group represented by *—(Si(CH$_3$)$_2$—O)$_{n3}$—* is preferable as the polysiloxane structure represented by SP1. In the formula, n3 represents an integer of 6 to 10, and * represents a bonding position with respect to L1 or MG1.

Further, a group represented by *—(CF$_2$—CF$_2$)$_{n4}$—* is preferable as the alkylene fluoride structure represented by SP1. In the formula, n4 represents an integer of 6 to 10, and * represents a bonding position with respect to L1 or MG1.

Examples of the terminal group represented by T1 include a hydrogen atom, a halogen atom, a cyano group, a nitro group, a hydroxy group, —SH, a carboxyl group, a boronic acid group, —SO$_3$H, —PO$_3$H$_2$, —NR$^{11}$R$^{12}$ (here, $R^{11}$ and $R^{12}$ each independently represent a hydrogen atom, a substituted or unsubstituted alkyl group having 1 to 10 carbon atoms, a cycloalkyl group, or an aryl group), an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an acyloxy group having 1 to 10 carbon atoms, an acylamino group having 1 to 10 carbon atoms, an alkoxycarbonyl group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a crosslinkable group-containing group.

Examples of the crosslinkable group-containing group include -L-CL. L represents a single bond or a linking group. Specific examples of the linking group are the same groups represented by LW and SPW described above. CL represents a crosslinkable group, and examples thereof include a group represented by Q1 or Q2, and a group represented by Formulae (P-1) to (P-30) is preferable. Further, T1 may represent a group obtained by combining two or more of these groups.

From the viewpoint that the effects of the present invention are more excellent, T1 represents preferably an alkoxy group having 1 to 10 carbon atoms, more preferably an alkoxy group having 1 to 5 carbon atoms, and still more preferably a methoxy group. These terminal groups may be further substituted with these groups or the polymerizable groups described in JP2010-244038A.

From the viewpoint that the effects of the present invention are more excellent, the number of atoms in the main chain of T1 is preferably in a range of 1 to 20, more preferably in a range of 1 to 15, still more preferably in a range of 1 to 10, and particularly preferably in a range of 1 to 7. In a case where the number of atoms in the main chain of T1 is 20 or less, the alignment degree of the light absorption anisotropic layer is further improved. Here, "main chain" in T1 indicates the longest molecular chain bonded to M1, and the number of hydrogen atoms is not included in the number of atoms in the main chain of T1. For example, the number of atoms in the main chain is 4 in a case where T1 represents an n-butyl group, the number of atoms in the main chain is 3 in a case where T1 represents a sec-butyl group.

The content of the repeating unit (1) is preferably in a range of 40% to 100% by mass and more preferably in a range of 50% to 95% by mass with respect to all the repeating units (100% by mass) of the polymer liquid crystal compound. In a case where the content of the repeating unit (1) is 40% by mass or greater, an excellent light absorption anisotropic layer can be obtained due to satisfactory aligning properties. Further, in a case where the content of the repeating unit (1) is 100% by mass or less, an excellent light absorption anisotropic layer can be obtained due to satisfactory aligning properties.

The polymer liquid crystal compound may have only one or two or more kinds of the repeating units (1). In a case where the polymer liquid crystal compound has two or more kinds of repeating units (1), the content of the repeating unit (1) indicates the total content of the repeating units (1).

—Log P Value—

In Formula (1), a difference (|log $P_1$–log $P_2$|) between the log P value of PC1, L1, and SP1 (hereinafter, also referred to as "log $P_1$") and the log P value of MG1 (hereinafter, also referred to as "log $P_2$") is preferably 4 or greater, and from the viewpoint of further improving the alignment degree of the light absorption anisotropic layer, the difference thereof is more preferably 4.25 or greater and still more preferably 4.5 or greater.

Further, from the viewpoints of adjusting the liquid crystal phase transition temperature and the synthetic suitability, the upper limit of the difference is preferably 15 or less, more preferably 12 or less, and still more preferably 10 or less.

Here, the log P value is an index for expressing the properties of the hydrophilicity and hydrophobicity of a chemical structure and is also referred to as a hydrophilic-hydrophobic parameter. The log P value can be calculated using software such as ChemBioDraw Ultra or HSPiP (Ver. 4.1.07). Further, the log P value can be acquired experimentally by the method of the OECD Guidelines for the Testing of Chemicals, Sections 1, Test No. 117 or the like. In the present invention, a value calculated by inputting the structural formula of a compound to HSPiP (Ver. 4.1.07) is employed as the log P value unless otherwise specified.

The log $P_1$ indicates the log P value of PC1, L1, and SP1 as described above. Here, "log P value of PC1, L1, and SP1" indicates the log P value of a structure in which PC1, L1, and SP1 are integrated and is not the sum of the log P values of PC1, L1, and SP1. Specifically, the log $P_1$ is calculated by inputting a series of structural formulae of PC1 to SP1 in Formula (1) into the above-described software.

Here, in the calculation of the log $P_1$, in regard to the part of the group represented by PC1 in the series of structural formulae of PC1 to SP1, the structure of the group itself represented by PC1 (for example, Formulae (P1-A) to (P1-D) described above) may be used or a structure of a group that can be PC1 after polymerization of a monomer used to obtain the repeating unit represented by Formula (1) may be used.

Here, specific examples of the latter (the group that can be PC1) are as follows. In a case where PC1 is obtained by polymerization of (meth)acrylic acid ester, PC1 represents a group represented by $CH_2=C(R^1)-$ ($R^1$ represents a hydrogen atom or a methyl group). Further, PC1 represents ethylene glycol in a case where PC1 is obtained by polymerization of ethylene glycol, and PC1 represents propylene glycol in a case where PC1 is obtained by polymerization of propylene glycol. Further, in a case where PC1 is obtained by polycondensation of silanol, PC1 represents silanol (a compound represented by Formula $Si(R^2)_3(OH)$, and a plurality of $R^2$'s each independently represent a hydrogen atom or an alkyl group, where at least one of the plurality of $R^2$'s represents an alkyl group).

The log $P_1$ may be less than the log $P_2$ or greater than the log $P_2$ in a case where the difference between log $P_1$ and log $P_2$ described above is 4 or greater.

Here, the log P value of a general mesogen group (the log $P_2$ described above) tends to be in a range of 4 to 6. In a case where the log $P_1$ is less than the log $P_2$, the value of log $P_1$ is preferably 1 or less and more preferably 0 or less. Further, in a case where the log $P_1$ is greater than the log $P_2$, the value of log $P_1$ is preferably 8 or greater and more preferably 9 or greater.

In a case where PC1 in Formula (1) is obtained by polymerization of (meth)acrylic acid ester and the log $P_1$ is less than the log $P_2$, the log P value of SP1 in Formula (1) is preferably 0.7 or less and more preferably 0.5 or less. Further, in a case where PC1 in Formula (1) is obtained by polymerization of (meth)acrylic acid ester and the log $P_1$ is greater than the log $P_2$, the log P value of SP1 in Formula (1) is preferably 3.7 or greater and more preferably 4.2 or greater.

Further, examples of the structure having a log P value of 1 or less include an oxyethylene structure and an oxypropylene structure. Examples of the structure having a log P value of 6 or greater include a polysiloxane structure and an alkylene fluoride structure.

(Repeating Units (21) and (22))

From the viewpoint of improving the alignment degree, it is preferable that the polymer liquid crystal compound has a repeating unit having an electron-donating property and/or an electron-withdrawing property at the terminal. More specifically, it is more preferable that the polymer liquid crystal compound has a repeating unit (21) containing a mesogen group and an electron-withdrawing group present at the terminal of the mesogen group and having a σp value of greater than 0 and a repeating unit (22) containing a mesogen group and a group present at the terminal of the mesogen group and having a σp value of 0 or less. As described above, in a case where the polymer liquid crystal compound has the repeating unit (21) and the repeating unit (22), the alignment degree of the light absorption anisotropic layer to be formed using the polymer liquid crystal compound is further improved as compared with a case where the polymer liquid crystal compound has only one of the repeating unit (21) or the repeating unit (22). The details of the reason for this are not clear, but it is assumed as follows.

That is, it is assumed that since the opposite dipole moments generated in the repeating unit (21) and the repeating unit (22) interact between molecules, the interaction between the mesogen groups in the minor axis direction is strengthened, and the orientation in which the liquid crystals are aligned is more uniform, and as a result, the degree of order of the liquid crystals is considered to be high. In this manner, it is assumed that the aligning properties of the dichroic substance are enhanced, and thus the alignment degree of the light absorption anisotropic layer to be formed increases.

Further, the repeating units (21) and (22) may be the repeating units represented by Formula (1).

The repeating unit (21) contains a mesogen group and an electron-withdrawing group present at the terminal of the mesogen group and having a σp value of greater than 0.

The electron-withdrawing group is a group that is positioned at the terminal of the mesogen group and has a σp value of greater than 0. Examples of the electron-withdrawing group (a group having a σp value of greater than 0) include a group represented by EWG in Formula (LCP-21) described below, and specific examples thereof are also the same as those described below.

The σp value of the electron-withdrawing group described above is greater than 0. From the viewpoint of further increasing the alignment degree of the light absorption anisotropic layer, the σp value is preferably 0.3 or greater and more preferably 0.4 or greater. From the viewpoint that the uniformity of alignment is excellent, the upper limit of the σp value of the electron-withdrawing group is preferably 1.2 or less and more preferably 1.0 or less.

The σp value is a Hammett's substituent constant σp value (also simply referred to as "σp value") and is a parameter showing the intensity of the electron-donating property and the electron-withdrawing property of a substituent, which numerically expresses the effect of the substituent on the acid dissociation equilibrium constant of substituted benzoic acid. The Hammett's substituent constant σp value in the present specification indicates the substituent constant σ in a case where the substituent is positioned at the para position of benzoic acid.

As the Hammett's substituent constant σp value of each group in the present specification, the values described in the document "Hansch et al., Chemical Reviews, 1991, Vol, 91, No. 2, pp. 165 to 195" are employed. Further, the Hammett's substituent constant δp values can be calculated for groups whose Hammett's substituent constant σp values are not described in the document described above using software "ACD/ChemSketch (ACD/Labs 8.00 Release Product Version: 8.08)" based on a difference between the pKa of benzoic acid and the pKa of a benzoic acid derivative having a substituent at the para position.

The repeating unit (21) is not particularly limited as long as the repeating unit (21) contains, at a side chain thereof, a mesogen group and an electron-withdrawing group present at a terminal of the mesogen group and having a σp value of greater than 0, and from the viewpoint of further increasing the alignment degree of the light absorption anisotropic layer, it is preferable that the repeating unit (21) is a repeating unit represented by Formula (LCP-21).

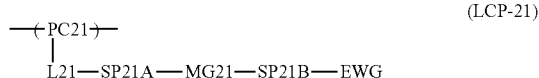

(LCP-21)

In Formula (LCP-21), PC21 represents the main chain of the repeating unit and more specifically the same structure as that for PC1 in Formula (1), L21 represents a single bond or a divalent linking group and more specifically the same structure as that for L1 in Formula (1), SP21A and SP21B each independently represent a single bond or a spacer group and more specifically the same structure as that for SP1 in Formula (1), MG21 represents a mesogen structure and more specifically a mesogen group MG in Formula (LC), and EWG represents an electron-withdrawing group having a σp value of greater than 0.

Examples of the spacer group represented by SP21A and SP21B are the same groups represented by Formulae S1 and S2, and a group having at least one structure selected from the group consisting of an oxyethylene structure, an oxypropylene structure, a polysiloxane structure, and an alkylene fluoride structure or a linear or branched alkylene group having 2 to 20 carbon atoms is preferable. Here, the alkylene group may contain —O—, —O—CO—, —CO—O—, or —O—CO—O—.

From the viewpoints of easily exhibiting liquid crystallinity and the availability of raw materials, it is preferable that the spacer group represented by SP1 has at least one structure selected from the group consisting of an oxyethylene structure, an oxypropylene structure, a polysiloxane structure, and an alkylene fluoride structure.

It is preferable that SP21B represents a single bond or a linear or branched alkylene group having 2 to 20 carbon atoms. Here, the alkylene group may contain —O—, —O—CO—, —CO—O—, or —O—CO—O—.

Among these, from the viewpoint of further increasing the alignment degree of the light absorption anisotropic layer, a single bond is preferable as the spacer group represented by SP21B. In other words, it is preferable that the repeating unit (21) has a structure in which EWG that represents an electron-withdrawing group in Formula (LCP-21) is directly linked to MG21 that represents a mesogen group in Formula (LCP-21). In this manner, it is assumed that in a case where the electron-withdrawing group is directly linked to the mesogen group, the intermolecular interaction due to an appropriate dipole moment works more effectively in the polymer liquid crystal compound, and the orientation in which the liquid crystals are aligned is more uniform, and as a result, the degree of order of the liquid crystals and the alignment degree are considered to be high.

EWG represents an electron-withdrawing group having a σp value of greater than 0. Examples of the electron-withdrawing group having a σp value of greater than 0 includes an ester group (specifically, a group represented by *—C(O)O—$R^E$), a (meth)acryloyl group, a (meth)acryloyloxy group, a carboxy group, a cyano group, a nitro group, a sulfo group, —S(O)(O)—$OR^E$, —S(O)(O)—$R^E$, —O—S(O)(O)—$R^E$, an acyl group (specifically, a group represented by *—C(O)$R^E$), an acyloxy group (specifically, a group represented by *—OC(O)$R^E$) an isocyanate group (—N═C(O)), *—C(O)N($R^F$)$_2$, a halogen atom, and an alkyl group substituted with any of these groups (preferably having 1 to 20 carbon atoms). In each of the above-described groups, * represents a bonding position with respect to SP21B. $R^E$ represents an alkyl group having 1 to 20 carbon atoms (preferably 1 to 4 carbon atoms and more preferably 1 or 2 carbon atoms). $R^F$'s each independently represents a hydrogen atom or an alkyl group having 1 to 20 carbon atoms (preferably 1 to 4 carbon atoms and more preferably 1 or 2 carbon atoms).

Among the above-described groups, from the viewpoint of further exhibiting the effects of the present invention, it is preferable that EWG represents a group represented by *—C(O)O—$R^E$, a (meth)acryloyloxy group, a cyano group, or a nitro group.

From the viewpoint that the polymer liquid crystal compound and the dichroic substance can be uniformly aligned while a high alignment degree of the light absorption anisotropic layer is maintained, the content of the repeating unit (21) is preferably 60% by mass or less, more preferably 50% by mass or less, and still more preferably 45% by mass or less with respect to all the repeating units (100% by mass) of the polymer liquid crystal compound.

From the viewpoint of further exhibiting the effects of the present invention, the lower limit of the content of the repeating unit (21) is preferably 1% by mass or greater and more preferably 3% by mass or greater with respect to all the repeating units (100% by mass) of the polymer liquid crystal compound.

In the present invention, the content of each repeating unit contained in the polymer liquid crystal compound is calculated based on the charged amount (mass) of each monomer used for obtaining each repeating unit.

The polymer liquid crystal compound may have only one or two or more kinds of repeating units (21). In a case where the polymer liquid crystal compound has two or more kinds of repeating units (21), there is an advantage in that the solubility of the polymer liquid crystal compound in a solvent is improved and the liquid crystal phase transition temperature is easily adjusted. In the case where the polymer liquid crystal compound has two or more kinds of repeating units (21), it is preferable that the total amount thereof is in the above-described range.

In the case where the polymer liquid crystal compound has two or more kinds of repeating units (21), a repeating unit (21) that does not contain a crosslinkable group in EWG and a repeating unit (21) that contains a polymerizable group in EWG may be used in combination. In this manner, the curing properties of the light absorption anisotropic layer are further improved. Further, preferred examples of the crosslinkable group include a vinyl group, a butadiene group, a (meth)acryl group, a (meth)acrylamide group, a vinyl acetate group, a fumaric acid ester group, a styryl group, a vinylpyrrolidone group, a maleic acid anhydride, a maleimide group, a vinyl ether group, an epoxy group, and an oxetanyl group.

In this case, from the viewpoint of the balance between the curing properties and the alignment degree of the light absorption anisotropic layer, the content of the repeating unit (21) containing a polymerizable group in EWG is preferably in a range of 1% to 30% by mass with respect to all the repeating units (100% by mass) of the polymer liquid crystal compound.

Hereinafter, examples of the repeating unit (21) will be described, but the repeating unit (21) is not limited to the following repeating units.

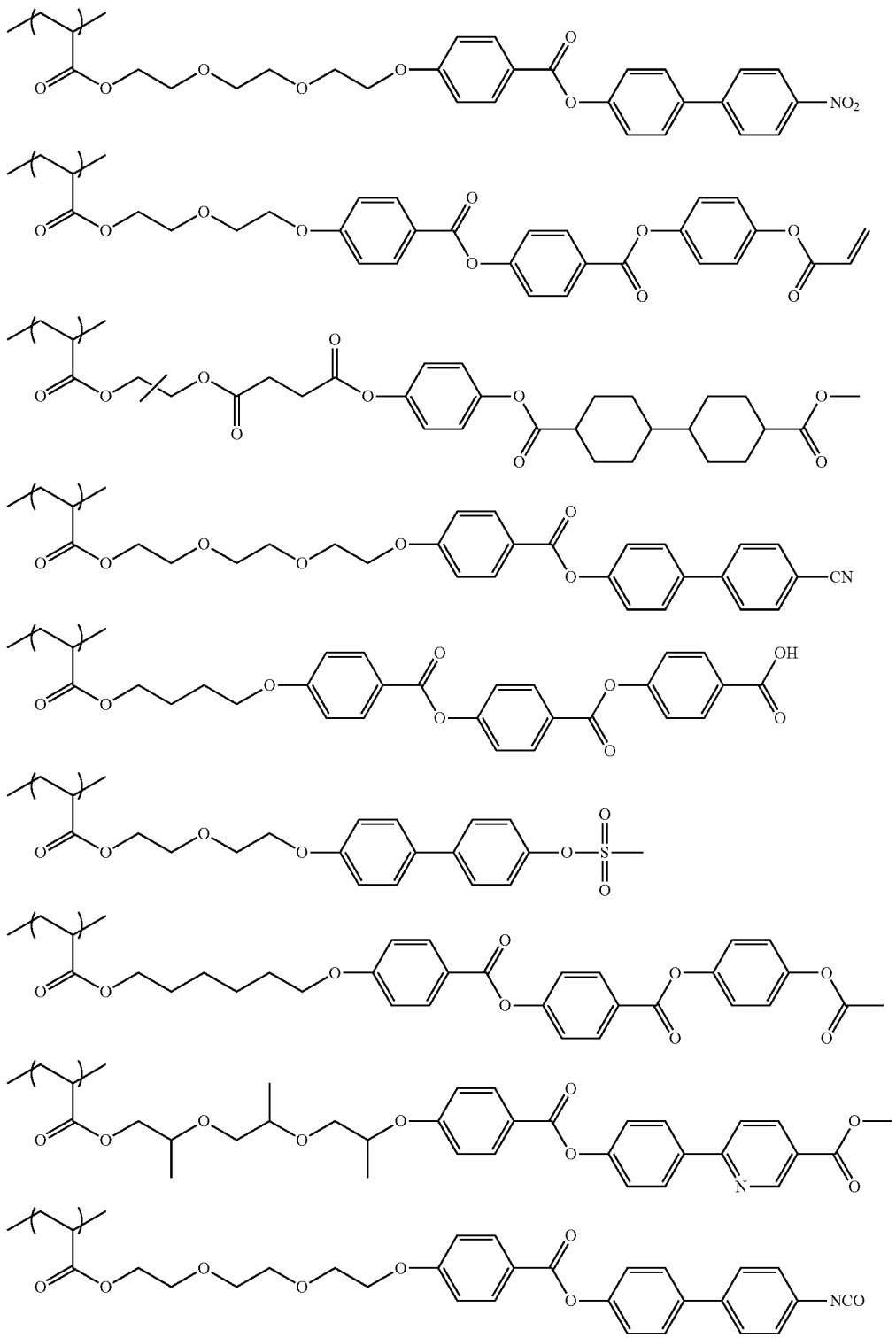

-continued
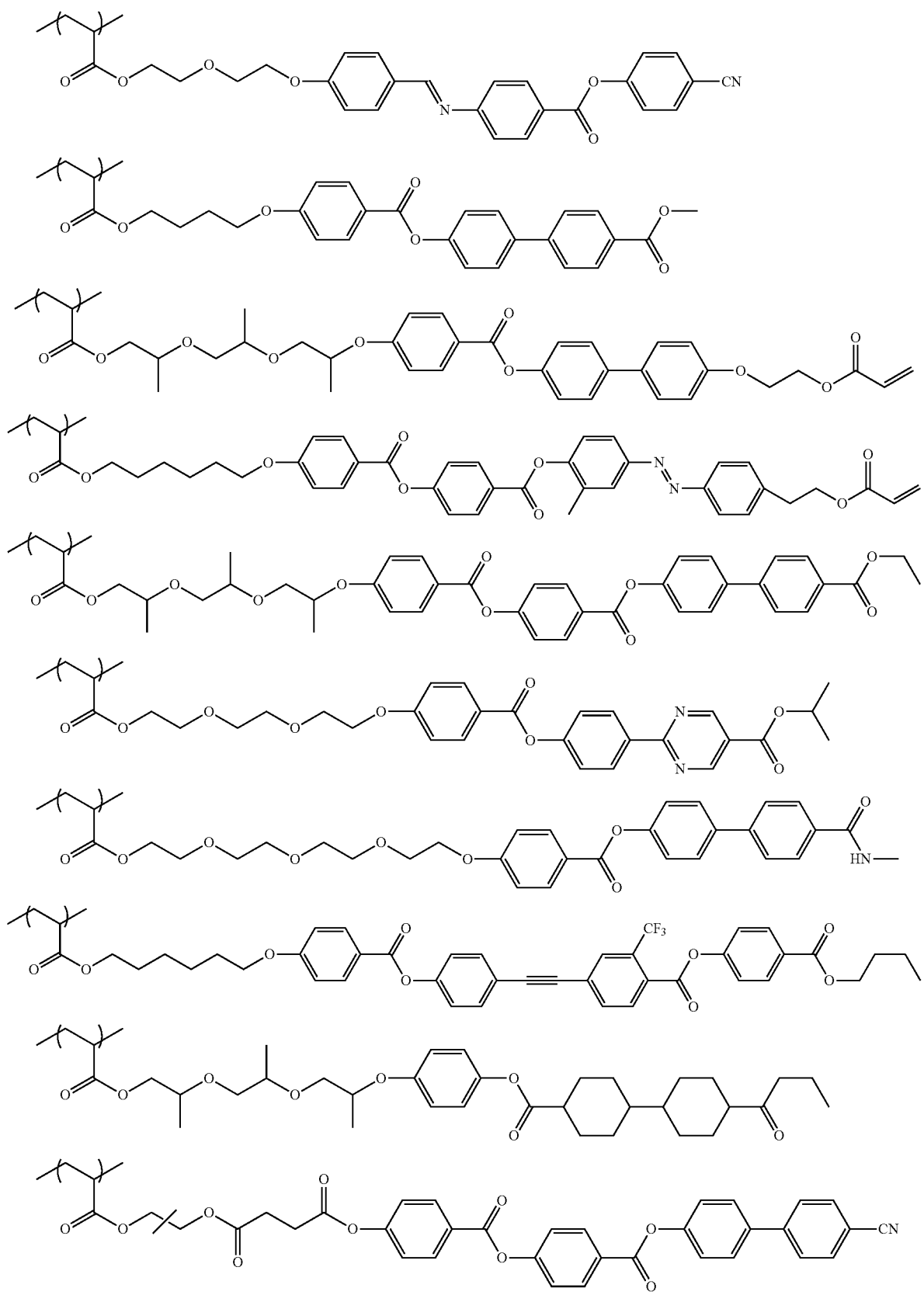

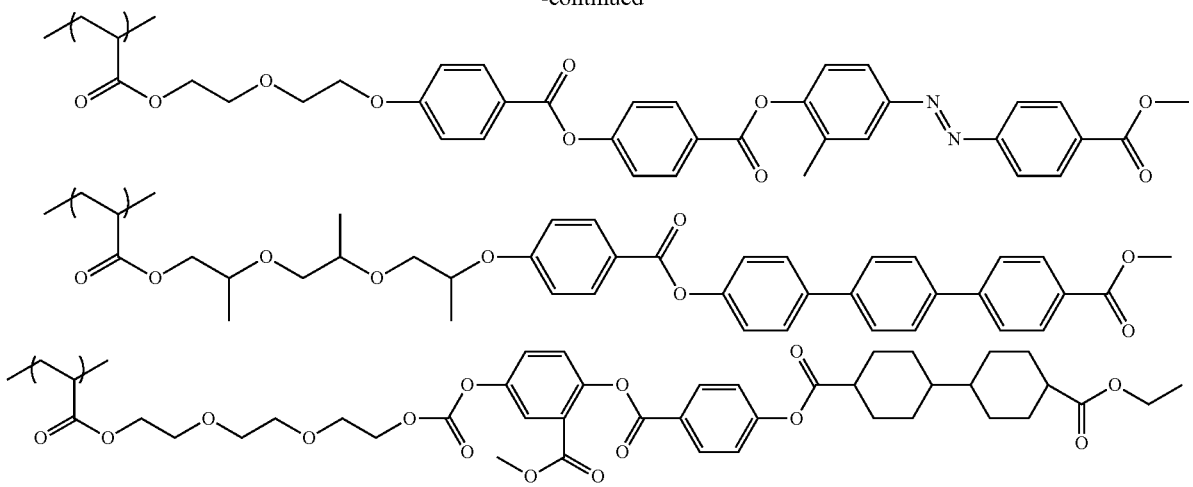

Further, in regard to the composition (content ratio) and the electron-donating property and the electron-withdrawing property of the terminal groups of the repeating unit (21) and the repeating unit (22), it is preferable that the content ratio of the repeating unit (21) is decreased because the alignment degree of the light absorption anisotropic layer is further increased in a case where the electron-withdrawing property of the electron-withdrawing group of the repeating unit (21) is high (that is, in a case where the σp value is large) and that the content ratio of the repeating unit (21) is increased because the alignment degree of the light absorption anisotropic layer is further increased in a case where the electron-withdrawing property of the electron-withdrawing group of the repeating unit (21) is low (that is, in a case where the σp value is close to 0).

The details of the reason for this are not clear, but it is assumed as follows. That is, it is assumed that since the intermolecular interaction due to an appropriate dipole moment works in the polymer liquid crystal compound, the orientation in which the liquid crystals are aligned is more uniform, and as a result, the degree of order of the liquid crystals and the alignment degree of the light absorption anisotropic layer are considered to be high.

Specifically, the product of the σp value of the electron-withdrawing group (EWG in Formula (LCP-21)) in the repeating unit (21) and the content ratio (on a mass basis) of the repeating unit (21) in the polymer liquid crystal compound is preferably in a range of 0.020 to 0.150, more preferably in a range of 0.050 to 0.130, and still more preferably in a range of 0.055 to 0.125. In a case where the product is in the above-described range, the alignment degree of the light absorption anisotropic layer is further increased.

The repeating unit (22) contains a mesogen group and a group present at the terminal of the mesogen group and having a σp value of 0 or less. In a case where the polymer liquid crystal compound has the repeating unit (22), the polymer liquid crystal compound and the dichroic substance can be uniformly aligned.

The mesogen group is a group showing the main skeleton of a liquid crystal molecule that contributes to liquid crystal formation, and the details thereof are as described in the section of MG in Formula (LCP-22) described below, and specific examples thereof are also the same as described below.

The above-described group is positioned at the terminal of the mesogen group and has a σp value of 0 or less. Examples of the above-described group (a group having a σp value of 0 or less) includes a hydrogen atom having a σp value of 0 and a group (electron-donating group) having a σp value of less than 0 and represented by T22 in Formula (LCP-22). Among the above-described groups, specific example of the group having a σp value of less than 0 (electron-donating group) are the same as those for T22 in Formula (LCP-22) described below.

The σp value of the above-described group is 0 or less, and from the viewpoint that the uniformity of alignment is more excellent, the σp value is preferably less than 0, more preferably −0.1 or less, and still more preferably −0.2 or less. The lower limit of the σp value of the above-described group is preferably −0.9 or greater and more preferably −0.7 or greater.

The repeating unit (22) is not particularly limited as long as the repeating unit (22) contains, at a side chain thereof, a mesogen group and a group present at a terminal of the mesogen group and having a σp value of 0 or less, and from the viewpoint of further increasing the uniformity of alignment of liquid crystals, it is preferable that the repeating unit (22) is a repeating unit represented by Formula (PCP-22) without corresponding to a repeating unit represented by Formula (LCP-21).

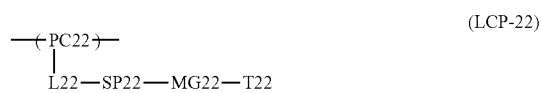

(LCP-22)

In Formula (LCP-22), PC22 represents the main chain of the repeating unit and more specifically the same structure as that for PC1 in Formula (1), L22 represents a single bond or a divalent linking group and more specifically the same structure as that for L1 in Formula (1), SP22 represents a spacer group and more specifically the same structure as that for SP1 in Formula (1), MG22 represents a mesogen structure and more specifically the same structure as the mesogen group MG in Formula (LC), and T22 represents an electron-donating group having a Hammett's substituent constant σp value of less than 0.

T22 represents an electron-donating group having a σp value of less than 0. Examples of the electron-donating group having a σp value of less than 0 include a hydroxy group, an alkyl group having 1 to 10 carbon atoms, an alkoxy group having 1 to 10 carbon atoms, and an alkylamino group having 1 to 10 carbon atoms.

In a case where the number of atoms in the main chain of T22 is 20 or less, the alignment degree of the light absorption anisotropic layer is further improved. Here, "main chain" in T22 indicates the longest molecular chain bonded to MG22, and the number of hydrogen atoms is not included in the number of atoms in the main chain of T22. For example, the number of atoms in the main chain is 4 in a case where T22 represents an n-butyl group, and the number of atoms in the main chain is 3 in a case where T22 represents a sec-butyl group.

Hereinafter, examples of the repeating unit (22) will be described, but the repeating unit (22) is not limited to the following repeating units.

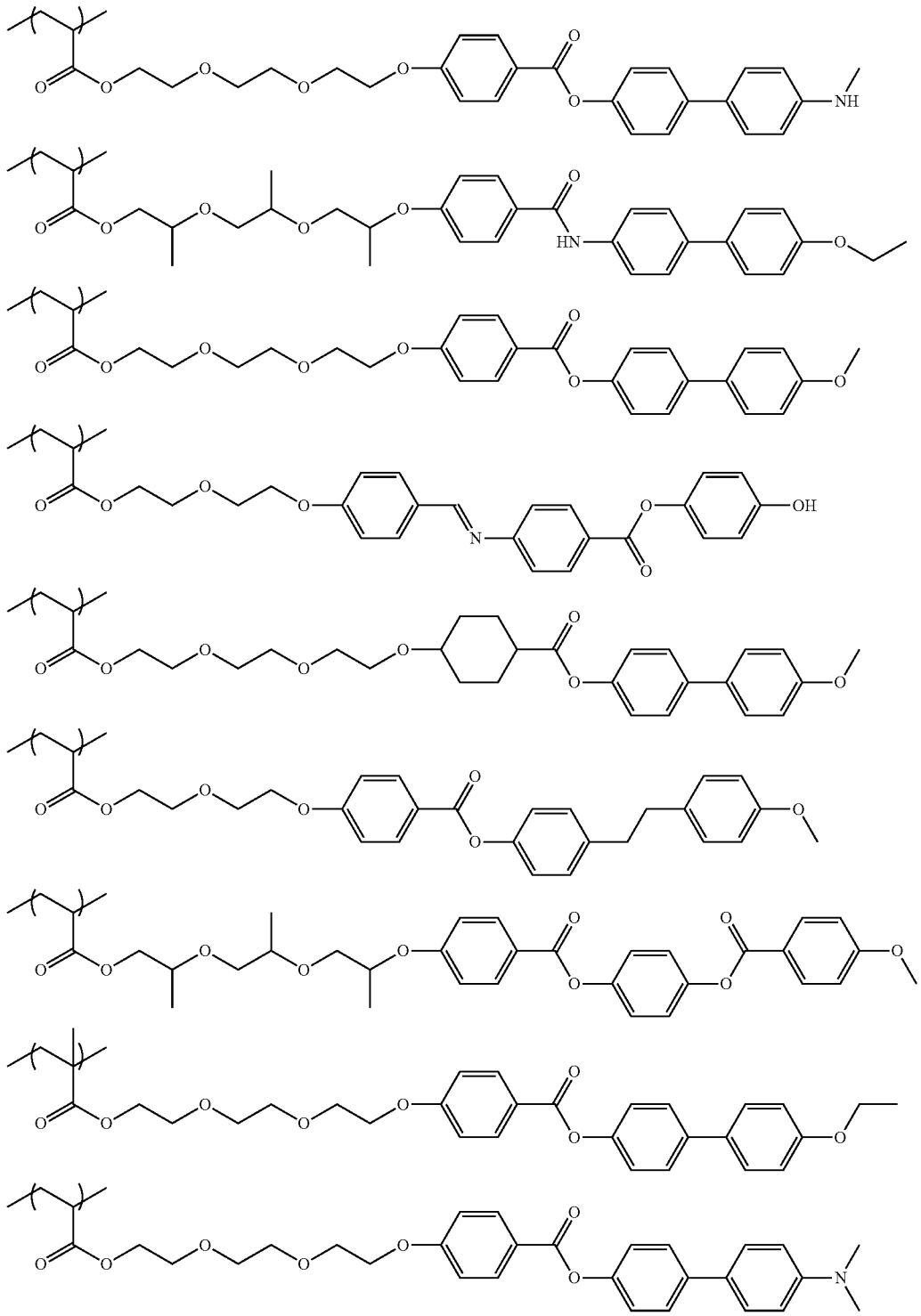

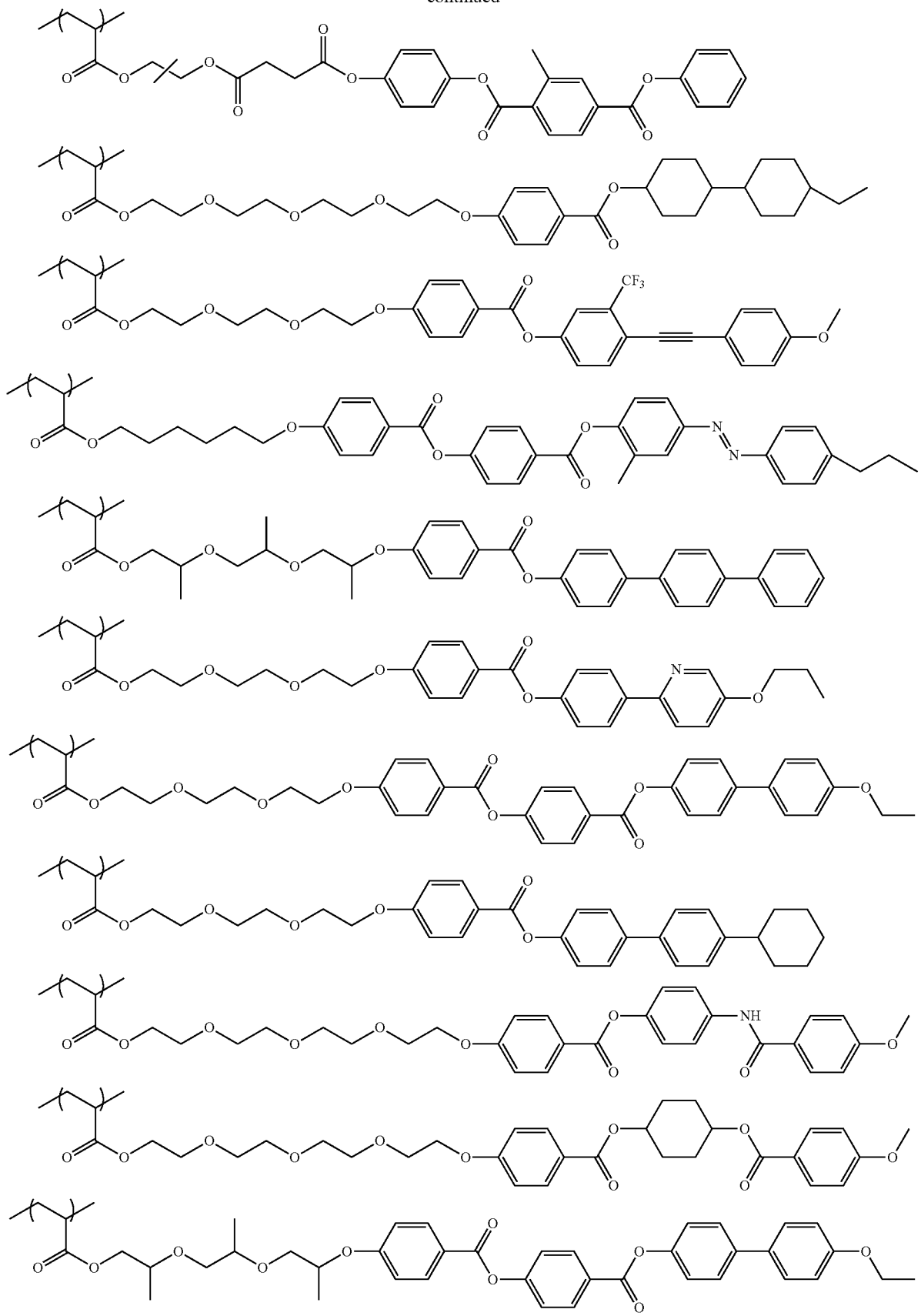

It is preferable that the structures of the repeating unit (21) and the repeating unit (22) have a part in common. It is assumed that the liquid crystals are uniformly aligned as the structures of repeating units are more similar to each other. In this manner, the alignment degree of the light absorption anisotropic layer is further improved.

Specifically, from the viewpoint of further increasing the alignment degree of the light absorption anisotropic layer, it is preferable to satisfy at least one of a condition that SP21A of Formula (LCP-21) has the same structure as that for SP22 of Formula (LCP-22), a condition that MG21 of Formula (LCP-21) has the same structure as that for MG22 of Formula (LCP-22), or a condition that L21 of Formula (LCP-21) has the same structure as that for L22 of Formula (LCP-22), more preferable to satisfy two or more of the conditions, and particularly preferable to satisfy all the conditions.

From the viewpoint that the uniformity of alignment is excellent, the content of the repeating unit (22) is preferably 50% by mass or greater, more preferably 55% or greater, and still more preferably 60% or greater with respect to all the repeating units (100% by mass) of the polymer liquid crystal compound.

From the viewpoint of improving the alignment degree, the upper limit of the content of the repeating unit (22) is preferably 99% by mass or less and more preferably 97% by mass or less with respect to all the repeating units (100% by mass) of the polymer liquid crystal compound.

The polymer liquid crystal compound may have only one or two or more kinds of repeating units (22). In a case where the polymer liquid crystal compound has two or more kinds of repeating units (22), there is an advantage in that the solubility of the polymer liquid crystal compound in a solvent is improved and the liquid crystal phase transition temperature is easily adjusted. In a case where the polymer liquid crystal compound has two or more kinds of repeating units (22), it is preferable that the total amount thereof is in the above-described range.

(Repeating Unit (3))

From the viewpoint of improving the solubility in a general-purpose solvent, the polymer liquid crystal compound may have a repeating unit (3) that does not contain a mesogen group. Particularly in order to improve the solubility while suppressing a decrease in the alignment degree, it is preferable that the polymer liquid crystal compound has a repeating unit having a molecular weight of 280 or less as the repeating unit (3) that does not contain a mesogen group. As described above, the reason why the solubility is improved while a decrease in the alignment degree is suppressed by allowing the polymer liquid crystal compound to have a repeating unit having a molecular weight of 280 or less which does not contain a mesogen group is assumed as follows.

That is, it is considered that in a case where the polymer liquid crystal compound has a repeating unit (3) that does not contain a mesogen group in a molecular chain thereof, since a solvent is likely to enter the polymer liquid crystal compound, the solubility is improved, but the alignment degree is decreased in the case of the non-mesogenic repeating unit (3). However, it is assumed that since the molecular weight of the repeating unit is small, the alignment of the repeating unit (1), the repeating unit (21), or the repeating unit (22) containing a mesogen group is unlikely to be disturbed, and thus a decrease in the alignment degree can be suppressed.

It is preferable that the repeating unit (3) is a repeating unit having a molecular weight of 280 or less.

The molecular weight of the repeating unit (3) does not indicates the molecular weight of the monomer used to obtain the repeating unit (3), but indicates the molecular weight of the repeating unit (3) in a state of being incorporated into the polymer liquid crystal compound by polymerization of the monomer.

The molecular weight of the repeating unit (3) is preferably 280 or less, more preferably 180 or less, and still more preferably 100 or less. The lower limit of the molecular weight of the repeating unit (3) is typically 40 or greater and preferably 50 or greater. In a case where the molecular weight of the repeating unit (3) is 280 or less, a light absorption anisotropic layer having excellent solubility of the polymer liquid crystal compound and a high alignment degree can be obtained.

Further, in a case where the molecular weight of the repeating unit (3) is greater than 280, the alignment of the liquid crystals in the portion of the repeating unit (1), the repeating unit (21), or the repeating unit (22) is disturbed, and thus the alignment degree is decreased. Further, since the solvent is unlikely to enter the polymer liquid crystal compound, the solubility of the polymer liquid crystal compound is decreased.

Specific examples of the repeating unit (3) include a repeating unit (hereinafter, also referred to as "repeating unit (3-1)") that does not contain a crosslinkable group (for example, an ethylenically unsaturated group) and a repeating unit (hereinafter, also referred to as "repeating unit (3-2)") that contains a crosslinkable group.

—Repeating Unit (3-1)—

Specific examples of the monomer used for polymerization of the repeating unit (3-1) include acrylic acid [72.1], α-alkylacrylic acids (such as methacrylic acid [86.1] and itaconic acid [130.1]), esters and amides derived therefrom (such as N-i-propylacrylamide [113.2], N-n-butylacrylamide [127.2], N-t-butylacrylamide [127.2], N,N-dimethylacrylamide [99.1], N-methylmethacrylamide [99.1], acrylamide [71.1], methacrylamide [85.1], diacetoneacrylamide [169.2], acryloylmorpholine [141.2], N-methylol acrylamide [101.1], N-methylol methacrylamide [115.1], methyl acrylate [86.0], ethyl acrylate [100.1], hydroxyethyl acrylate [116.1], n-propyl acrylate [114.1], i-propyl acrylate [114.2], 2-hydroxypropyl acrylate [130.1], 2-methyl-2-nitropropyl acrylate [173.2], n-butyl acrylate [128.2], i-butyl acrylate [128.2], t-butyl acrylate [128.2], t-pentyl acrylate [142.2], 2-methoxyethyl acrylate [130.1], 2-ethoxyethyl acrylate [144.2], 2-ethoxyethoxyethyl acrylate [188.2], 2,2,2-trifluoroethyl acrylate [154.1], 2,2-dimethylbutyl acrylate [156.2], 3-methoxybutyl acrylate [158.2], ethyl carbitol acrylate [188.2], phenoxyethyl acrylate [192.2], n-pentyl acrylate [142.2], n-hexyl acrylate [156.2], cyclohexyl acrylate [154.2], cyclopentyl acrylate [140.2], benzyl acrylate [162.2], n-octyl acrylate [184.3], 2-ethylhexyl acrylate [184.3], 4-methyl-2-propylpentyl acrylate [198.3], methyl methacrylate [100.1], 2,2,2-trifluoroethyl methacrylate [168.1], hydroxyethyl methacrylate [130.1], 2-hydroxypropyl methacrylate [144.2], n-butyl methacrylate [142.2], i-butyl methacrylate [142.2], sec-butyl methacrylate [142.2], n-octyl methacrylate [198.3], 2-ethylhexyl methacrylate [198.3], 2-methoxyethyl methacrylate [144.2], 2-ethoxyethyl methacrylate [158.2], benzyl methacrylate [176.2], 2-norbornyl methyl methacrylate [194.3], 5-norbornen-2-ylmethyl methacrylate [194.3], and dimethylaminoethyl methacrylate [157.2]), vinyl esters (such as vinyl acetate [86.1]), esters derived from maleic acid or fumaric acid (such as dimethyl maleate [144.1] and diethyl fumarate [172.2]), maleimides (such as N-phenylmaleimide [173.2]), maleic acid [116.1], fumaric acid [116.1], p-styrenesulfonic acid [184.1], acrylonitrile [53.1], methacrylonitrile [67.1], dienes (such as butadiene [54.1], cyclopentadiene [66.1], and isoprene [68.1]), aromatic vinyl compounds (such as styrene [104.2], p-chlorostyrene [138.6], t-butylstyrene [160.3], and α-methylstyrene [118.2]), N-vinylpyrrolidone [111.1], N-vinyloxazolidone [113.1], N-vinyl succinimide [125.1], N-vinylformamide [71.1], N-vinyl-N-methylformamide [85.1], N-vinylacetamide [85.1], N-vinyl-N-methylacetamide [99.1], 1-vinylimidazole [94.1], 4-vinylpyridine [105.2], vinylsulfonic acid [108.1], sodium vinyl sulfonate [130.2], sodium allyl sulfonate [144.1], sodium methallyl sulfonate [158.2], vinylidene chloride [96.9], vinyl alkyl ethers (such as methyl vinyl ether [58.1]), ethylene [28.0], propylene [42.1], 1-butene [56.1], and isobutene [56.1]. Further, the numerical values in the parentheses indicate the molecular weights of the monomers.

The above-described monomers may be used alone or in combination of two or more kinds thereof.

Among the above-described monomers, acrylic acid, α-alkylacrylic acids, esters and amides derived therefrom, acrylonitrile, methacrylonitrile, and aromatic vinyl compounds are preferable.

As monomers other than the above-described monomers, the compounds described in Research Disclosure No. 1955 (July, 1980) can be used.

Hereinafter, specific examples of the repeating unit (3-1) and the molecular weights thereof will be described, but the present invention is not limited to these specific examples.

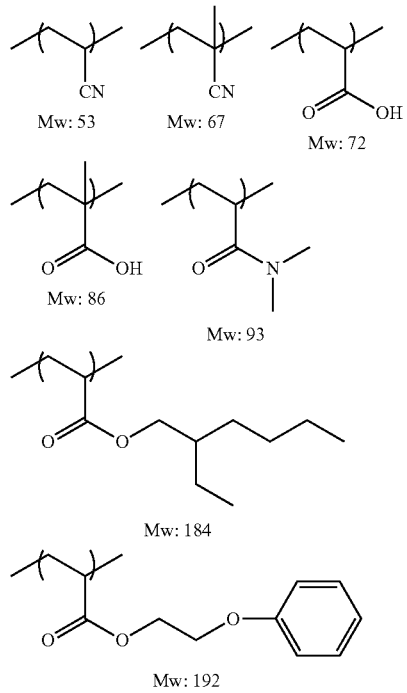

—Repeating Unit (3-2)—

Specific examples of the crosslinkable group in the repeating unit (3-2) include the groups represented by Formulae (P-1) to (P-30). Among these, a vinyl group, a butadiene group, a (meth)acryl group, a (meth)acrylamide group, a vinyl acetate group, a fumaric acid ester group, a styryl group, a vinylpyrrolidone group, a maleic acid anhydride, a maleimide group, a vinyl ether group, an epoxy group, and an oxetanyl group are more preferable.

From the viewpoint of easily performing polymerization, it is preferable that the repeating unit (3-2) is a repeating unit represented by Formula (3).

(3)

In Formula (3), PC32 represents the main chain of the repeating unit and more specifically the same structure as that for PC1 in Formula (1), L32 represents a single bond or a divalent linking group and more specifically the same structure as that for L1 in Formula (1), and P32 represents a crosslinkable group represented by any of Formulae (P-1) to (P-30).

Hereinafter, specific examples of the repeating unit (3-2) and the molecular weights (Mw) thereof will be described, but the present invention is not limited to these specific examples.

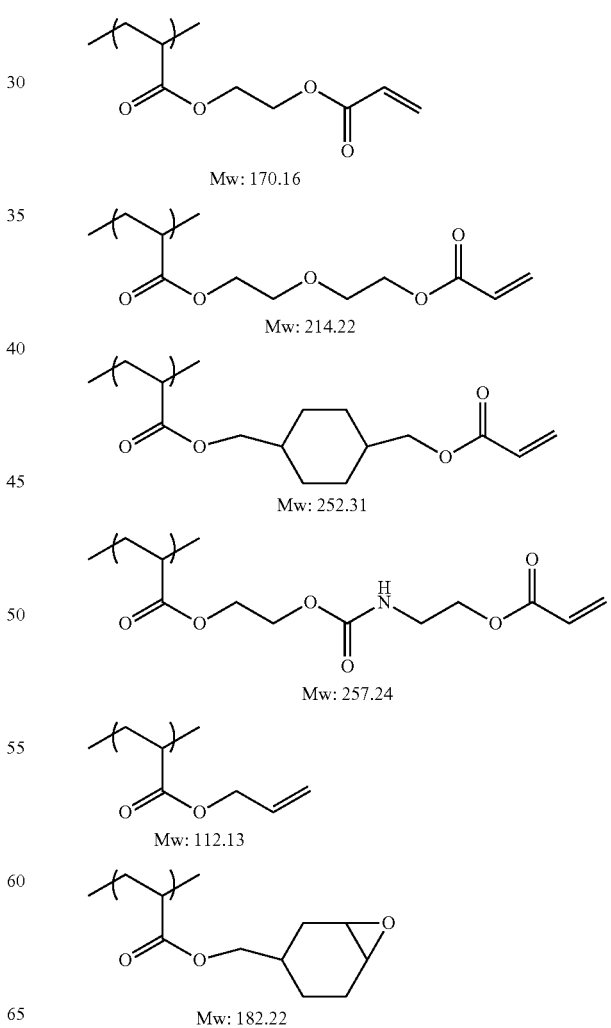

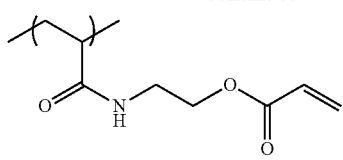
Mw: 169.18

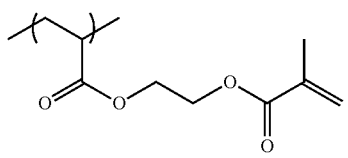
Mw: 184.19

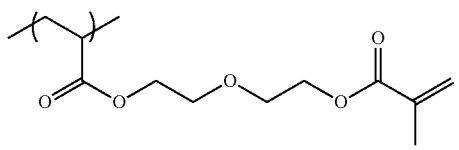
Mw: 228.24

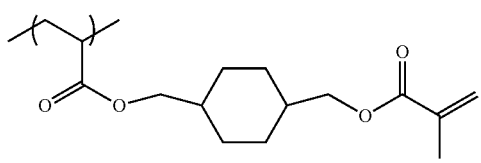
Mw: 226.34

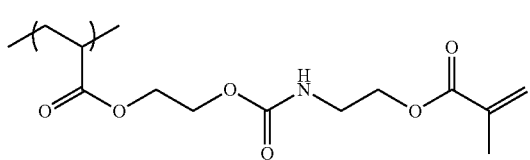
Mw: 271.27

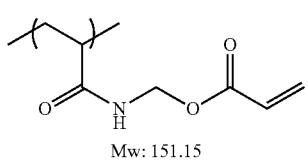
Mw: 151.15

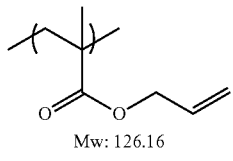
Mw: 126.16

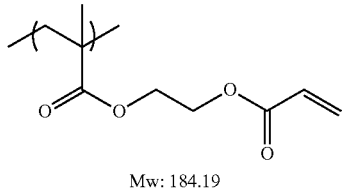
Mw: 184.19

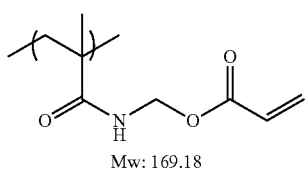
Mw: 169.18

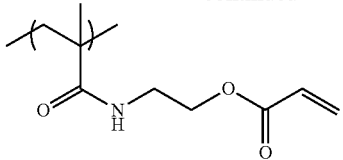
Mw: 183.21

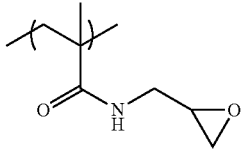
Mw: 142.15

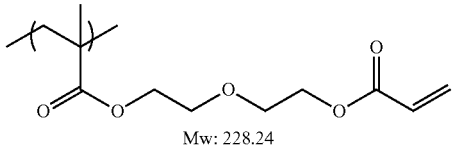
Mw: 228.24

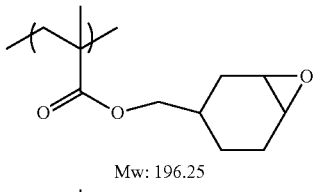
Mw: 196.25

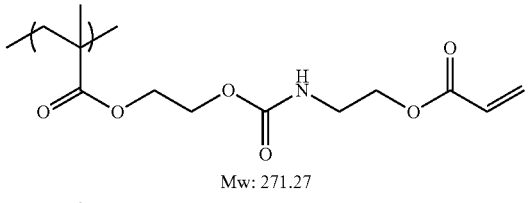
Mw: 271.27

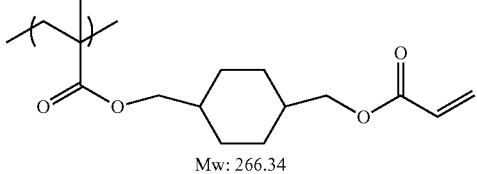
Mw: 266.34

The content of the repeating unit (3) is preferably less than 14% by mass, more preferably 7% by mass or less, and still more preferably 5% by mass or less with respect to all the repeating units (100% by mass) of the polymer liquid crystal compound. The lower limit of the content of the repeating unit (3) is preferably 2% by mass or greater and more preferably 3% by mass or greater with respect to all the repeating units (100% by mass) of the polymer liquid crystal compound. In a case where the content of the repeating unit (3) is less than 14% by mass, the alignment degree of the light absorption anisotropic layer is further improved. In a case where the content of the repeating unit (3) is 2% by mass or greater, the solubility of the polymer liquid crystal compound is further improved.

The polymer liquid crystal compound may have only one or two or more kinds of repeating units (3). In a case where the polymer liquid crystal compound has two or more kinds of repeating units (3), it is preferable that the total amount thereof is in the above-described range.

(Repeating Unit (4))

From the viewpoint of improving the adhesiveness and planar uniformity, the polymer liquid crystal compound may have a repeating unit (4) having a flexible structure with a long molecular chain (SP4 in Formula (4) described below). The reason for this is assumed as follows.

That is, in a case where the polymer liquid crystal compound has such a flexible structure having a long molecular chain, entanglement of the molecular chains constituting the polymer liquid crystal compound is likely to occur, and aggregation destruction of the light absorption anisotropic layer (specifically, destruction of the light absorption anisotropic layer) is suppressed. As a result, the adhesiveness between the light absorption anisotropic layer and the underlayer (for example, the base material or the alignment layer) is assumed to be improved. Further, it is considered that a decrease in planar uniformity occurs due to the low compatibility between the dichroic substance and the polymer liquid crystal compound. That is, it is considered that in a case where the compatibility between the dichroic substance and the polymer liquid crystal compound is not sufficient, a planar defect (alignment defect) having the dichroic substance to be precipitated as a nucleus occurs. Meanwhile, it is assumed that in the case where the polymer liquid crystal compound has such a flexible structure having a long molecular chain, a light absorption anisotropic layer in which precipitation of the dichroic substance is suppressed and the planar uniformity is excellent is obtained. Here, the expression "planar uniformity is excellent" denotes that the alignment defect occurring in a case where the liquid crystal composition containing the polymer liquid crystal compound is repelled on the underlayer (for example, the base material or the alignment layer) is less likely to occur.

The repeating unit (4) is a repeating unit represented by Formula (4).

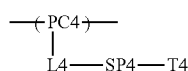

(4)

In Formula (4), PC4 represents the main chain of the repeating unit and more specifically the same structure as that for PC1 in Formula (1), L4 represents a single bond or a divalent linking group and more specifically the same structure as that for L1 in Formula (1) (preferably a single bond), SP4 represents an alkylene group having 10 or more atoms in the main chain, and T4 represents a terminal group and more specifically the same group as that for T1 in Formula (1).

Specific examples and preferred embodiments of PC4 are the same as those for PC1 in Formula (1), and thus description thereof will not be repeated.

From the viewpoint of further exhibiting the effects of the present invention, it is preferable that L4 represents a single bond.

In Formula (4), SP4 represents an alkylene group having 10 or more atoms in the main chain. Here, one or more of $-CH_2-$'s constituting the alkylene group represented by SP4 may be substituted with "SP-C" described above and particularly preferably at least one group selected from the group consisting of $-O-$, $-S-$, $-N(R^{21})-$, $-C(=O)-$, $-C(=S)-$, $-C(R^{22})=C(R^{23})-$, an alkynylene group, $-Si(R^{24})(R^{25})-$, $-N=N-$, $-C(R^{26})=N-N=C(R^{27})-$, $-C(R^{28})=N-$, and $S(=O)_2-$. In addition, $R^{21}$ to $R^{28}$ each independently represent a hydrogen atom, a halogen atom, a cyano group, a nitro group, or a linear or branched alkyl group having 1 to 10 carbon atoms. Further, the hydrogen atoms contained in one or more of $-CH_2-$'s constituting the alkylene group represented by SP4 may be substituted with "SP—H" described above.

The number of atoms in the main chain of SP4 is 10 or greater, and from the viewpoint of obtaining a light absorption anisotropic layer in which at least one of the adhesiveness or the planar uniformity is more excellent, preferably 15 or greater and more preferably 19 or greater. Further, from the viewpoint of obtaining a light absorption anisotropic layer with a more excellent alignment degree, the upper limit of the number of atoms in the main chain of SP2 is preferably 70 or less, more preferably 60 or less, and still more preferably 50 or less.

Here, "main chain" in SP4 indicates a partial structure required for directly linking L4 and T4 to each other, and "number of atoms in the main chain" indicates the number of atoms constituting the partial structure. In other words, "main chain" in SP4 is a partial structure in which the number of atoms linking L4 and T4 to each other is the smallest. For example, the number of atoms in the main chain in a case where SP4 represents a 3,7-dimethyldecanyl group is 10, and the number of atoms in the main chain in a case where SP4 represents a 4,6-dimethyldodecanyl group is 12. Further, in Formula (4-1), the inside of the frame shown by the dotted quadrangle corresponds to SP4, and the number of atoms in the main chain of SP4 (corresponding to the total number of atoms circled by the dotted line) is 11.

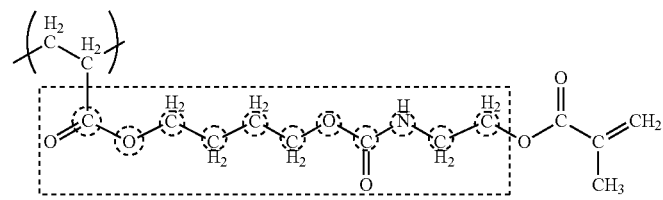

(4-1)

The alkylene group represented by SP4 may be linear or branched.

From the viewpoint of obtaining a light absorption anisotropic layer with a more excellent alignment degree, the number of carbon atoms of the alkylene group represented by SP4 is preferably in a range of 8 to 80, more preferably in a range of 15 to 80, still more preferably in a range of 25 to 70, and particularly preferably in a range of 25 to 60.

From the viewpoint of obtaining a light absorption anisotropic layer with more excellent adhesiveness and planar uniformity, it is preferable that one or more of $-CH_2-$'s constituting the alkylene group represented by SP4 are substituted with "SP-C" described above.

Further, in a case where a plurality of $-CH_2-$'s constituting the alkylene group represented by SP4 are present, it is more preferable that only some of the plurality of $-CH_2-$ 's are substituted with "SP-C" described above from the viewpoint of obtaining a light absorption anisotropic layer with more excellent adhesiveness and planar uniformity.

Among examples of "SP-C", at least one group selected from the group consisting of —O—, —S—, —N($R^{21}$)—, —C(=O)—, —C(=S)—, —C($R^{22}$)=C($R^{23}$)—, an alkynylene group, —Si($R^{24}$)($R^{25}$)—, —N=N—, —C($R^{26}$)=N—N=C($R^{27}$)—, —C($R^{28}$)=N—, and S(=O)$_2$— is preferable, and from the viewpoint of obtaining a light absorption anisotropic layer with more excellent adhesiveness and planar uniformity, at least one group selected from the group consisting of —O—, —N($R^{21}$)—, —C(=O)—, and S(=O)$_2$— is more preferable, and at least one group selected from the group consisting of —O—, —N($R^{21}$)—, and C(=O)— is particularly preferable. In addition, $R^{21}$ to $R^{28}$ each independently represent a hydrogen atom, a halogen atom, a cyano group, a nitro group, or a linear or branched alkyl group having 1 to 10 carbon atoms.

Particularly, it is preferable that SP4 represents a group having at least one selected from the group consisting of an oxyalkylene structure in which one or more of —CH$_2$-'s constituting an alkylene group are substituted with —O—, an ester structure in which one or more of —CH$_2$—CH$_2$-'s constituting an alkylene group are substituted with —O— and C(=O)—, and a urethane bond in which one or more of —CH$_2$—CH$_2$—CH$_2$-'s constituting an alkylene group are substituted with —O—, —C(=O)—, and NH—.

The hydrogen atoms contained in one or more of —CH$_2$-'s constituting the alkylene group represented by SP4 may be substituted with "SP—H" described above. In this case, one or more hydrogen atoms contained in —CH$_2$— may be substituted with "SP—H". That is, only one hydrogen atom contained in —CH$_2$— may be substituted with "SP—H" or all (two) hydrogen atoms contained in —CH$_2$— may be substituted with "SP—H".

As "SP—H", at least one group selected from the group consisting of a halogen atom, a cyano group, a nitro group, a hydroxy group, a linear alkyl group having 1 to 10 carbon atoms, a branched alkyl group having 1 to 10 carbon atoms, and a halogenated alkyl group having 1 to 10 carbon atoms is preferable, and at least one group selected from the group consisting of a hydroxy group, a linear alkyl group having 1 to 10 carbon atoms, and a branched alkyl group having 1 to 10 carbon atoms is more preferable.

As described above, T4 represents the same terminal group as that for T1 and preferably a hydrogen atom, a methyl group, a hydroxy group, a carboxy group, a sulfonic acid group, a phosphoric acid group, a boronic acid group, an amino group, a cyano group, a nitro group, a phenyl group which may have a substituent, or -L-CL (L represents a single bond or a divalent linking group, specific examples of the divalent linking group are the same as those for LW and SPW described above, and CL represents a crosslinkable group, and examples thereof include a group represented by Q1 or Q2, and a crosslinkable group represented by any of Formulae (P-1) to (P-30) is preferable), and it is preferable that CL represents a vinyl group, a butadiene group, a (meth)acryl group, a (meth)acrylamide group, a vinyl acetate group, a fumaric acid ester group, a styryl group, a vinylpyrrolidone group, a maleic acid anhydride, a maleimide group, a vinyl ether group, an epoxy group, or an oxetanyl group.

The epoxy group may be an epoxycycloalkyl group, and the number of carbon atoms of the cycloalkyl group moiety in the epoxycycloalkyl group is preferably in a range of 3 to 15, more preferably in a range of 5 to 12, and still more preferably 6 (that is, in a case where the epoxycycloalkyl group is an epoxycyclohexyl group) from the viewpoint that the effects of the present invention are more excellent.

Examples of the substituent of the oxetanyl group include an alkyl group having 1 to 10 carbon atoms. Among the examples, an alkyl group having 1 to 5 carbon atoms is preferable from the viewpoint that the effects of the present invention are more excellent. The alkyl group as a substituent of the oxetanyl group may be linear or branched, but is preferably linear from the viewpoint that the effects of the present invention are more excellent.

Examples of the substituent of the phenyl group include a boronic acid group, a sulfonic acid group, a vinyl group and an amino group. Among these, from the viewpoint that the effects of the present invention are more excellent, a boronic acid group is preferable.

Specific examples of the repeating unit (4) include the following structures, but the present invention is not limited thereto. Further, in the following specific examples, n1 represents an integer of 2 or greater, and n2 represents an integer of 1 or greater.

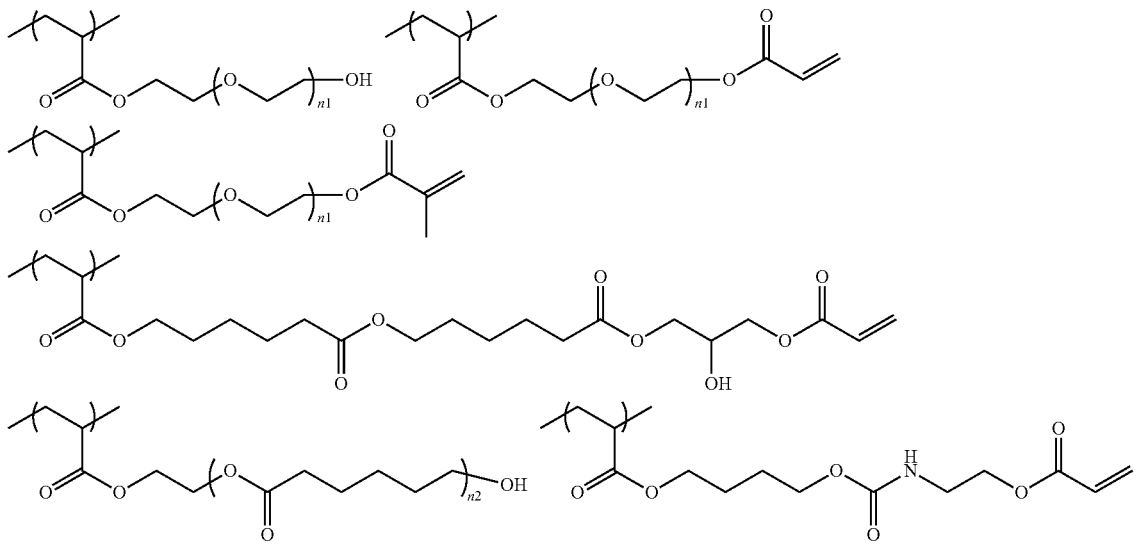

-continued

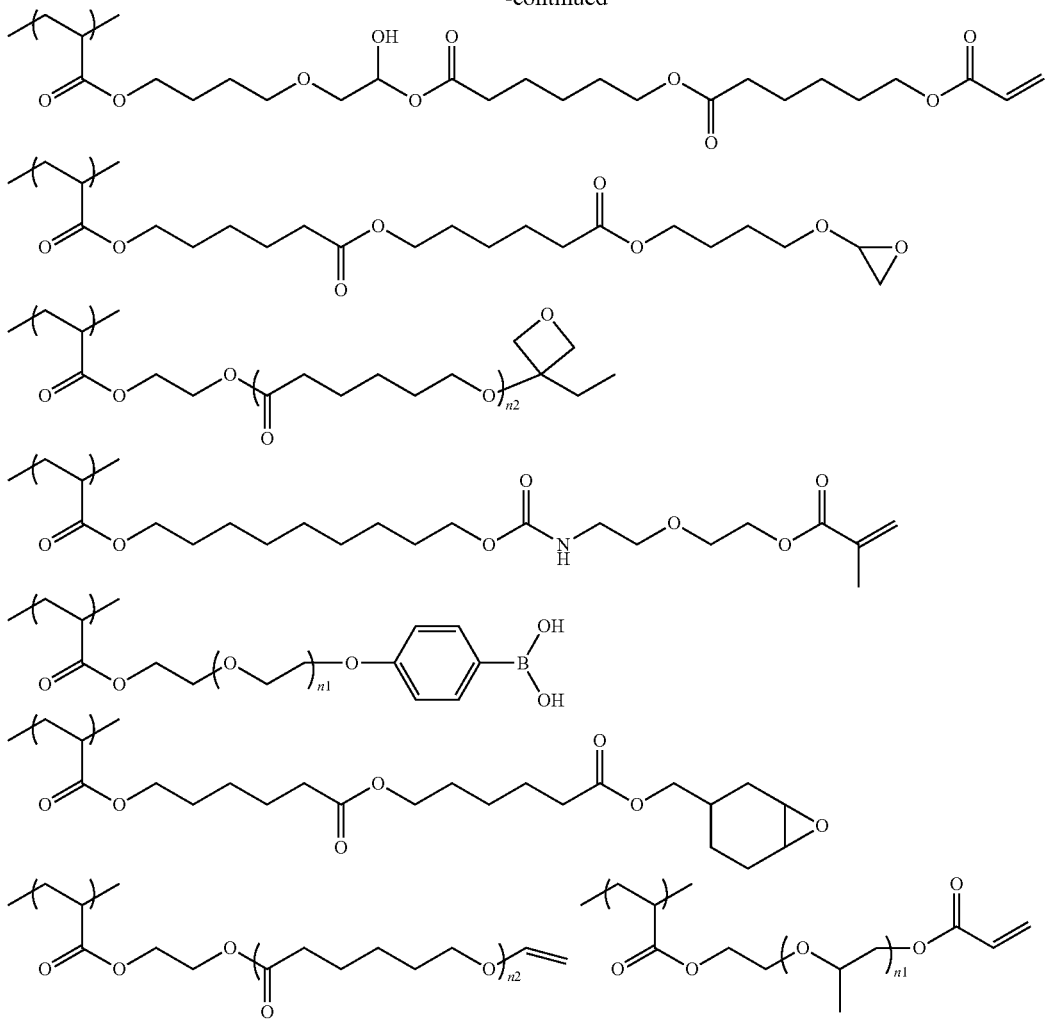

The content of the repeating unit (4) is preferably in a range of 2% to 20% by mass and more preferably in a range of 3% to 18% by mass with respect to all the repeating units (100% by mass) of the polymer liquid crystal compound. In a case where the content of the repeating unit (4) is 2% by mass or greater, a light absorption anisotropic layer having more excellent adhesiveness can be obtained. Further, in a case where the content of the repeating unit (4) is 20% by mass or less, a light absorption anisotropic layer having more excellent planar uniformity can be obtained.

The polymer liquid crystal compound may have only one or two or more kinds of repeating units (4). In a case where the polymer liquid crystal compound has two or more kinds of repeating units (4), the content of the repeating unit (4) indicates the total content of the repeating units (4).

(Repeating Unit (5))

From the viewpoint of the planar uniformity, the polymer liquid crystal compound may have a repeating unit (5) to be introduced by polymerizing a polyfunctional monomer. Particularly in order to improve the planar uniformity while suppressing a decrease in the alignment degree, it is preferable that the polymer liquid crystal compound has 10% by mass or less of the repeating unit (5) to be introduced by polymerizing a polyfunctional monomer. As described above, the reason why the planar uniformity can be improved while a decrease in the alignment degree is suppressed by allowing the polymer liquid crystal compound to have 10% by mass or less of the repeating unit (5) is assumed as follows.

The repeating unit (5) is a unit to be introduced to the polymer liquid crystal compound by polymerizing a polyfunctional monomer. Therefore, it is considered that the polymer liquid crystal compound contains a high-molecular-weight body in which a three-dimensional crosslinked structure is formed by the repeating unit (5). Here, since the content of the repeating unit (5) is small, the content of the high-molecular-weight body having the repeating unit (5) is considered to be small.

It is assumed that a light absorption anisotropic layer in which cissing of the liquid crystal composition is suppressed and the planar uniformity is excellent is obtained due to the presence of a small amount of the high-molecular-weight body with the three-dimensional crosslinked structure that has been formed as described above.

Further, it is assumed that the effect of suppressing a decrease in the alignment degree can be maintained because the content of the high-molecular-weight body is small.

It is preferable that the repeating unit (5) to be introduced by polymerizing a polyfunctional monomer is a repeating unit represented by Formula (5).

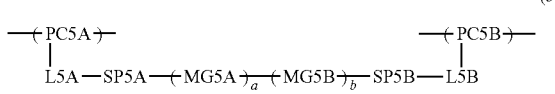

(5)

In Formula (5), PC5A and PC5B represent the main chain of the repeating unit and more specifically the same structure as that for PC1 in Formula (1), L5A and L5B represent a single bond or a divalent linking group and more specifically the same structure as that for L1 in Formula (1), SP5A and SP5B represent a spacer group and more specifically the same structure as that for SP1 in Formula (1), MG5A and MG5B represent a mesogen structure and more specifically the same structure as that for the mesogen group MG in Formula (LC), and a and b represent an integer of 0 or 1.

PC5A and PC5B may represent the same group or different groups, but it is preferable that PC5A and PC5B represent the same group from the viewpoint of further improving the alignment degree of the light absorption anisotropic layer.

L5A and L5B may represent a single bond, the same group, or different groups, but L5A and L5B represent preferably a single bond or the same group and more preferably the same group from the viewpoint of further improving the alignment degree of the light absorption anisotropic layer.

SP5A and SP5B may represent a single bond, the same group, or different groups, but SP5A and SP5B represent preferably a single bond or the same group and more preferably the same group from the viewpoint of further improving the alignment degree of the light absorption anisotropic layer.

Here, the same group in Formula (5) indicates that the chemical structures are the same as each other regardless of the orientation in which each group is bonded. For example, even in a case where SP5A represents *—$CH_2$—$CH_2$—O—** (* represents a bonding position with respect to L5A, and ** represents a bonding position with respect to MG5A) and SP5B represents *—O—$CH_2$—$CH_2$—** (* represents a bonding position with respect to MG5B, and ** represents a bonding position with respect to L5B), SP5A and SP5B represent the same group.

From the viewpoint of further improving the alignment degree of the light absorption anisotropic layer, a and b each independently represent an integer of 0 or 1 and preferably 1.

a and b may be the same as or different from each other, but from the viewpoint of further improving the alignment degree of the light absorption anisotropic layer, it is preferable that both a and b represent 1.

From the viewpoint of further improving the alignment degree of the light absorption anisotropic layer, the sum of a and b is preferably 1 or 2 (that is, the repeating unit represented by Formula (5) contains a mesogen group) and more preferably 2.

From the viewpoint of further improving the alignment degree of the light absorption anisotropic layer, it is preferable that the partial structure represented by -(MG5A)$_a$-(MG5B)$_b$— has a cyclic structure. In this case, from the viewpoint of further improving the alignment degree of the light absorption anisotropic layer, the number of cyclic structures in the partial structure represented by -(MG5A2)$_a$-(MG5B)$_b$— is preferably 2 or greater, more preferably in a range of 2 to 8, still more preferably in a range of 2 to 6, and particularly preferably in a range of 2 to 4.

From the viewpoint of further improving the alignment degree of the light absorption anisotropic layer, the mesogen groups represented by MG5A and MG5B each independently have preferably one or more cyclic structures, more preferably 2 to 4 cyclic structures, still more preferably 2 or 3 cyclic structures, and particularly preferably 2 cyclic structures.

Specific examples of the cyclic structure include an aromatic hydrocarbon group, a heterocyclic group, and an alicyclic group. Among these, an aromatic hydrocarbon group and an alicyclic group are preferable.

MG5A and MG5B may represent the same group or different groups, but from the viewpoint of further improving the alignment degree of the light absorption anisotropic layer, it is preferable that MG5A and MG5B represent the same group.

From the viewpoints of exhibiting the liquid crystallinity, adjusting the liquid crystal phase transition temperature, and the availability of raw materials and synthetic suitability and from the viewpoint that the effects of the present invention are more excellent, it is preferable that the mesogen group represented by MG5A and MG5B is the mesogen group MG in Formula (LC).

Particularly in the repeating unit (5), it is preferable that PC5A and PC5B represent the same group, both L5A and L5B represent a single bond or the same group, both SP5A and SP5B represent a single bond or the same group, and MG5A and MG5B represent the same group. In this manner, the alignment degree of the light absorption anisotropic layer is further improved.

The content of the repeating unit (5) is preferably 10% by mass or less, more preferably in a range of 0.001% to 5% by mass, and still more preferably in a range of 0.05% to 3% by mass with respect to the content (100% by mass) of all the repeating units of the polymer liquid crystal compound.

The polymer liquid crystal compound may have only one or two or more kinds of repeating units (5). In a case where the polymer liquid crystal compound has two or more kinds of repeating units (5), it is preferable that the total amount thereof is in the above-described range.

(Star-Shaped Polymer)

The polymer liquid crystal compound may be a star-shaped polymer. The star-shaped polymer in the present invention indicates a polymer having three or more polymer chains extending from the nucleus and is specifically represented by Formula (6).

The star-shaped polymer represented by Formula (6) as the polymer liquid crystal compound can form a light absorption anisotropic layer having a high alignment degree while having high solubility (excellent solubility in a solvent).

(6)

In Formula (6), $n_A$ represents an integer of 3 or greater and preferably an integer of 4 or greater. The upper limit of $n_A$ is not limited thereto, but is commonly 12 or less and preferably 6 or less.

A plurality of PI's each independently represent a polymer chain having any of repeating units represented by Formulae (1), (21), (22), (3), (4), and (5). Here, at least one of the plurality of PI's represents a polymer chain having a repeating unit represented by Formula (1).

A represents an atomic group that is the nucleus of the star-shaped polymer. Specific examples of A include structures obtained by removing hydrogen atoms from thiol groups of the polyfunctional thiol compound, described in paragraphs [0052] to [0058] of JP2011-074280A, paragraphs [0017] to [0021] of JP2012-189847A, paragraphs [0012] to [0024] of JP2013-031986A, and paragraphs [0118] to [0142] of JP2014-104631A. In this case, A and PI are bonded to each other through a sulfide bond.

The number of thiol groups of the polyfunctional thiol compound from which A is derived is preferably 3 or greater and more preferably 4 or greater. The upper limit of the number of thiol groups of the polyfunctional thiol compound is commonly 12 or less and preferably 6 or less.

Specific examples of the polyfunctional thiol compound are shown below.

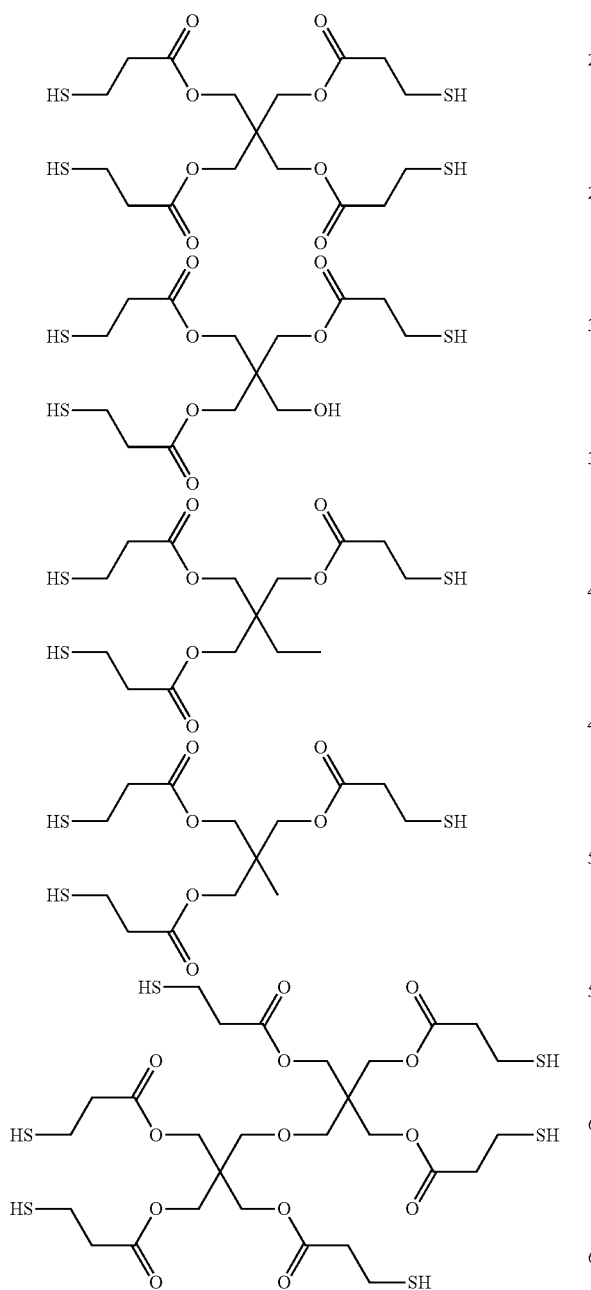
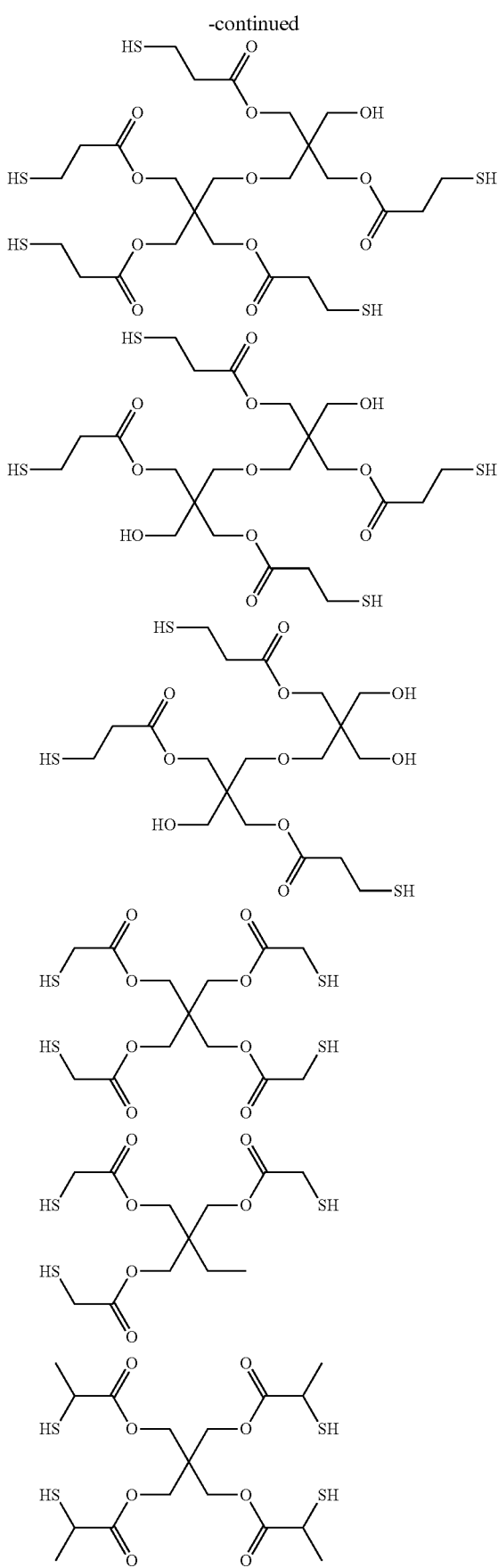

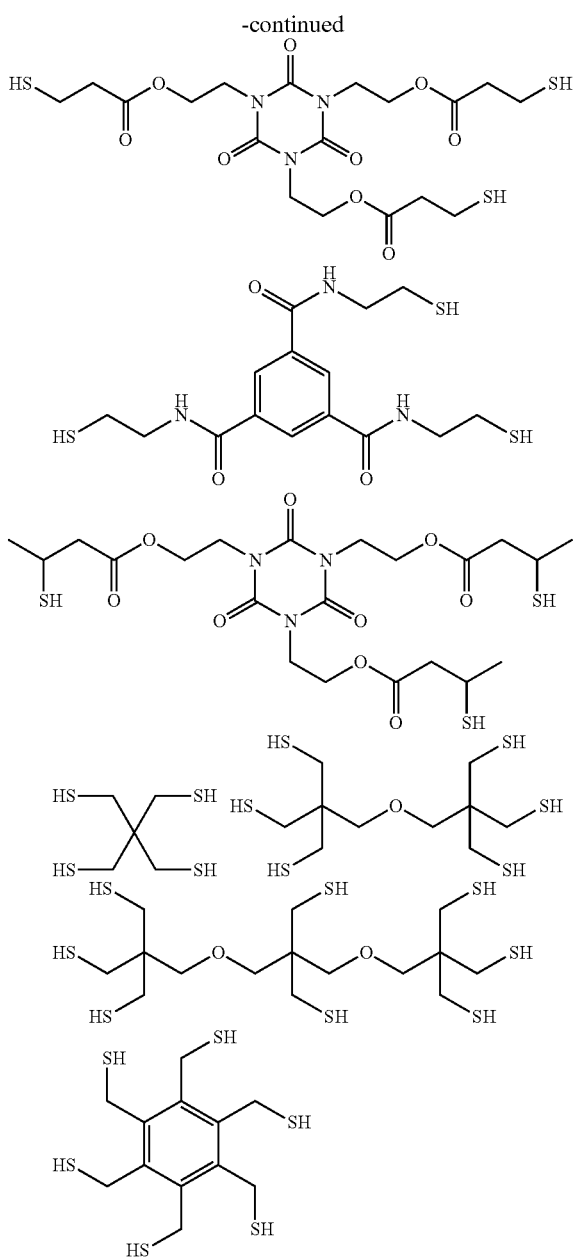

From the viewpoint of further improving the alignment degree, the polymer liquid crystal compound may be a thermotropic liquid crystal and a crystalline polymer.

(Crystalline Polymer)

The polymer liquid crystal compound may be a crystalline polymer.

A crystalline polymer is a polymer showing a transition to a crystal phase due to a change in temperature. The crystalline polymer may show a glass transition other than the transition to the crystal phase.

From the viewpoint that the alignment degree of the light absorption anisotropic layer is further increased and haze is unlikely to be observed, it is preferable that the crystalline polymer is a polymer liquid crystal compound that has a transition from a crystal phase to a liquid crystal phase in a case of being heated (glass transition may occur in the middle of the transition) or a polymer liquid crystal compound that has a transition to a crystal phase in a case where the temperature is lowered after entering a liquid crystal state by being heated (glass transition may occur in the middle of the transition).

The presence or absence of crystallinity of the polymer liquid crystal compound is evaluated as follows.

Two light absorption anisotropic layers of an optical microscope (ECLIPSE E600 POL, manufactured by Nikon Corporation) are disposed so as to be orthogonal to each other, and a sample table is set between the two light absorption anisotropic layers. Further, a small amount of the polymer liquid crystal compound is placed on slide glass, and the slide glass is set on a hot stage placed on the sample table. While the state of the sample is observed, the temperature of the hot stage is increased to a temperature at which the polymer liquid crystal compound exhibits liquid crystallinity, and the polymer liquid crystal compound is allowed to enter a liquid crystal state. After the polymer liquid crystal compound enters the liquid crystal state, the behavior of the liquid crystal phase transition is observed while the temperature of the hot stage is gradually lowered, and the temperature of the liquid crystal phase transition is recorded. In a case where the polymer liquid crystal compound exhibits a plurality of liquid crystal phases (for example, a nematic phase and a smectic phase), all the transition temperatures are also recorded.

Next, approximately 5 mg of a sample of the polymer liquid crystal compound is put into an aluminum pan, and the pan is covered and set on a differential scanning calorimeter (DSC) (an empty aluminum pan is used as a reference). The polymer liquid crystal compound measured in the above-described manner is heated to a temperature at which the compound exhibits a liquid crystal phase, and the temperature is maintained for 1 minute. Thereafter, the calorific value is measured while the temperature is lowered at a rate of 10° C./min. An exothermic peak is confirmed from the obtained calorific value spectrum.

As a result, in a case where an exothermic peak is observed at a temperature other than the liquid crystal phase transition temperature, it can be said that the exothermic peak is a peak due to crystallization and the polymer liquid crystal compound has crystallinity.

Meanwhile, in a case where an exothermic peak is not observed at a temperature other than the liquid crystal phase transition temperature, it can be said that the polymer liquid crystal compound does not have crystallinity.

The method of obtaining a crystalline polymer is not particularly limited, but as a specific example, a method of using a polymer liquid crystal compound having the repeating unit (1) described above is preferable, and a method of using a suitable form among polymer liquid crystal compounds having the repeating unit (1) described above is more preferable.

—Crystallization Temperature—

From the viewpoint that the alignment degree of the light absorption anisotropic layer is further increased and haze is unlikely to be observed, the crystallization temperature of the polymer liquid crystal compound is preferably −50° C. or higher and lower than 150° C., more preferably 120° C. or lower, still more preferably −20° C. or higher and lower than 120° C., and particularly preferably 95° C. or lower. The crystallization temperature of the polymer liquid crystal compound is preferably lower than 150° C. from the viewpoint of reducing haze.

Further, the crystallization temperature is a temperature of an exothermic peak due to crystallization in the above-described DSC.

(Molecular Weight)

From the viewpoint that the effects of the present invention are more excellent, the weight-average molecular weight (Mw) of the polymer liquid crystal compound is preferably in a range of 1000 to 500000 and more preferably in a range of 2000 to 300000. In a case where the Mw of the polymer liquid crystal compound is in the above-described range, the polymer liquid crystal compound is easily handled.

In particular, from the viewpoint of suppressing cracking during the coating, the weight-average molecular weight (Mw) of the polymer liquid crystal compound is preferably 10000 or greater and more preferably in a range of 10000 to 300000.

In addition, from the viewpoint of the temperature latitude of the alignment degree, the weight-average molecular weight (Mw) of the polymer liquid crystal compound is preferably less than 10000 and more preferably 2000 or greater and less than 10000.

Here, the weight-average molecular weight and the number average molecular weight in the present invention are values measured by the gel permeation chromatography (GPC) method.

Solvent (eluent): N-methylpyrrolidone
Device name: TOSOH HLC-8220GPC
Column: Connect and use three of TOSOH TSKgel Super AWM-H (6 mm×15 cm)
Column temperature: 25° C.
Sample concentration: 0.1% by mass
Flow rate: 0.35 mL/min
    Calibration curve: TSK standard polystyrene (manufactured by TOSOH Corporation), calibration curves of 7 samples with Mw of 2800000 to 1050 (Mw/Mn=1.03 to 1.06) are used.

The polymer liquid crystal compound may exhibit any of a nematic phase or a smectic phase, but it is preferable that the polymer liquid crystal compound exhibits at least a nematic phase.

The temperature at which the nematic phase is exhibited is preferably in a range of 0° to 450° C. and more preferably in a range of 30° C. to 400° C. from the viewpoints of the handleability and the manufacturing suitability.

(Content)

From the viewpoint that the effects of the present invention are more excellent, the content of the thermotropic liquid crystal compound (preferably the rod-like liquid crystal compound) is preferably in a range of 10% to 97% by mass, more preferably in a range of 40% to 95% by mass, and still more preferably in a range of 50% to 95% by mass with respect to the total solid content (100% by mass) of the liquid crystal composition.

In a case where the thermotropic liquid crystal compound (preferably the rod-like liquid crystal compound) includes a polymer liquid crystal compound, the content of the polymer liquid crystal compound is preferably in a range of 10% to 99% by mass, more preferably in a range of 30% to 95% by mass, and still more preferably in a range of 50% to 90% by mass with respect to the total mass (100% by mass) of the thermotropic liquid crystal compound (preferably the rod-like liquid crystal compound).

In a case where the thermotropic liquid crystal compound (preferably the rod-like liquid crystal compound) includes a low-molecular-weight liquid crystal compound, the content of the low-molecular-weight liquid crystal compound is preferably in a range of 1% to 90% by mass, more preferably in a range of 5% to 70% by mass, and still more preferably in a range of 10% to 60% by mass with respect to the total mass (100% by mass) of the thermotropic liquid crystal compound (preferably the rod-like liquid crystal compound).

In a case where the thermotropic liquid crystal compound (preferably the rod-like liquid crystal compound) includes both a polymer liquid crystal compound and a low-molecular-weight liquid crystal compound, from the viewpoint that the effects of the present invention are more excellent, the mass ratio (low-molecular-weight liquid crystal compound/polymer liquid crystal compound) of the content of the low-molecular-weight liquid crystal compound is preferably in a range of 5/95 to 70/30 and more preferably in a range of 10/90 to 50/50 with respect to the content of the polymer liquid crystal compound.

Here, "solid content in the liquid crystal composition" denotes a component obtained by removing a solvent, and specific examples of the solid content include the rod-like liquid crystal compound, and a dichroic substance, a polymerization initiator, an interface improver described below.

<Dichroic Substance>

The liquid crystal composition of the present invention contains a dichroic substance.

In the present invention, the dichroic substance indicates a coloring agent having different absorbances depending on the direction. The dichroic substance may or may not exhibit liquid crystallinity.

The dichroic substance is not particularly limited, and examples thereof include a visible light absorbing material (dichroic coloring agent), a light emitting material (such as a fluorescent material or a phosphorescent material), an ultraviolet absorbing material, an infrared absorbing material, a non-linear optical material, a carbon nanotube, and an inorganic material (for example, a quantum rod). Further, known dichroic substances (dichroic coloring agents) of the related art can be used.

Specific examples thereof include those described in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-14883A, paragraphs [0012] to [0029] of JP2013-109090A, paragraphs [0009] to [0017] of JP2013-101328A, paragraphs [0051] to [0065] of JP2013-37353A, paragraphs [0049] to [0073] of JP2012-63387A, paragraphs [0016] to [0018] of JP1999-305036A (JP-H11-305036A), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0005] to [0051] of JP2016-006502A, paragraphs [0014] to [0032] of JP2018-053167A, paragraphs [0014] to [0033] of JP2020-11716A, paragraphs [0005] to [0041] of WO2016/060173A, paragraphs [0008] to [0062] of WO2016/136561A, paragraphs [0014] to [0033] of WO2017/154835A, paragraphs [0014] to [0033] of WO2017/154695A, paragraphs [0013] to [0037] of WO2017/195833A, paragraphs [0014] to [0034] of WO2018/164252A, paragraphs [0021] to [0030] of WO2018/186503A, and paragraphs [0043] to [0063] of WO2019/189345A.

In the present invention, two or more kinds of dichroic substances may be used in combination. For example, from the viewpoint of making the color of the light absorption anisotropic layer to be formed closer to black, it is preferable that at least one dichroic substance having a maximal absorption wavelength in a wavelength range of 370 to 550 nm and at least one dichroic substance having a maximal absorption wavelength in a wavelength range of 500 to 700 nm are used in combination.

The content of the dichroic substance is 10.0% by mass or greater and preferably 15.0% by mass or greater with respect to the total solid content (100.0% by mass) of the liquid crystal composition. Further, from the viewpoint that the effects of the present invention are more excellent, the content of the dichroic substance is preferably in a range of 10% to 70% by mass, more preferably in a range of 13.0 to 60.0% by mass, still more preferably in a range of 15.0% to 50.0% by mass, particularly preferably in a range of 15.0% to 30.0% by mass, and most preferably in a range of 15.0% to 20.0% by mass with respect to the total solid content of the liquid crystal composition. Further, in a case where a plurality of dichroic substances are used in combination, it is preferable that the total amount of the plurality of dichroic substances is in the above-described ranges.

<Solvent>

From the viewpoint of workability and the like, it is preferable that the liquid crystal composition according to the embodiment of the present invention contains a solvent.

Examples of the solvent include organic solvents such as ketones (such as acetone, 2-butanone, methyl isobutyl ketone, cyclopentanone, and cyclohexanone), ethers (such as dioxane, tetrahydrofuran, tetrahydropyran, dioxolane, tetrahydrofurfuryl alcohol, and cyclopentyl methyl ether), aliphatic hydrocarbons (such as hexane), alicyclic hydrocarbons (such as cyclohexane), aromatic hydrocarbons (such as benzene, toluene, xylene, and trimethylbenzene), halogenated carbons (such as dichloromethane, trichloromethane (chloroform), dichloroethane, dichlorobenzene, and chlorotoluene), esters (such as methyl acetate, ethyl acetate, butyl acetate, and diethyl carbonate), alcohols (such as ethanol, isopropanol, butanol, and cyclohexanol), cellosolves (such as methyl cellosolve, ethyl cellosolve, and 1,2-dimethoxyethane), cellosolve acetates, sulfoxides (such as dimethyl sulfoxide), amides (such as dimethylformamide, dimethylacetamide, N-methylpyrrolidone, N-ethylpyrrolidone, and 1,3-dimethyl-2-imidazolidinone), and heterocyclic compounds (such as pyridine), and water.

These solvents may be used alone or in combination of two or more kinds thereof.

Among these solvents, from the viewpoint of further increasing the alignment degree of the light absorption anisotropic layer to be formed and further improving the heat resistance, it is preferable to use an organic solvent and more preferable to use halogenated carbons, ethers, or ketones.

In a case where the liquid crystal composition contains a solvent, the content of the solvent is preferably in a range of 60% to 99.5% by mass, more preferably in a range of 70% to 99% by mass, and particularly preferably in a range of 75% to 98% by mass with respect to the total mass (100% by mass) of the liquid crystal composition from the viewpoint of further increasing the alignment degree of the light absorption anisotropic layer to be formed and further improving the heat resistance.

<Polymerization Initiator>

The liquid crystal composition according to the embodiment of the present invention may contain a polymerization initiator. The polymerization initiator is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (U.S. Pat. Nos. 2,367,661A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951,758A), a combination of a triarylimidazole dimer and a p-aminophenyl ketone (U.S. Pat. No. 3,549,367A), acridine and phenazine compounds (JP1985-105667A (JP-S60-105667A) and U.S. Pat. No. 4,239,850A), oxadiazole compounds (U.S. Pat. No. 4,212,970A), o-acyloxime compounds (paragraph [0065] of JP2016-027384A), and acylphosphine oxide compounds (JP1988-040799B (JP-S63-040799B), JP1993-029234B (JP-H5-029234B), JP1998-095788A (JP-H10-095788A), and JP1998-029997A (JP-H10-029997A)).

Commercially available products can also be used as such a photopolymerization initiator, and examples thereof include IRGACURE 184, IRGACURE 907, IRGACURE 369, IRGACURE 651, IRGACURE 819, IRGACURE OXE-01, and IRGACURE OXE-02 (all manufactured by BASF SE).

In a case where the liquid crystal composition contains a polymerization initiator, from the viewpoint of further increasing the alignment degree of the light absorption anisotropic layer to be formed and further improving the heat resistance, the content of the polymerization initiator is preferably in a range of 0.01% to 30% by mass and more preferably in a range of 0.1% to 15% by mass with respect to the total solid content (100% by mass) of the liquid crystal composition.

Polymerizable Compound

The liquid crystal composition of the present invention may contain a polymerizable compound. Examples of the polymerizable compound include a compound containing an acrylate (such as a (meth)acrylate monomer). In a case where the liquid crystal composition of the present invention contains a polymerizable compound, from the viewpoint that the effects of the present invention are more excellent, the content of the polymerizable compound is preferably in a range of 0.5% to 50% by mass and more preferably in a range of 1.0% to 40% by mass with respect to the total solid content (100% by mass) of the liquid crystal composition.

The liquid crystal composition of the present invention may contain other additives. Examples of the additives include an alignment agent that assists the alignment of the liquid crystal composition, and specific examples thereof include a boronic acid compound and an onium salt.

As the boronic acid compound, a compound represented by Formula (30) is preferable.

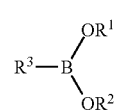

Formula (30)

In Formula (30), $R^1$ and $R^2$ each independently represent a hydrogen atom, a substituted or unsubstituted aliphatic hydrocarbon group, a substituted or unsubstituted aryl group, or a substituted or unsubstituted heterocyclic group.

$R^3$ represents a substituent containing a (meth)acryl group.

Specific examples of the boronic acid compound include a boronic acid compound represented by General Formula (I) described in paragraphs [0023] to [0032] of JP2008-225281A.

As the boronic acid compound, compounds shown below are also preferable.

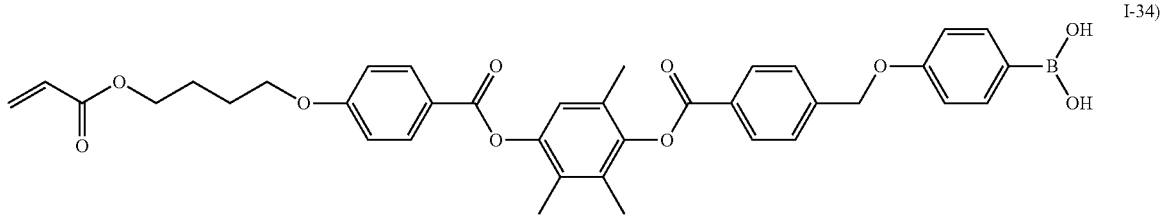

I-34)

I-35)

I-36)

As the onium salt, a compound represented by Formula (31) is preferable.

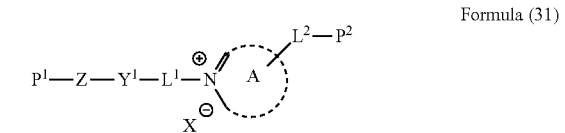

Formula (31)

In Formula (31), the ring A represents a quaternary ammonium ion consisting of a nitrogen-containing heterocyclic ring. X represents an anion. $L^1$ represents a divalent linking group. Further, $L^2$ represents a single bond or a divalent linking group. $Y^1$ represents a divalent linking group having a 5- or 6-membered ring as a partial structure. Further, Z represents a divalent linking group containing an alkylene group having 2 to 20 carbon atoms as a partial structure. Further, $P^1$ and $P^2$ each independently represent a monovalent substituent having a polymerizable ethylenically unsaturated bond.

Specific examples of the onium salt include the onium salts described in paragraphs [0052] to [0058] of JP2012-208397A, the onium salts described in paragraphs [0024] to [0055] of JP2008-026730A, and the onium salts described in JP2002-037777A.

The content of the alignment agent in the liquid crystal composition is preferably in a range of 0.1% to 40% by mass and more preferably in a range of 0.3% to 20% by mass with respect to the total solid content (100% by mass) of the liquid crystal composition. The alignment agent may be used alone or in combination of two or more kinds thereof. In a case where two or more kinds of alignment agents are used, it is preferable that the total amount thereof is in the above-described ranges.

[Transparent Base Film]

The optical film of the present invention may include a transparent base film.

It is preferable that the transparent base film is disposed on a surface of the light absorption anisotropic layer opposite to the surface on which the protective layer is provided.

As the transparent base film, known transparent resin films, transparent resin plates, transparent resin sheets, and the like can be used without particular limitation. Examples of the transparent resin film include a cellulose acylate film (such as a cellulose triacetate film (refractive index of 1.48), a cellulose diacetate film, a cellulose acetate butyrate film, or a cellulose acetate propionate film), a polyethylene terephthalate film, a polyether sulfone film, a polyacrylic resin film, a polyurethane-based resin film, a polyester film, a polycarbonate film, a polysulfone film, a polyether film, a polymethylpentene film, a polyether ketone film, and a (meth)acrylonitrile film.

Among these, a cellulose acylate film which is highly transparent, has a small optical birefringence, is easily produced, and is typically used as a protective film of a polarizing plate is preferable, and a cellulose triacetate film is particularly preferable.

The thickness of the transparent base film is typically in a range of 20 to 100 μm.

In the present invention, it is particularly preferable that the transparent base film is a cellulose ester-based film having a film thickness 20 to 70 μm.

[Alignment Layer]

The optical film according to the embodiment of the present invention may include an alignment layer. It is preferable that the alignment layer is disposed adjacent to the light absorption anisotropic layer. It is also preferable that the alignment layer is provided between the transparent base film and the light absorption anisotropic layer.

The alignment layer may be any layer as long as the thermotropic liquid crystal compound (preferably the rod-like liquid crystal compound) and the dichroic substance contained in the liquid crystal composition of the present invention can be set to be in a desired alignment state on the alignment layer.

An alignment layer can be provided by means of a rubbing treatment performed on a film surface of an organic compound (preferably a polymer such as polyvinyl alcohol or polyimide), oblique vapor deposition of an inorganic compound, formation of a layer having microgrooves, or accumulation of an organic compound (such as o-tricosanoic acid, dioctadecylmethylammonium chloride, or methyl stearylate) using a Langmuir-Blodgett method (LB film). Further, an alignment layer in which an alignment function is generated by application of an electric field, application of a magnetic field, or irradiation with light is also known. Among examples of the alignment layer, in the present invention, an alignment layer formed by performing a rubbing treatment is preferable from the viewpoint of easily controlling the pretilt angle of the alignment film, and a photo-alignment layer formed by irradiation with light is also preferable from the viewpoint of the uniformity of alignment. The alignment axis can be inclined by irradiating a photo-alignment layer containing an azo compound or a cinnamoyl compound with UV rays in an oblique direction, and as a result, the transmittance central axis can be inclined with respect to the normal direction of the film.

Further, the alignment layer may function as a barrier layer described below.

The alignment layer may be formed of two or more layers, and one or more layers in the alignment layer consisting of two or more layers may be liquid crystal layers for alignment which contain a liquid crystal compound.

The thickness of the light absorption anisotropic layer is not particularly limited, but is preferably in a range of 100 to 8000 nm and more preferably in a range of 300 to 5000 nm from the viewpoint of reducing the size and the weight.

[Method of Forming Light Absorption Anisotropic Layer]

A method of forming the light absorption anisotropic layer is not particularly limited, and examples thereof include a method of sequentially performing a step of applying a composition for forming a light absorption anisotropic layer to form a coating film (hereinafter, also referred to as "coating film forming step") and a step of aligning the liquid crystal component and the dichroic substance contained in the coating film (hereinafter, also referred to as "aligning step").

Further, the liquid crystal component is a component that also contains a dichroic substance having liquid crystallinity in a case where the above-described dichroic substance has liquid crystallinity, in addition to the above-described thermotropic liquid crystal compound.

[Coating Film Forming Step]

The coating film forming step is a step of applying a composition for forming a light absorption anisotropic layer to form a coating film.

The composition for forming a light absorption anisotropic layer can be easily applied by using the composition for forming a light absorption anisotropic layer which contains the above-described solvent or using a liquid such as a melt obtained by heating the composition for forming a light absorption anisotropic layer.

Specific examples of the method of applying the composition for forming a light absorption anisotropic layer include known methods such as a roll coating method, a gravure printing method, a spin coating method, a wire bar coating method, an extrusion coating method, a direct gravure coating method, a reverse gravure coating method, a die coating method, a spraying method, and an ink jet method.

[Aligning Step]

The aligning step is a step of aligning the liquid crystal component contained in the coating film. In this manner, a light absorption anisotropic layer is obtained.

The aligning step may include a drying treatment. Components such as a solvent can be removed from the coating film by performing the drying treatment. The drying treatment may be performed by a method of allowing the coating film to stand at room temperature for a predetermined time (for example, natural drying) or a method of heating the coating film and/or blowing air to the coating film.

Here, the liquid crystal components contained in the composition for forming a light absorption anisotropic layer may be aligned by the coating film forming step or the drying treatment described above. For example, in an embodiment in which the composition for forming a light absorption anisotropic layer is prepared as a coating solution containing a solvent, a coating film having light absorption anisotropy (that is, a light absorption anisotropic layer) is obtained by drying the coating film and removing the solvent from the coating film.

In a case where the drying treatment is performed at a temperature higher than or equal to the transition temperature of the liquid crystal component contained in the coating film to the liquid crystal phase, the heat treatment described below may not be performed.

The transition temperature of the liquid crystal component contained in the coating film to the liquid crystal phase is preferably in a range of 10° C. to 250° C. and more preferably in a range of 25° C. to 190° C. from the viewpoint of the manufacturing suitability or the like. It is preferable that the transition temperature is 10° C. or higher from the viewpoint that a cooling treatment or the like for lowering the temperature to a temperature range in which a liquid crystal phase is exhibited is not necessary. Further, it is preferable that the transition temperature is 250° C. or lower from the viewpoint that a high temperature is not required even in a case of setting an isotropic liquid state at a temperature higher than the temperature range in which a liquid crystal phase is temporarily exhibited, and waste of thermal energy and deformation and deterioration of a substrate can be reduced.

It is preferable that the aligning step includes a heat treatment. In this manner, since the liquid crystal component contained in the coating film can be aligned, the coating film after being subjected to the heat treatment can be suitably used as the light absorption anisotropic film.

From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the liquid crystal components contained in the coating film can be fixed. The cooling means is not particularly limited and can be performed according to a known method.

The light absorption anisotropic layer can be obtained by performing the above-described steps.

In the present embodiment, examples of the method of aligning the liquid crystal components contained in the coating film include a drying treatment and a heat treatment, but the method is not limited thereto, and the liquid crystal components can be aligned by a known alignment treatment.

[Other Steps]

The method of forming the light absorption anisotropic layer may include a step of curing the light absorption anisotropic layer after the aligning step (hereinafter, also referred to as a "curing step").

The curing step is performed by heating the light absorption anisotropic layer and/or irradiating the layer with light (exposing the layer to light), for example, in a case where the light absorption anisotropic layer contains a crosslinkable group (polymerizable group). Between these, it is preferable that the curing step is performed by irradiating the layer with light.

Various light sources such as infrared rays, visible light, and ultraviolet rays can be used as the light source for curing, but ultraviolet rays are preferable. In addition, ultraviolet rays may be applied while the layer is heated during curing, or ultraviolet rays may be applied through a filter that transmits only a specific wavelength.

In a case where the exposure is performed while the layer is heated, the heating temperature during the exposure depends on the transition temperature of the liquid crystal component contained in the light absorption anisotropic layer to a liquid crystal phase, but is preferably in a range of 25° to 140° C.

Further, the exposure may be performed under a nitrogen atmosphere. In a case where the curing of the light absorption anisotropic layer proceeds by radical polymerization, since the inhibition of polymerization by oxygen is reduced, it is preferable that exposure is performed in a nitrogen atmosphere.

[Patterning of Light Absorption Anisotropic Layer]

The light absorption anisotropic layer used in the present invention can be a light absorption anisotropic layer which has a region A and a region B in the plane and has different transmittance central axes in each region. In a case where light emitting pixels are controlled by patterning each liquid crystal pixel, the center of the visual field in a narrow visual field can be switched.

Further, the light absorption anisotropic layer used in the present invention can be a light absorption anisotropic layer which has a region C and a region D in the plane and has different transmittances at an angle inclined by 300 with respect to the normal direction from the transmittance central axis in the plane provided with the transmittance central axis and the normal line of the film surface in the region C and the region D. In this case, it is preferable that the light absorption anisotropic layer is a light absorption anisotropic layer in which the transmittance at an angle inclined by 300 with respect to the normal direction from the transmittance central axis of the region C is 50% or less and the transmittance at an angle inclined by 30° with respect to the normal direction from the transmittance central axis of the region D is 80% or greater.

The viewing angle dependence in some regions can be strengthened or weakened by performing the patterning. In this manner, highly confidential information can also be displayed only in the region where the viewing angle dependence is strengthened. Further, design with excellent designability can be carried out by controlling the viewing angle dependence as a display device for each display position. Further, a narrow viewing angle and a wide viewing angle can be switched by patterning each liquid crystal pixel to control light emitting pixels.

[Pattern Forming Method]

As described above, the method of forming the patterned light absorption anisotropic layer having two or more regions different in the plane is not limited, and various known methods as described in, for example, WO2019/176918A can be used. Examples thereof include a method of forming a pattern by changing the irradiation angle of ultraviolet light to be applied to a photo-alignment layer, a method of controlling the thickness of a patterned light absorption anisotropic layer in the plane, a method of unevenly distributing a dichroic coloring agent compound in a patterned light absorption anisotropic layer, and a method of post-processing an optically uniform patterned light absorption anisotropic layer.

Examples of the method of controlling the thickness of the patterned light absorption anisotropic layer in a plane include a method of using lithography, a method of using imprinting, and a method of forming a patterned light absorption anisotropic layer on a base material having an uneven structure. Examples of the method of unevenly distributing a dichroic coloring agent compound in the patterned light absorption anisotropic layer include a method of extracting a dichroic coloring agent by solvent immersion (bleaching). Further, examples of the method of post-processing an optically uniform patterned light absorption anisotropic layer include a method of cutting a part of a flat light absorption anisotropic layer by laser processing or the like.

[Viewing Angle Control System]

It is preferable that the viewing angle control system according to the embodiment of the present invention includes the optical film and a polarizer. An aspect of the viewing angle control system according to the embodiment of the present invention will be described with reference to FIG. 2.

Figure 2:
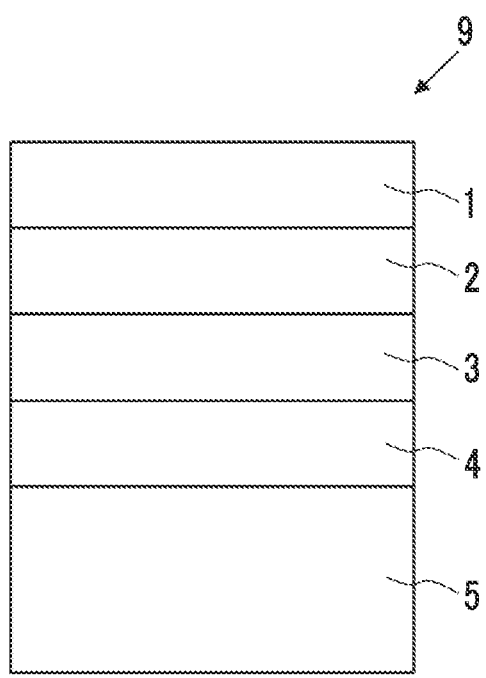
FIG. 2 is a cross-sectional view schematically illustrating an example of an embodiment of a viewing angle control system formed of the optical film of the present invention.

A viewing angle control system 9 illustrated in FIG. 2 includes a barrier layer 1, a light absorption anisotropic layer 2, a liquid crystal layer 3 for alignment, an alignment layer 4, and a TAC film 5 in this order from a viewing side. Further, a polarizer (not illustrated) is disposed on a side of the TAC film 5 opposite to the alignment layer 4. In FIG. 2, the barrier layer 1, the light absorption anisotropic layer 2, the liquid crystal layer 3 for alignment, the alignment layer 4, and the TAC film 5 form the optical film.

The above-described aspect is an aspect of the configuration including the liquid crystal layer 3 for alignment, but may be an aspect without the liquid crystal layer 3 for alignment. Further, the aspect without the liquid crystal layer 3 for alignment may be an aspect in which the barrier layer 1, the alignment layer 4, the light absorption anisotropic layer 2, and the TAC film 5 are provided in this order from the viewing side.

Further, the configuration of the above-described aspect includes the TAC film 5, but the TAC film 5 may be a layer shown in other layers described below.

In addition, as described above, the barrier layer 1 may have the function of the alignment layer 4, and in such a case, an aspect in which the barrier layer 1, the light absorption anisotropic layer 2, and the TAC film 5 are provided in this order from the viewing side may be employed.

Hereinafter, layers that the viewing angle control system according to the embodiment of the present invention may include will be described.

[Barrier Layer]

It is also preferable that the viewing angle control system according to the embodiment of the present invention includes a barrier layer together with the light absorption anisotropic layer.

Here, the barrier layer is also referred to as a gas-shielding layer (oxygen-shielding layer) and has a function of protecting the layer of the optical film according to the embodiment of the present invention from gas such as oxygen in the atmosphere, the moisture, or the compound contained in an adjacent layer.

The barrier layer can refer to, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A.

[Refractive Index Adjusting Layer]

In the viewing angle control system according to the embodiment of the present invention, the above-described light absorption anisotropic layer contains a dichroic substance, and internal reflection due to the high refractive index of the light absorption anisotropic layer may be a problem. In that case, it is preferable that the refractive index adjusting layer is present. The refractive index adjusting layer is a layer disposed to be in contact with the light absorption anisotropic layer, and the in-plane average refractive index at a wavelength of 550 nm is preferably 1.55 or greater and 1.70 or less. It is preferable that the refractive index adjusting layer is a layer for performing so-called index matching.

[Polarizer]

The polarizer used in the viewing angle control system according to the embodiment of the present invention is not particularly limited as long as the polarizer is a member having a function of converting light into specific linearly polarized light, and a known polarizer of the related art can be used.

As the polarizer, an iodine-based polarizer, a dye-based polarizer obtained by using a dichroic dye, a polyene-based polarizer, or the like is used. Examples of the iodine-based polarizer and the dye-based polarizer include a coating type polarizer and a stretching type polarizer, and both polarizers can be applied. A polarizer in which a dichroic coloring agent is aligned by using alignment of the liquid crystal compound is preferable as the coating type polarizer, and a polarizer prepared by adsorbing iodine or a dichroic dye on polyvinyl alcohol and stretching the polyvinyl alcohol is preferable as the stretching type polarizer.

Further, examples of the method of obtaining a polarizer by stretching and dyeing a laminated film in which a polyvinyl alcohol layer is formed on a base material include methods described in JP5048120B, JP5143918B, JP4691205B, JP4751481B, and JP4751486B, and known techniques related to these polarizers can also be preferably used.

Among the polarizers, from the viewpoints of availability and an excellent degree of polarization, a polymer containing a polyvinyl alcohol-based resin (a polymer having —$CH_2$—CHOH— as a repeating unit, particularly at least one selected from the group consisting of polyvinyl alcohol and an ethylene-vinyl alcohol copolymer) is preferable.

In the present invention, the thickness of the polarizer is not particularly limited, but is preferably in a range of 3 µm to 60 µm, more preferably in a range of 5 µm to 20 µm, and still more preferably in a range of 5 µm to 10 µm.

The light absorption anisotropic layer and the polarizer layer of the present invention may be laminated via a pressure sensitive adhesive or an adhesive, or the polarizer may be directly coated with the alignment layer and the light absorption anisotropic layer so that the layers are laminated on the polarizer.

Figure 3:
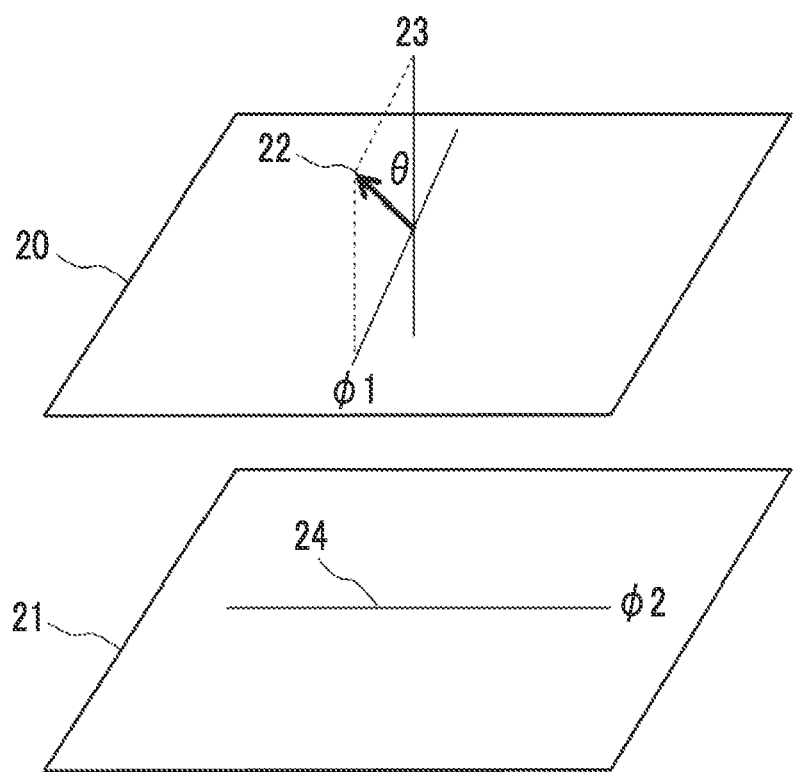
FIG. 3 is a view illustrating a positional relationship between a direction of a transmittance central axis of a light absorption anisotropic layer and an absorption axis of a polarizer in an image display device according to the present invention.

In the viewing angle control system according to the embodiment of the present invention, the angle φ between a plane having a transmittance central axis direction 22 of the light absorption anisotropic layer 20 and a normal line of the film surface (normal line 23 of the light absorption anisotropic layer) (that is, a plane having a direction (indicated by φ1) in which the transmittance central axis direction 22 of the light absorption anisotropic layer 20 of the optical film is orthographically projected on the optical film surface and a normal line of the film surface) in FIG. 3 and an absorption axis direction 24 (direction indicated by φ2) of the polarizer 21 in FIG. 3 is preferably 0° or greater and less than 85°, greater than 950 and less than 265°, or greater than 275° and 360° or less and more preferably 45° or greater and less than 85°, greater than 950 and 1350 or less, 2250 or greater and less than 265°, or greater than 275° and 315° or less.

[Pressure Sensitive Adhesive Layer]

The viewing angle control system according to the embodiment of the present invention may have a pressure sensitive adhesive layer, and it is preferable that the pressure sensitive adhesive layer is a transparent and optically isotropic adhesive similar to that used in a typical image display device, and a pressure sensitive adhesive is typically used.

The pressure sensitive adhesive layer of the present invention may be blended with appropriate additives such as a crosslinking agent (such as an isocyanate-based crosslinking agent or an epoxy-based crosslinking agent), a viscosity imparting agent (such as a rosin derivative resin, a polyterpene resin, a petroleum resin, or an oil-soluble phenol resin), a plasticizer, a filler, an antiaging agent, a surfactant, an ultraviolet absorbing agent, a light stabilizer, and an antioxidant in addition to a parent material (pressure sensitive adhesive), conductive particles, and thermally expandable particles used as necessary.

The thickness of the pressure sensitive adhesive layer is typically in a range of 20 to 500 µm and preferably in a range of 20 to 250 µm. The required adhesive strength and rework suitability may not be obtained in a case where the thickness thereof is less than 20 µm, and the pressure sensitive adhesive may protrude or bleed out from the peripheral end portion of the image display device in a case where the thickness thereof is greater than 500 µm.

The pressure sensitive adhesive layer can be formed by a method such as a method of directly coating a support for a protective member with a coating solution containing a parent material, conductive particles, and as necessary, thermally expandable particles, an additive, a solvent, and the like and pressure-bonding the support via a release liner or a method of coating an appropriate release liner (release paper or the like) with a coating solution to form a thermally expandable pressure sensitive adhesive layer, and pressure-bonding and transferring (transporting) the layer onto the support for a protective member.

In addition, for example, a configuration in which conductive particles are added to a configuration of a thermally-releasable pressure sensitive adhesive sheet described in JP2003-292916A can be employed as the protective member.

Further, a member in which conductive particles are sprayed on the surface of a pressure sensitive adhesive layer in commercially available products such as "REVALPHA" (manufactured by Nitto Denko Corporation) may be used as the protective member.

[Adhesive Layer]

The viewing angle control system according to the embodiment of the present invention may include an adhesive layer, and the adhesive used for the adhesive layer exhibits adhesiveness due to drying or a reaction after bonding.

A polyvinyl alcohol-based adhesive (PVA-based adhesive) exhibits adhesiveness due to drying and is capable of bonding materials to each other.

Specific examples of the curable adhesive that exhibits adhesiveness due to reaction include an active energy ray-curable adhesive such as a (meth) acrylate-based adhesive and a cationic polymerization curable adhesive. Further, a (meth)acrylate denotes an acrylate and/or a methacrylate. Examples of the curable component in the (meth)acrylate-based adhesive include a compound containing a (meth) acryloyl group and a compound containing a vinyl group. Further, as the cationic polymerization curable adhesive, a compound containing an epoxy group or an oxetanyl group can also be used. The compound containing an epoxy group is not particularly limited as long as the compound contains at least two epoxy groups in a molecule, and various generally known curable epoxy compounds can be used. Preferred examples of the epoxy compound include a compound (aromatic epoxy compound) containing at least two epoxy groups and at least one aromatic ring in a molecule and a compound (alicyclic epoxy compound) containing at least two epoxy groups in a molecule, in which at least one of the epoxy groups is formed between two adjacent carbon atoms constituting an alicyclic ring.

Among these, an ultraviolet curable adhesive that is cured by irradiation with ultraviolet rays is preferably used from the viewpoint of heat deformation resistance.

An ultraviolet absorbing ability may be imparted into each layer of the adhesive layer and the pressure sensitive adhesive layer by a method of performing a treatment with an ultraviolet absorbing agent such as a salicylic acid ester-based compound, a benzophenol-based compound, a benzotriazole-based compound, a cyanoacrylate-based compound, or a nickel complex salt-based compound.

The pressure sensitive adhesive layer or the adhesive layer can be attached to the film by an appropriate method. For example, the pressure sensitive adhesive layer or the adhesive layer may be attached to the film by a method of preparing 10% to 40% by weight of a pressure sensitive adhesive solution obtained by dissolving or dispersing a base polymer or a composition thereof in a solvent consisting of a single substance or a mixture of an appropriate solvent such as toluene or ethyl acetate and directly attaching the solution on the film using an appropriate development method such as a casting method or a coating method; or a method of forming a pressure sensitive adhesive layer on a separator in conformity with the above-described method and transporting the layer.

The pressure sensitive adhesive layer or the adhesive layer may be provided on one or both surfaces of the film as a layer obtained by superimposing different kinds of layers with different compositions. In addition, in a case where the layer is provided on both surfaces of the film, different kinds of pressure sensitive adhesive layers with different compositions and different thicknesses can be provided on the front and rear surfaces of the film.

Further, the protective film may be subjected to a surface reforming treatment before the adhesive or the pressure sensitive adhesive is attached to the film for the purpose of improving the adhesiveness or the like. Specific examples of the treatment include a corona treatment, a plasma treatment, a primer treatment, and a saponification treatment.

[Other Layers]

The light absorption anisotropic layer of the present invention can be used by being combined with an optically anisotropic film or a polarizer in order to control the angle dependence of the viewing angle. For example, as the transparent base film, a resin film having optical anisotropy which consists of a polymer containing carbonate, cycloolefin, cellulose acylate, methyl methacrylate, styrene, a maleic acid anhydride, and the like can also be preferably used.

[Image Display Device]

In addition to a liquid crystal display device, an organic EL display device or another display device can be used as the image display device according to the embodiment of the present invention. Here, a liquid crystal display device will be described as an example thereof. As illustrated in FIG. 1, a liquid crystal display device 100 according to the embodiment of the present invention is a liquid crystal display device including an optical film 101 according to the embodiment of the present invention, a viewing-side polarizer 102, a liquid crystal cell 103, a backlight-side polarizer 104, and a backlight 105 in this order from the viewing side, and the optical film includes a light absorption anisotropic layer. In the above-described aspect, the viewing angle control system is formed of the optical film 101 and the viewing-side polarizer 102.

In the present invention, a direction of the absorption axis of the polarizer may be referred to as a longitudinal direction or a lateral direction, and a direction of a side of the liquid crystal display device close to the vertical direction is referred to as a longitudinal direction and a direction of a side of the liquid crystal display device close to the horizontal direction is referred to as a lateral direction typically in a state where a liquid crystal display device is used.

The display element used in the image display device including the optical film according to the embodiment of the present invention is not particularly limited, and examples thereof include a liquid crystal cell, an organic electroluminescence (hereinafter, abbreviated as "EL") display panel, and a plasma display panel. Among these, a liquid crystal cell or an organic EL display panel is preferable. That is, as the image display device according to the embodiment of the present invention, a liquid crystal display device formed of a liquid crystal cell as a display element or an organic EL display device formed of an organic EL display panel as a display element is preferable.

Preferred examples of the liquid crystal display device which is an example of the image display device according to the embodiment of the present invention include an aspect of a device having the light absorption anisotropic layer, the polarizer, and the liquid crystal cell of the present invention. More suitable examples thereof include a liquid crystal display device including the viewing angle control system and the liquid crystal cell of the present invention.

In the present invention, it is preferable to use the viewing angle control system according to the embodiment of the present invention as the polarizer on a front side or a barrier side and preferable to use the viewing angle control system according to the embodiment of the present invention as the polarizer on a front side and a rear side, between the polarizers provided on both sides of the liquid crystal cell.

Hereinafter, the liquid crystal cell constituting the liquid crystal display device will be described in detail.

Some image display devices are thin and can be molded into a curved surface. Since the light absorption anisotropic layer used in the present invention is thin and easily bent, the light absorption anisotropic layer can be suitably applied to an image display device having a curved display surface.

Further, some image display devices have a pixel density of greater than 250 ppi and are capable of high-definition display. The light absorption anisotropic layer used in the present invention can be suitably applied to such a high-definition image display device without causing moire.

Hereinafter, the liquid crystal cell and the organic EL display device constituting the liquid crystal display device will be described in detail.

[Liquid Crystal Cell]

It is preferable that the liquid crystal cell used in the liquid crystal display device is in a vertical alignment (VA) mode, an optically compensated bend (OCB) mode, an in-plane-switching (IPS) mode, or a twisted nematic (TN) mode, but the present invention is not limited thereto.

In the liquid crystal cell in a TN mode, rod-like liquid crystal molecules are substantially horizontally aligned at the time of no voltage application and further twisted aligned at 600 to 120°. The liquid crystal cell in a TN mode is most likely used as a color thin film transistor (TFT) liquid crystal display device and is described in multiple documents.

In the liquid crystal cell in a VA mode, rod-like liquid crystal molecules are substantially vertically aligned at the time of no voltage application. The concept of the liquid crystal cell in a VA mode includes (1) a liquid crystal cell in a VA mode in a narrow sense where rod-like liquid crystal molecules are aligned substantially vertically at the time of no voltage application and substantially horizontally at the time of voltage application (described in JP1990-176625A (JP-H2-176625A)), (2) a liquid crystal cell (in an MVA mode) (SID97, described in Digest of tech. Papers (proceedings) 28 (1997) 845) in which the VA mode is formed to have multi-domain in order to expand the viewing angle, (3) a liquid crystal cell in a mode (n-ASM mode) in which rod-like liquid crystal molecules are substantially vertically aligned at the time of no voltage application and twistedly multi-domain aligned at the time of voltage application (described in proceedings of Japanese Liquid Crystal Conference, pp. 58 to 59 (1998)), and (4) a liquid crystal cell in a SURVIVAL mode (presented at LCD International 98). Further, the liquid crystal cell may be of any of a patterned vertical alignment (PVA) type, a photo-alignment (optical alignment) type, or a polymer-sustained alignment (PSA) type. Details of these modes are described in JP2006-215326A and JP2008-538819A.

In the liquid crystal cell in an IPS mode, rod-like liquid crystal molecules are aligned substantially parallel to the substrate, and the liquid crystal molecules respond planarly through application of an electric field parallel to the substrate surface. In the IPS mode, black display is carried out in a state where no electric field is applied, and absorption axes of a pair of upper and lower polarizing plates are orthogonal to each other. A method of reducing leakage light during black display in an oblique direction and improve the viewing angle using an optical compensation sheet is disclosed in JP1998-54982A (JP-H10-54982A), JP1999-202323A (JP-H11-202323A), JP1997-292522A(JP-H9-292522A), JP1999-133408A(JP-H11-133408A), JP1999-305217A (JP-H11-305217A), and JP1998-307291A (JP-H10-307291A).

[Organic EL Display Device]

As an organic EL display device which is an example of the image display device according to the embodiment of the present invention, an aspect of an image display device including a light absorption anisotropic layer, a λ/4 plate, and an organic EL display panel in this order from the viewing side is suitably exemplified.

In this case, it is preferable that the organic EL display device is formed such that a base material, an alignment layer provided as necessary, a light absorption anisotropic layer, a barrier layer provided as necessary, a λ/4 plate, and an organic EL display panel are disposed in this order from the viewing side.

The λ/4 plate indicates a phase difference plate capable of mutually converting linearly polarized light and circularly polarized light or elliptically polarized light, and a known plate can be used.

Further, the organic EL display panel is a display panel formed of an organic EL element obtained by sandwiching an organic light-emitting layer (organic electroluminescence layer) between electrodes (between a cathode and an anode). The configuration of the organic EL display panel is not particularly limited, and a known configuration is employed.

EXAMPLES

Hereinafter, the present invention will be described in more detail with reference to examples. Materials, used amounts, ratios, treatment contents, treatment procedures, and the like described in the following examples can be appropriately changed without departing from the spirit of the present invention. Therefore, the scope of the present invention should not be limitatively interpreted by the following examples.

[Preparation and Evaluation of Optical Film]

An optical film including a light absorption anisotropic layer in which a dichroic substance was obliquely aligned was prepared to have the configuration listed in the table below.

A method of preparing the optical film used in Example 1 will be representatively described.

[Preparation of Transparent Support 1]

The surface of a cellulose acylate film 1 (TAC base material with a thickness of 40 μm; TG40, manufactured by FUJIFILM Corporation) was saponified with an alkaline solution and coated with the following coating solution 1 for forming an alignment layer using a wire bar. The support on which the coating film was formed was dried with hot air at 60° C. for 60 seconds and further dried with hot air at 100° C. for 120 seconds, thereby obtaining an alignment layer coating film. Further, the alignment layer coating film was subjected to a rubbing treatment to form an alignment layer E, thereby obtaining a transparent support 1 with an alignment layer.

The film thickness was 0.5 μm.

| (Coating solution 1 for forming alignment layer) | |
|---|---|
| Modified polyvinyl alcohol PVA-1 shown below: | 3.80 parts by mass |
| Initiator Irg2959: | 0.20 parts by mass |
| Water: | 70 parts by mass |
| Methanol: | 30 parts by mass |

PVA-1

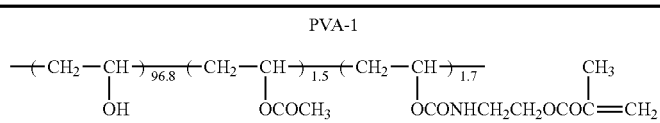

<Preparation of composition liquid F1 for forming photo-alignment layer>
Each component was mixed so as to have the following composition, dissolved for 1 hour while being stirred, and filtered through a 0.45 μm filter, thereby obtaining a composition liquid F1 for forming a photo-alignment layer.

Composition liquid F1 for forming photo-alignment layer

| | |
|---|---|
| Photo-alignment material F1 shown below: | 0.3 parts by mass |
| 2-Butoxyethanol: | 41.6 parts by mass |
| Dipropylene glycol monomethyl ether: | 41.6 parts by mass |
| Pure water: | 16.5 parts by mass |

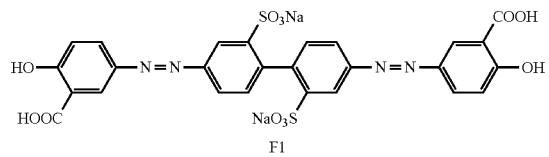

F1

The alignment layer E of the transparent support 1 with an alignment layer was coated with the composition liquid F1 for forming a photo-alignment layer and dried at 60° C. for 2 minutes, thereby obtaining a transparent support 1 with a photo-alignment layer coating film. The obtained photo-alignment layer coating film was irradiated with ultraviolet rays (irradiation amount: 2000 mJ/cm$^2$) at a polar angle of 15° using an ultraviolet exposure device to form a photo-alignment layer F, thereby obtaining a transparent support 1 with a photo-alignment layer having a thickness of 0.03 μm. Further, the azimuthal angle of the irradiation direction of the ultraviolet rays was set to coincide with the rubbing direction of the alignment layer E.

Further, the photo-alignment material F1 corresponds to an azo compound.

[Preparation of Light Absorption Anisotropic Layer]

The photo-alignment layer F of the prepared transparent support 1 with a photo-alignment layer was coated with the following composition P1 for forming a light absorption anisotropic layer using a wire bar, thereby forming a coating layer P1. Further, the composition P1 for forming a light absorption anisotropic layer corresponds to the above-described liquid crystal composition.

Next, the coating layer P1 was heated at 120° C. for 30 seconds and cooled to 100° C.

Thereafter, the coating layer was irradiated with ultraviolet rays for 2 seconds under irradiation conditions of an illuminance of 200 mW/cm$^2$ at room temperature (25° C.) using an LED lamp (central wavelength of 365 nm) to prepare a light absorption anisotropic layer P1-A on the photo-alignment layer F, thereby obtaining an optical film.

Further, the coating layer P1 was prepared in the same manner as described above on the photo-alignment layer F of the transparent support 1 with a photo-alignment layer prepared in the same manner as described above, heated at 120° C. for 30 seconds, cooled to 70° C., and irradiated with ultraviolet rays for 2 seconds under irradiation conditions of an illuminance of 200 mW/cm$^2$ at room temperature (25° C.) using an LED lamp (central wavelength of 365 nm) to prepare a light absorption anisotropic layer P1-B on the photo-alignment layer F, thereby obtaining an optical film.

Composition of composition P1 for forming light absorption anisotropic layer

| | |
|---|---|
| Liquid crystal compound L1: | 4.405 parts by mass |
| Liquid crystal compound L3: | 2.304 parts by mass |
| Dichroic substance Y1: | 0.407 parts by mass |
| Dichroic substance M1: | 0.068 parts by mass |
| Dichroic substance C1: | 0.712 parts by mass |
| Polymerization initiator (IRGACURE OXE-02, manufactured by BASF SE): | 0.102 parts by mass |
| Interface improver B1: | 0.003 parts by mass |
| Cyclopentanone: | 82.800 parts by mass |
| Tetrahydrofuran: | 9.200 parts by mass |

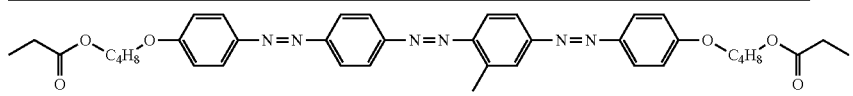

Y1

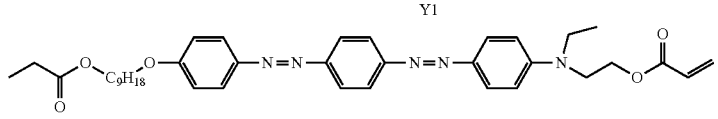

M1

-continued

Composition of composition P1 for forming light absorption anisotropic layer

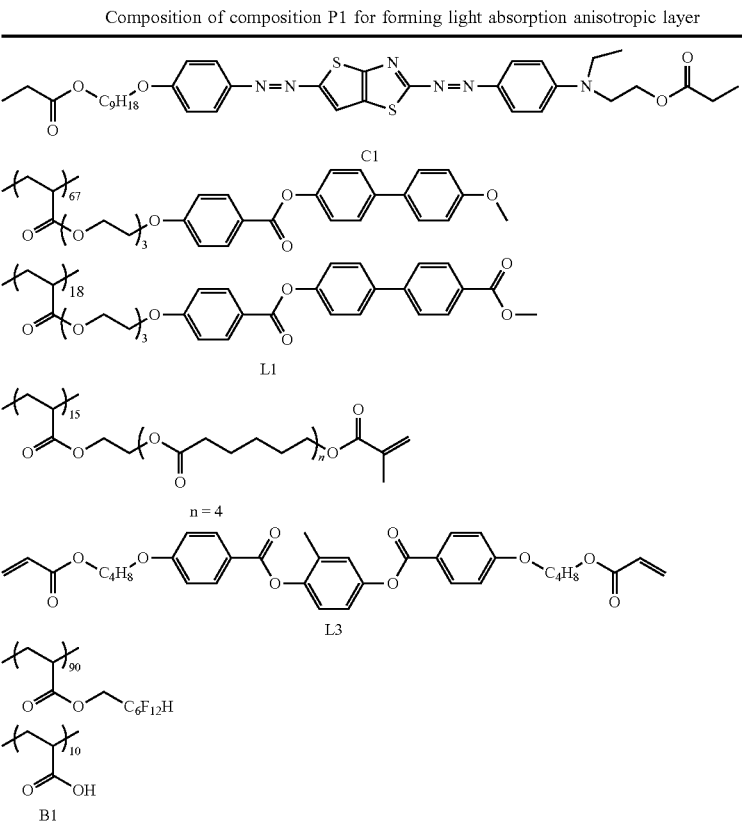

[Measurement of Mixed Liquid Crystal Decreasing Temperature]

Two linear polarizers of an optical microscope (product name, "ECLIPSE E600 POL", manufactured by Nikon Corporation) were set in a state where the absorption axes were orthogonal to each other.

A composition was prepared by adding 10.0 parts by mass of an interface improver to the composition prepared by removing an interface improver from the composition P1 for forming a light absorption anisotropic layer of Example 1, with respect to 100.0 parts by mass of the solid content of the composition obtained by removing the interface improver. Slide glass obtained by casting the prepared composition was set on a sample table disposed between the two linear polarizers and allowed to stand at 70° C. for 30 minutes to dry the solvent.

This slide glass was heated at a temperature higher than the liquid-liquid crystal phase transition temperature by 5° C. for 5 seconds using a hot plate. The slide glass was observed while the temperature was lowered at a rate of 5° C./min, and a temperature (T2) at which the liquid transitioned to a liquid crystal phase was measured.

Further, an equation of "ΔTL=T1−T2" was calculated by measuring a temperature (T1) at which the liquid transitioned to a liquid crystal phase by the same method as described above using the composition obtained by removing the interface improver from the composition P1 for forming a light absorption anisotropic layer.

[Evaluation of Temperature Stability in Transmittance Central Axis Direction]

A sample was prepared by cutting the prepared optical film including the light absorption anisotropic layer P1-A to a size of 4 cm×4 cm. The cut-out sample was set in JASCO V-670/ARMN-735 (manufactured by JASCO Corporation) such that the direction in which the transmittance central axis was orthographically projected on the film surface was horizontal. A transmittance T3-A of the film was measured in a range of θ=−70° to 70° by setting θ=0° as the normal direction of the optical film while the incident direction of linearly polarized light having a wavelength of 650 nm parallel to the direction in which the transmittance central axis was orthographically projected on the film surface and vibrating the horizontal direction was changed at a pitch of 0.5°. Further, the incident direction was changed in a plane having a normal line of the optical film and a transmittance central axis.

A transmittance T3-B of the optical film including the light absorption anisotropic layer P1-B was measured in the same manner as described above. Further, a transmittance T4 of the transparent support 1 with a photo-alignment layer was measured.

Based on the measurement results, T3-A/T4 and T3-B/T4 were calculated, the angles at which these values were maximized were defined as θA and θB, and an absolute value Δθ of a difference between θA and θB was calculated.

Δθ was evaluated according to the following standards. In addition, Δθ is considered to be a parameter related to the temperature stability of the tilt angle, and it is preferable that Δθ is small from the viewpoint of controlling the tilt angle.

A: Δθ was less than 7°

B: Δθ was 7° or greater and less than 12°

C: Δθ was 12° or greater

[Evaluation of Transmittance Contrast of Optical Film]

A maximum value Tmax and a minimum value Tmin of the transmittance were measured using the optical film including the light absorption anisotropic layer P1-A in the same manner as the measurement of the temperature stability in the transmittance central axis direction, and a transmittance ratio "Tm=Tmax/Tmin" was calculated.

Based on the value of Tm, the transmittance contrast was evaluated according to the following standards.

A: Tm was 140 or greater
B: Tm was 50 or greater and less than 140
C: Tm was less than 50

Examples 1 to 9 and Comparative Examples 1 to 2

Each optical film of Examples 2 to 9 and Comparative Examples 1 and 2 was obtained in the same manner as in Example 1 except that the alignment layer and the composition of the composition P1 for forming a light absorption anisotropic layer were changed as listed in Table 1. The same evaluation as in Example 1 was performed using the optical film and the composition obtained as described above. The evaluation results are listed in Table 1.

In Table 1, in a case where "E" is listed in the columns of the alignment layer, this indicates that a light absorption anisotropic layer was formed on the alignment layer E of the transparent support 1 with an alignment layer without forming the photo-alignment layer F. In Table 1, in a case where "G" is listed in the columns of the alignment layer, this indicates that a light absorption anisotropic layer was formed on the alignment layer G of the following transparent support 2 with an alignment layer.

[Preparation of Transparent Support 2]

A glass base material (manufactured by Central Glass Co., Ltd., blue plate glass, size of 300 mm×300 mm, thickness of 1.1 mm) was washed with an alkaline detergent and further washed with pure water, and the glass base material was dried.

The dried glass base material was coated with the following composition G for forming an alignment film using a #4 bar, and the applied composition 1 for forming an alignment film was dried at 80° C. for 15 minutes and heated at 250° C. for 1 hour, thereby forming a coating film on the glass base material. The coating film was subjected to a rubbing treatment to form an alignment layer G, thereby obtaining a transparent support 2 with an alignment layer.

Further, the following SE-130 corresponds to polyimide.

| Composition of composition G for forming alignment film | |
|---|---|
| SE-130 (product name, manufactured by Nissan Chemical Corporation): | 2.0 parts by mass |
| N-methylpyrrolidone: | 98.0 parts by mass |

Components other than the components described above among the components indicated by symbols in Table 1 are shown below. Further, the numerical values next to the parentheses of each repeating unit denote the content (% by mass) of each repeating unit with respect to all the repeating units of each polymer.

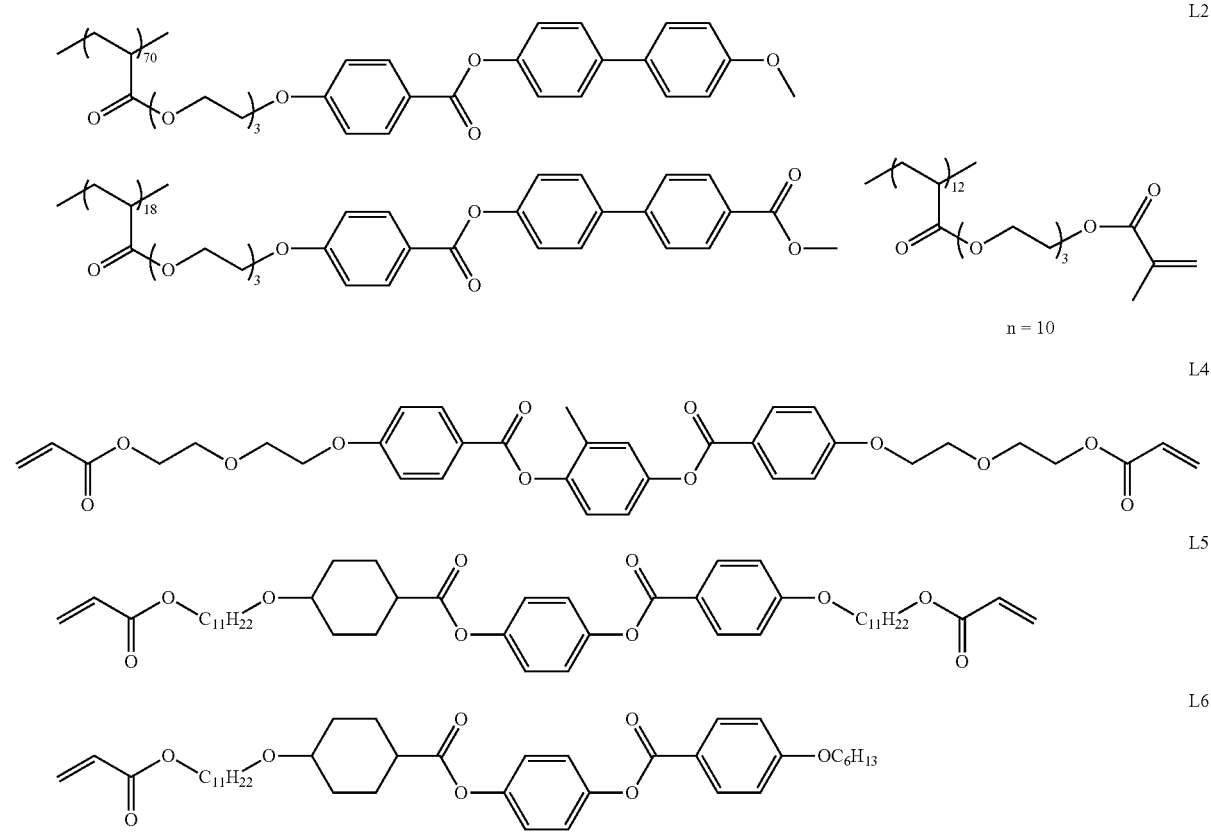

Y2
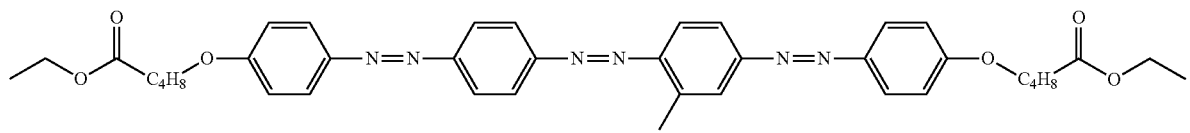
M2
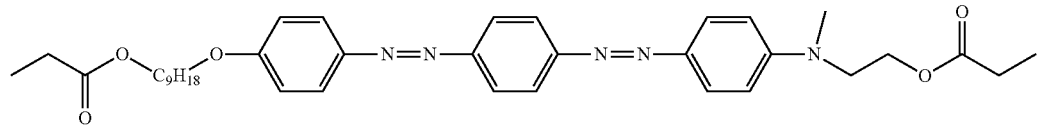
C2
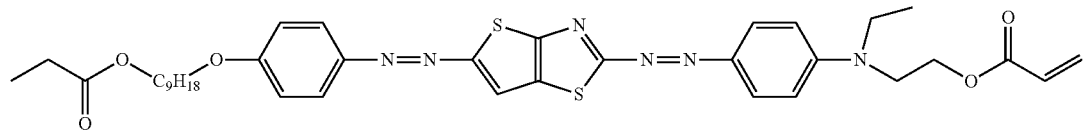
C3
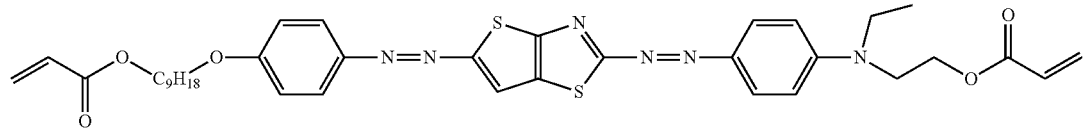
D1
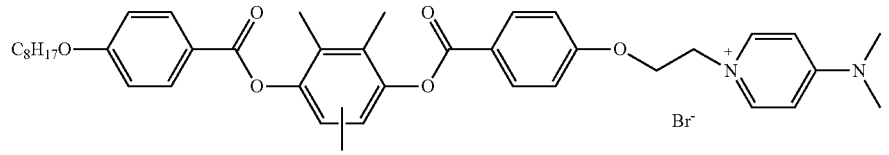
D2
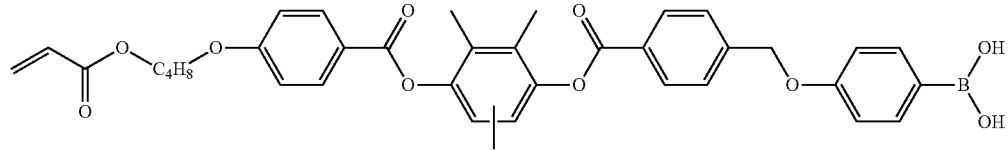
B2
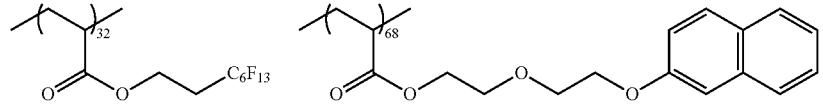
B3
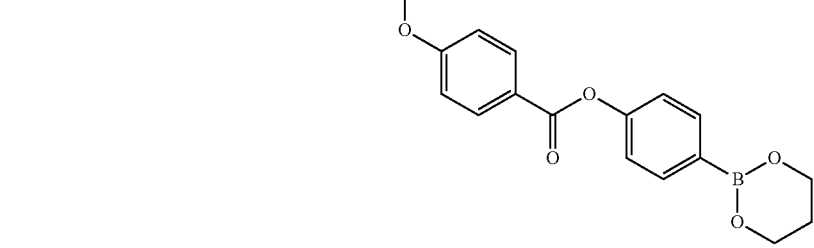
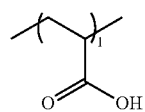

-continued

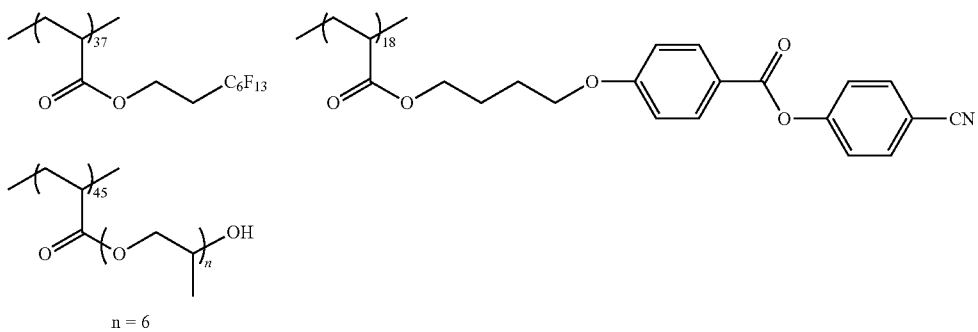

B4

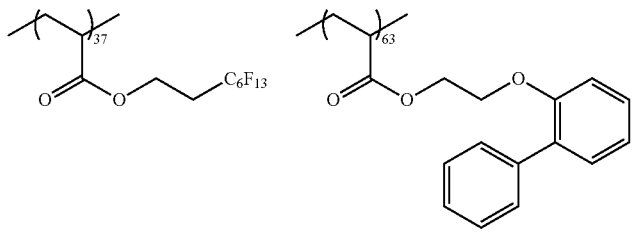

n = 6

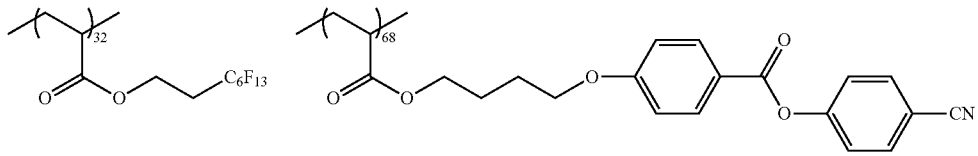

B5

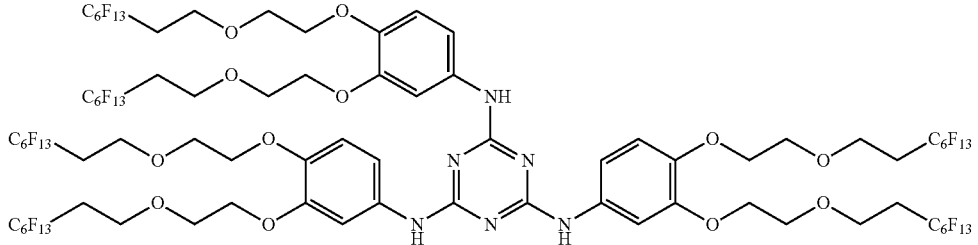

B6

B7

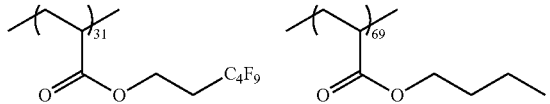

B8

In Table 1, "tilt angle" (the angle between the transmittance central axis of the light absorption anisotropic layer and the normal direction of the surface of the optical film) is an angle measured by the above-described method.

In Table 1, the columns of "total content of dichroic substance" denote the total content of the dichroic substance with respect to the solid content of the composition for forming a light absorption anisotropic layer.

TABLE 1

| | Alignment layer | Liquid crystal compound | | Liquid crystal compound | | Dichroic substance | | Dichroic substance | | Dichroic substance | | Dichroic substance | | Interface Improver | |
|---|---|---|---|---|---|---|---|---|---|---|---|---|---|---|---|
| | | Type | Parts by mass | Type | Parts by mass | Type | Parts by mass | Type | Parts by mass | Type | Parts by mass | Type | Parts by mass | Type | Parts by mass |
| Example 1 | F | L1 | 4.405 | L3 | 2.304 | Y1 | 0.407 | M1 | 0.068 | C1 | 0.712 | — | 0.000 | B1 | 0.003 |
| Example 2 | F | L2 | 3.968 | L3 | 2.480 | Y2 | 0.488 | M1 | 0.058 | C1 | 0.876 | — | 0.000 | B6 | 0.006 |
| Example 3 | F | L1 | 3.911 | L4 | 2.534 | Y2 | 0.476 | M2 | 0.074 | C1 | 0.877 | — | 0.000 | B2 | 0.005 |
| Example 4 | F | L5 | 5.082 | L6 | 1.694 | Y1 | 0.379 | M2 | 0.061 | C1 | 0.678 | — | 0.000 | B2 | 0.004 |
| Example 5 | E | L2 | 3.920 | L3 | 2.471 | Y2 | 0.491 | M2 | 0.074 | C1 | 0.442 | C2 | 0.442 | B3 | 0.005 |
| Example 6 | E | L2 | 4.022 | L3 | 2.380 | Y2 | 0.460 | M2 | 0.090 | C1 | 0.328 | C2 | 0.558 | B5 | 0.005 |

TABLE 1-continued

| | | | | | | | | | | | | | | |
|---|---|---|---|---|---|---|---|---|---|---|---|---|---|---|
| Example 7 | F | L2 | 4.257 | L3 | 2.128 | Y2 | 0.417 | M2 | 0.128 | C2 | 0.766 | C3 | 0.170 | B3 | 0.006 |
| Example 8 | F | L1 | 4.011 | L3 | 2.583 | Y1 | 0.499 | M2 | 0.135 | C1 | 0.628 | — | 0.000 | B4 | 0.004 |
| Example 9 | F | L2 | 4.356 | L4 | 2.489 | Y1 | 0 436 | M1 | 0.116 | C1 | 0.453 | — | 0.000 | B7 | 0.0001 |
| Example 10 | F | L1 | 4.374 | L3 | 2.012 | Y2 | 0.394 | M1 | 0.134 | C2 | 0.954 | — | 0.000 | B8 | 0.003 |
| Example 11 | G | L2 | 3.916 | L3 | 2.464 | Y2 | 0.449 | M2 | 0.122 | C1 | 0.432 | C2 | 0.449 | B3 | 0.005 |
| Comparative Example 1 | F | L1 | 3.874 | L3 | 2.355 | Y2 | 0.453 | M2 | 0.082 | C1 | 0.412 | C2 | 0.495 | — | 0.000 |
| Comparative Example 2 | E | L1 | 6.347 | L3 | 2.613 | Y1 | 0.386 | M1 | 0.113 | C2 | 0.426 | — | 0.000 | B1 | 0.003 |

| | Additive Type | Additive Parts by mass | Additive Type | Additive Parts by mass | Polymerization initiator Parts by mass | Total content of dichroic substance % by mass | Tetrahydrofuran Parts by mass | Cyclopentanone Parts by mass | ΔTL (° C.) | Tilt angle (° C.) | Δθ | Tm |
|---|---|---|---|---|---|---|---|---|---|---|---|---|
| Example 1 | — | 0.000 | — | 0.000 | 0.102 | 14.8 | 9.200 | 82.800 | 6.5 | 15 | B | B |
| Example 2 | — | 0.000 | — | 0.000 | 0.124 | 17.8 | 9.200 | 82.800 | 11.8 | 41 | C | A |
| Example 3 | — | 0.000 | — | 0.000 | 0.123 | 17.8 | 9.200 | 82.800 | 0.3 | 32 | A | A |
| Example 4 | — | 0.000 | — | 0.000 | 0.102 | 14.0 | 9.200 | 82.800 | 3.4 | 20 | A | B |
| Example 5 | D1 | 0.016 | D2 | 0.016 | 0.123 | 18.1 | 9.200 | 82.800 | 1.0 | 15 | A | A |
| Example 6 | D1 | 0.016 | D2 | 0.016 | 0.123 | 18.0 | 9.200 | 82.800 | 1.2 | 21 | A | A |
| Example 7 | — | 0.000 | — | 0.000 | 0.128 | 18.5 | 9.200 | 82.800 | 2.0 | 11 | A | A |
| Example 8 | D1 | 0.008 | D1 | 0.008 | 0.125 | 15.8 | 9.200 | 82.800 | 7.1 | 22 | B | A |
| Example 9 | D1 | 0.009 | D1 | 0.009 | 0.133 | 12.6 | 9.200 | 82.800 | 13.5 | 44 | C | A |
| Example 10 | — | 0.000 | — | 0.000 | 0.131 | 18.5 | 9.200 | 82.800 | 0.9 | 24 | A | A |
| Example 11 | D1 | 0.024 | D2 | 0.016 | 0.122 | 18.2 | 9.200 | 82.800 | 1.0 | 22 | A | A |
| Comparative Example 1 | — | 0.000 | — | 0.000 | 0.124 | 18.0 | 9.200 | 82.800 | — | 49 | C | C |
| Comparative Example 2 | — | 0.000 | — | 0.000 | 0.112 | 9.3 | 9.000 | 81.000 | 6.4 | 48 | C | C |

As shown in the results in Table 1, it was confirmed that Δθ was evaluated as more excellent in a case where ΔTL was in a range of 0.1° C. to 7.0° C. (more preferably in a range of 0.1° C. to 3.5° C.) based on the comparison of Examples 2 to 9.

Based on the comparison of Examples 3 and 4, it was confirmed that Tm was evaluated as more excellent in a case where the composition for forming a light absorption anisotropic layer contained a polymer liquid crystal compound.

Based on the comparison of Examples 8 and 9, it was confirmed that Δδ was evaluated as more excellent in a case where the interface improver was a polymer compound.

[Evaluation of Viewing Angle Control System]

The viewing angle control system was evaluated using the optical film of each example and each comparative example according to the following procedures. Hereinafter, a method of evaluating the viewing angle control system formed of the optical film of Example 3 will be representatively described.

[Formation of Barrier Layer B1]

The light absorption anisotropic layer P1 prepared in Example 3 was coated with the following composition B1 for forming a barrier layer using a wire bar and dried at 80° C. for 5 minutes, thereby forming a barrier coating layer B1.

Next, the barrier coating layer B1 was irradiated with an LED lamp (central wavelength of 365 nm) for 2 seconds under an irradiation condition of an illuminance of 150 mW/cm² in an environment of an oxygen concentration of 100 ppm and a temperature of 60° C., thereby forming a barrier layer B1 on the light absorption anisotropic layer P1. The thickness of the barrier layer B1 was 1.0 μm.

| Composition of composition B1 for forming barrier layer | |
|---|---|
| Modified polyvinyl alcohol PVA-1 shown above: | 3.80 parts by mass |
| IRGACURE 2959: | 0.20 parts by mass |
| Water: | 70.00 parts by mass |
| Methanol: | 30.00 parts by mass |

<Preparation of Laminate A1>

A polarizing plate 1 in which the thickness of the polarizer was 8 μm and one surface of the polarizer was exposed was prepared by the same method as that for a polarizing plate 02 with a one-surface protective film described in WO2015/166991A.

The surface of the polarizing plate 1 in which the polarizer was exposed and the surface of the light absorption anisotropic layer of the light absorption anisotropic film prepared in Example 3 were subjected to a corona treatment, and both surfaces were bonded to each other using the following PVA adhesive 1, thereby preparing a laminate A1. In this case, the bonding was made such that an angle between a direction in which the transmittance central axis of the light absorption anisotropic layer was orthographically projected on the film surface and the absorption axis of the polarizer was set to 80°.

(Preparation of PVA Adhesive 1)

20 parts of methylol melamine with respect to 100 parts of a polyvinyl alcohol-based resin containing an acetoacetyl group (average degree of polymerization: 1200, degree of saponification: 98.5% by mole, degree of acetoacetylation: 5% by mole) was dissolved in pure water under a temperature condition of 30° C. to prepare an aqueous solution in which the concentration of solid contents was adjusted to 3.7% by mass, thereby obtaining a PVA adhesive 1.

<Preparation of Image Display Device B1>

A Wi-Fi model iPad Air (registered trademark, the same applies hereinafter, manufactured by APPLE, Inc.) with a capacity of 16 GB, which is an IPS mode liquid crystal display device, was disassembled to take out the liquid crystal cell. The laminate A1 prepared above was bonded to the surface formed by peeling the viewing-side polarizing plate off from the liquid crystal cell such that the polarizing plate 1 side was the liquid crystal cell side, using the following pressure sensitive adhesive sheet 1. Here, the bonding was made such that the direction of the absorption axis of the polarizing plate 1 was the longitudinal direction of the liquid crystal screen. The device was reassembled after the bonding to the liquid crystal cell, thereby preparing an image display device B1.

(Preparation of Pressure Sensitive Adhesive Sheet 1)

Next, an acrylate-based polymer was prepared according to the following procedures.

95 parts by weight of butyl acrylate and 5 parts by weight of acrylic acid were polymerized by a solution polymerization method in a reaction container equipped with a cooling pipe, a nitrogen introduction pipe, a thermometer, and a stirrer, thereby obtaining an acrylate-based polymer (A1) with an average molecular weight of 2000000 and a molecular weight distribution (Mw/Mn) of 3.0.

Next, the obtained acrylate-based polymer A1 (100 parts by mass), CORONATE L (75% by mass ethyl acetate solution of trimethylolpropane adduct of tolylene isocyanate, number of isocyanate groups in one molecule: 3, manufactured by Nippon Polyurethane Industry Co., Ltd.) (1.0 parts by mass), and a silane coupling agent KBM-403 (manufactured by Shin-Etsu Chemical Co., Ltd.) (0.2 parts by mass) were mixed with each other, and ethyl acetate was finally added to the mixture such that the concentration of the total solid contents reached 10% by mass, thereby preparing a composition for forming a pressure sensitive adhesive. A separate film subjected to a surface treatment with a silicone-based release agent was coated with the composition using a die coater and dried in an environment of 90° C. for 1 minute, thereby obtaining an acrylate-based pressure sensitive adhesive sheet (pressure sensitive adhesive sheet 1). The film thickness was 25 μm, and the storage elastic modulus was 0.1 MPa.

[Evaluation of Reflection]

A state of the image display device B1 prepared by the above-described procedures, in which the screen of the display was set to be perpendicular to the ground, was fixed. Further, a glass plate having a thickness of 2 mm was installed at an angle perpendicular to the screen of the display and the ground, on a side opposite to the direction in which the transmittance central axis of the light absorption anisotropic layer faced. Further, the room was set to a dark room, and the reflection of an image on the glass in a state where the sample image was displayed on the display and the brightness of the image as viewed in the transmittance central axis direction were visually sensory evaluated in the dark room. As a result, the reflection on the glass was not visually recognized, and a bright image was visually recognized as viewed in the transmittance central axis direction.

The optical films used in the examples other than Example 3 were also evaluated by the same procedures as described above. As a result, the reflection on the glass was not visually recognized, and a bright image was visually recognized as viewed in the transmittance central axis direction. Further, in a case where the optical film in which the evaluation of A6 was excellent used, the reflection was further suppressed over the entire displayed image. Further, in a case where the optical film in which the evaluation of Tm was excellent was used, a brighter image was visually recognized.

On the contrary, in a case where the optical films used in the comparative examples were evaluated by the same procedures as described above, the reflection on the glass was visually recognized.

EXPLANATION OF REFERENCES

100: liquid crystal display device
101: optical film
102: viewing-side polarizer
103: liquid crystal cell
104: backlight-side polarizer
105: backlight
1: barrier layer
2: light absorption anisotropic layer
3: liquid crystal layer for alignment
4: alignment layer
5: TAC film
9: viewing angle control system
20: light absorption anisotropic layer
21: polarizer
22: transmittance central axis direction (polar angle θ)
23: normal line of light absorption anisotropic layer
24: absorption axis direction of polarizer

What is claimed is:

1. An optical film comprising:
a light absorption anisotropic layer formed of a liquid crystal composition containing a thermotropic liquid crystal compound, a dichroic substance, and an interface improver,
wherein a content of the dichroic substance is 10.0% by mass or greater with respect to a total mass of a solid content of the liquid crystal composition,
an angle θ between a transmittance central axis of the light absorption anisotropic layer and a normal direction of a surface of the optical film is 5° or greater and less than 45°, and
the transmittance central axis is parallel to an alignment of the dichroic substance.

2. The optical film according to claim 1,
wherein the content of the dichroic substance is 15.0% by mass or greater with respect to the total mass of the solid content of the liquid crystal composition.

3. The optical film according to claim 2,
wherein a mixed liquid crystal decreasing temperature ΔTL defined by Equation (T) is in a range of 0.1° C. to 10.0° C., $$\Delta TL = T1 - T2 \quad (T)$$

in Equation (T), T1 represents a liquid-liquid crystal phase transition temperature of the liquid crystal composition that does not contains the interface improver, and T2 represents a liquid-liquid crystal phase transition temperature of a mixture obtained by mixing 10.0 parts by mass of the interface improver with respect to 100 parts by mass of the liquid crystal composition that does not contain the interface improver.

4. The optical film according to claim 2, further comprising:
an alignment layer that contains an azo compound, polyvinyl alcohol, or polyimide on the light absorption anisotropic layer.

5. A viewing angle control system comprising:
the optical film according to claim 2; and
a polarizer,
wherein the polarizer has an in-plane absorption axis, and
an angle φ between a direction in which the transmittance central axis of the light absorption anisotropic layer of the optical film is orthographically projected on the surface of the optical film and the absorption axis of the polarizer is 0° or greater and less than 85°, greater than 95° and less than 265°, or greater than 275° and 360° or less.

6. An image display device which is formed by disposing the viewing angle control system according to claim 5 on at least one main surface of a display panel.

7. The image display device according to claim 6,
wherein the light absorption anisotropic layer is disposed on a viewing side with respect to the polarizer.

8. The optical film according to claim 1,
wherein a mixed liquid crystal decreasing temperature ΔTL defined by Equation (T) is in a range of 0.1° C. to 10.0° C., $$\Delta TL = T1 - T2 \qquad (T)$$

in Equation (T), T1 represents a liquid-liquid crystal phase transition temperature of the liquid crystal composition that does not contains the interface improver, and T2 represents a liquid-liquid crystal phase transition temperature of a mixture obtained by mixing 10.0 parts by mass of the interface improver with respect to 100 parts by mass of the liquid crystal composition that does not contain the interface improver.

9. The optical film according to claim 8, further comprising:
an alignment layer that contains an azo compound, polyvinyl alcohol, or polyimide on the light absorption anisotropic layer.

10. A viewing angle control system comprising:
the optical film according to claim 3; and
a polarizer,
wherein the polarizer has an in-plane absorption axis, and
an angle φ between a direction in which the transmittance central axis of the light absorption anisotropic layer of the optical film is orthographically projected on the surface of the optical film and the absorption axis of the polarizer is 0° or greater and less than 85°, greater than 95° and less than 265°, or greater than 275° and 360° or less.

11. An image display device which is formed by disposing the viewing angle control system according to claim 10 on at least one main surface of a display panel.

12. The image display device according to claim 11,
wherein the light absorption anisotropic layer is disposed on a viewing side with respect to the polarizer.

13. The optical film according to claim 1, further comprising:
an alignment layer that contains an azo compound, polyvinyl alcohol, or polyimide on the light absorption anisotropic layer.

14. A viewing angle control system comprising:
the optical film according to claim 13; and
a polarizer,
wherein the polarizer has an in-plane absorption axis, and
an angle φ between a direction in which the transmittance central axis of the light absorption anisotropic layer of the optical film is orthographically projected on the surface of the optical film and the absorption axis of the polarizer is 0° or greater and less than 85°, greater than 95° and less than 265°, or greater than 275° and 360° or less.

15. An image display device which is formed by disposing the viewing angle control system according to claim 14 on at least one main surface of a display panel.

16. The image display device according to claim 15,
wherein the light absorption anisotropic layer is disposed on a viewing side with respect to the polarizer.

17. A viewing angle control system comprising:
the optical film according to claim 1; and
a polarizer,
wherein the polarizer has an in-plane absorption axis, and
an angle φ between a direction in which the transmittance central axis of the light absorption anisotropic layer of the optical film is orthographically projected on the surface of the optical film and the absorption axis of the polarizer is 0° or greater and less than 85°, greater than 95° and less than 265°, or greater than 275° and 360° or less.

18. An image display device which is formed by disposing the viewing angle control system according to claim 17 on at least one main surface of a display panel.

19. The image display device according to claim 18,
wherein the light absorption anisotropic layer is disposed on a viewing side with respect to the polarizer.

* * * * *